United States Patent
Nam et al.

(10) Patent No.: US 9,324,730 B2
(45) Date of Patent: Apr. 26, 2016

(54) VERTICAL MEMORY DEVICES AND METHODS OF MANUFACTURING THE SAME

(71) Applicants: Phil-Ouk Nam, Hwaseong-si (KR); Dong-Chul Yoo, Seongnam-si (KR); Bi-O Kim, Seoul (KR); Jae-Young Ahn, Seongnam-si (KR); Byong-Hyun Jang, Suwon-si (KR); Ki-Hyun Hwang, Seongnam-si (KR)

(72) Inventors: Phil-Ouk Nam, Hwaseong-si (KR); Dong-Chul Yoo, Seongnam-si (KR); Bi-O Kim, Seoul (KR); Jae-Young Ahn, Seongnam-si (KR); Byong-Hyun Jang, Suwon-si (KR); Ki-Hyun Hwang, Seongnam-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/601,496

(22) Filed: Jan. 21, 2015

(65) Prior Publication Data
US 2015/0206900 A1 Jul. 23, 2015

(30) Foreign Application Priority Data
Jan. 22, 2014 (KR) .......................... 10-2014-0007963

(51) Int. Cl.
  H01L 29/792 (2006.01)
  H01L 27/115 (2006.01)
  H01L 27/02 (2006.01)

(52) U.S. Cl.
  CPC ...... *H01L 27/11582* (2013.01); *H01L 27/0207* (2013.01); *H01L 27/1157* (2013.01); *H01L 27/11565* (2013.01)

(58) Field of Classification Search
  CPC .................... H01L 27/11582; H01L 27/11565
  USPC .......................................... 257/326; 438/241
  See application file for complete search history.

(56) References Cited

U.S. PATENT DOCUMENTS

| | | | |
|---|---|---|---|
| 2010/0133599 A1* | 6/2010 | Chae et al. | .................... 257/315 |
| 2011/0227141 A1 | 9/2011 | Jeong et al. | |
| 2012/0144767 A1 | 6/2012 | LeBlang | |
| 2012/0170368 A1 | 7/2012 | Lee et al. | |
| 2013/0009229 A1 | 1/2013 | Lee et al. | |
| 2013/0032873 A1 | 2/2013 | Kiyotoshi | |
| 2013/0032874 A1 | 2/2013 | Ko | |

FOREIGN PATENT DOCUMENTS

| | | |
|---|---|---|
| KR | 2011-0015337 A | 2/2011 |
| KR | 2011-0120536 A | 11/2011 |

* cited by examiner

*Primary Examiner* — Theresa T Doan
(74) *Attorney, Agent, or Firm* — Lee & Morse, P.C.

(57) ABSTRACT

A vertical memory device including a substrate including first regions and a second region; a plurality of channels in the first regions, the plurality of channels extending in a first direction substantially perpendicular to a top surface of the substrate; a charge storage structure on a sidewall of each channel in a second direction substantially parallel to the top surface of the substrate; a plurality of gate electrodes in the first regions, the plurality of gate electrodes arranged on a sidewall of the charge storage structure and spaced apart from each other in the first direction; and a plurality of supporters in the second region, the plurality of supporters spaced apart from each other in a third direction substantially perpendicular to the first direction and the second direction, the plurality of supporters contacting a sidewall of at least one gate electrode.

20 Claims, 50 Drawing Sheets

FIG. 2
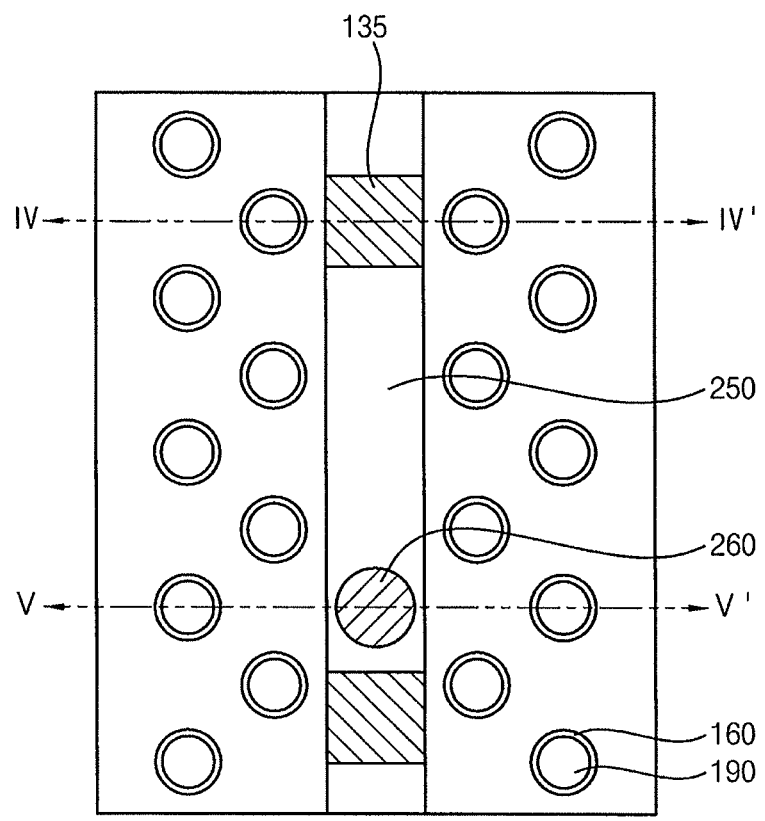
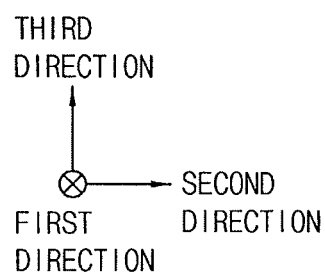

FIG. 9
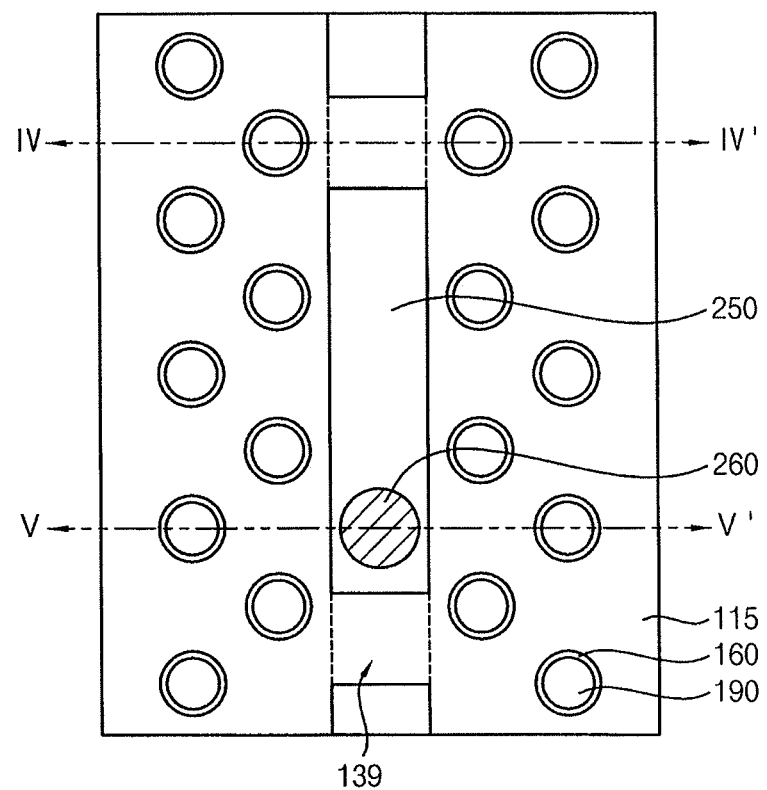
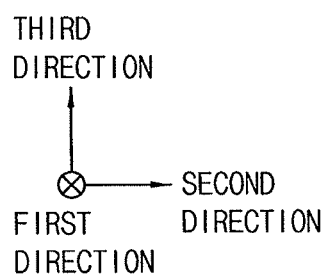

FIG. 11
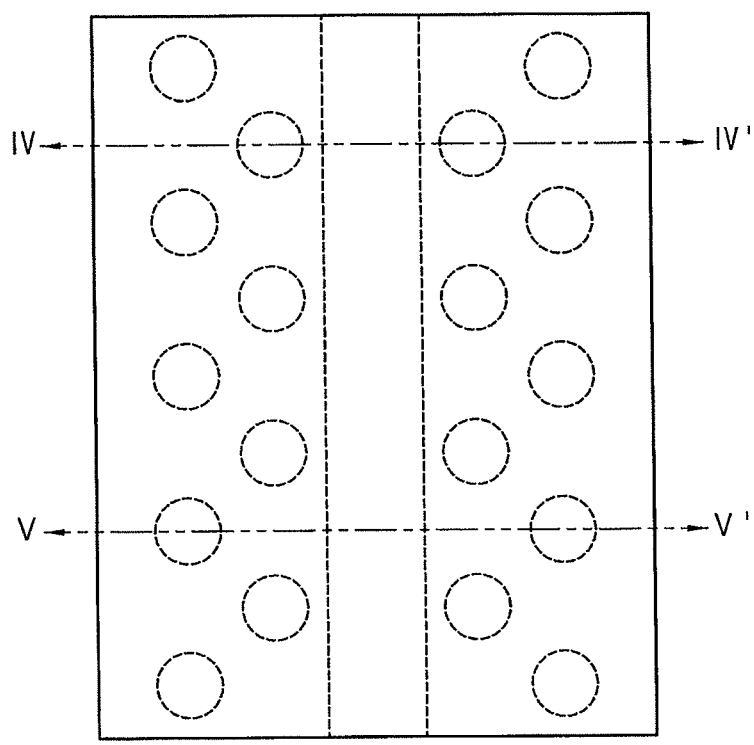
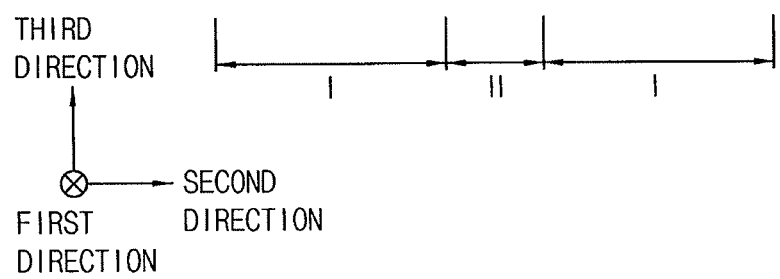

FIG. 16
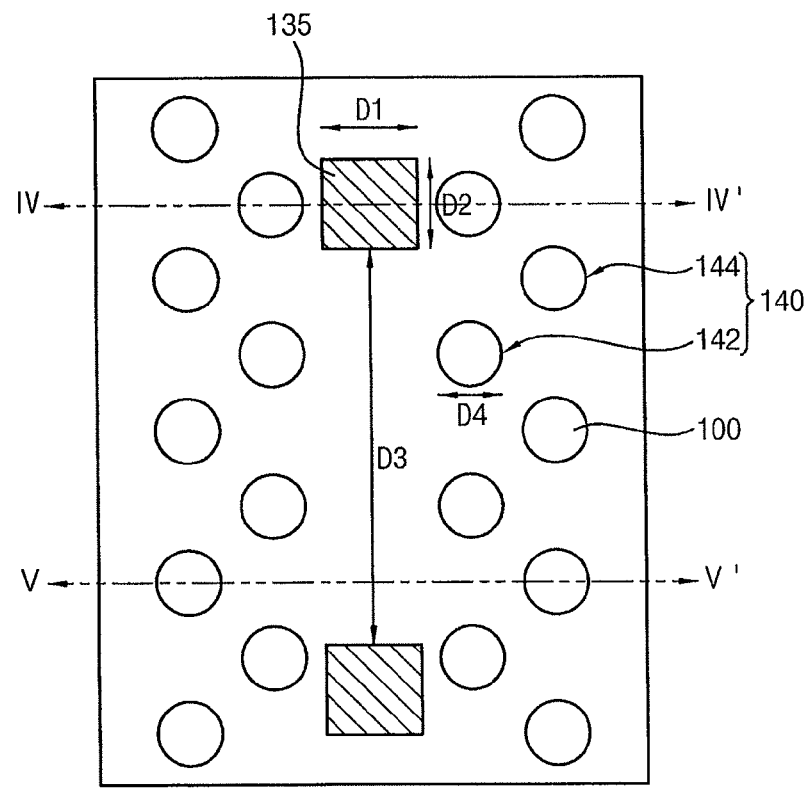
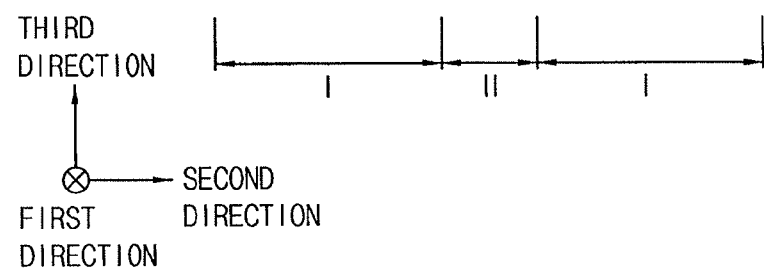

FIG. 18
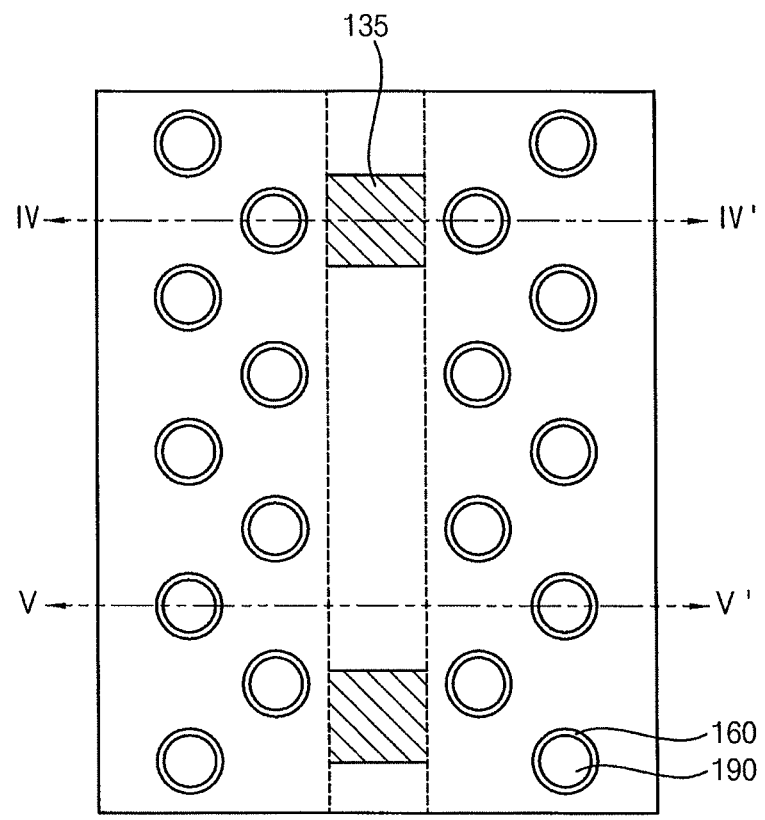
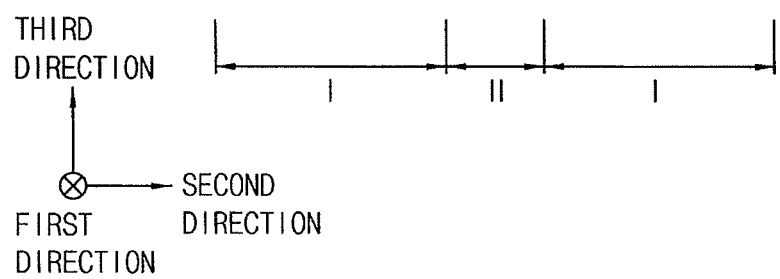

FIG. 22
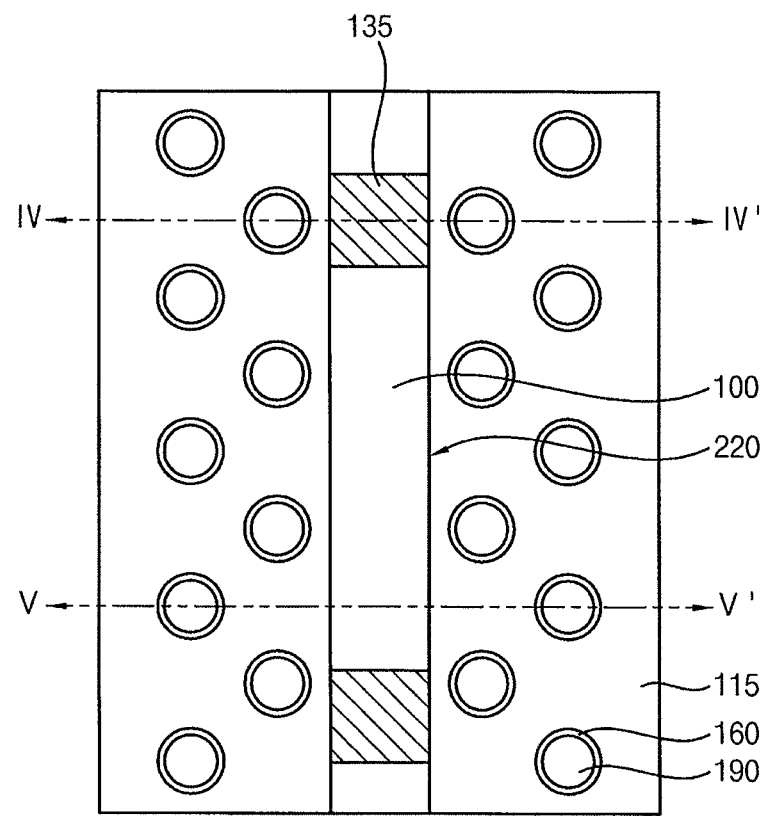
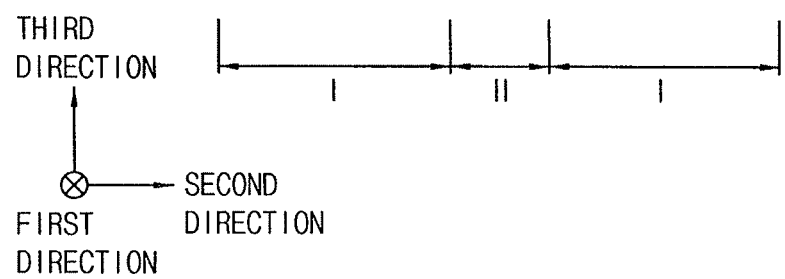

FIG. 25
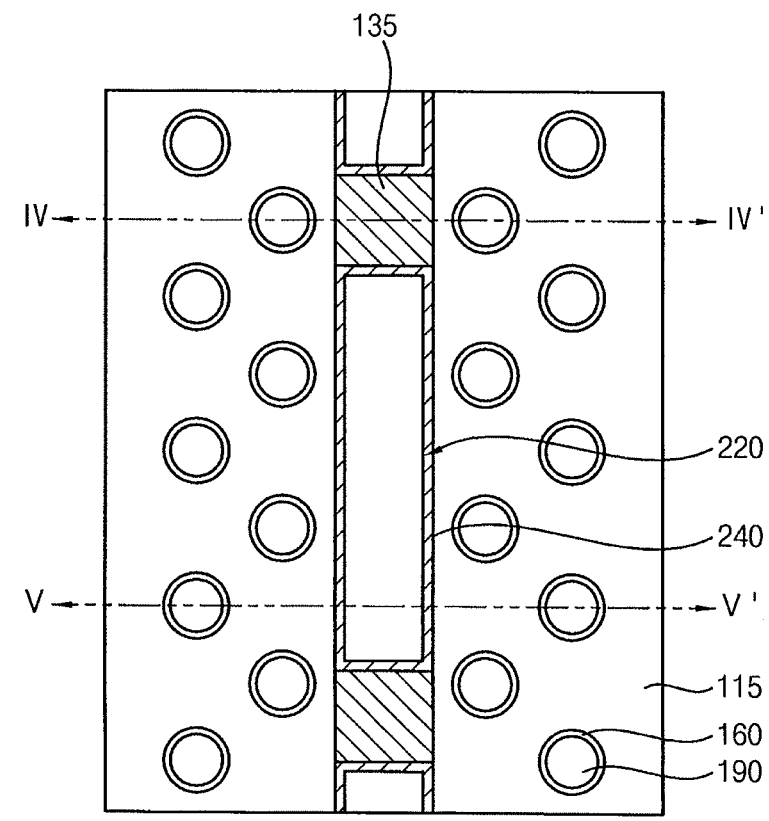
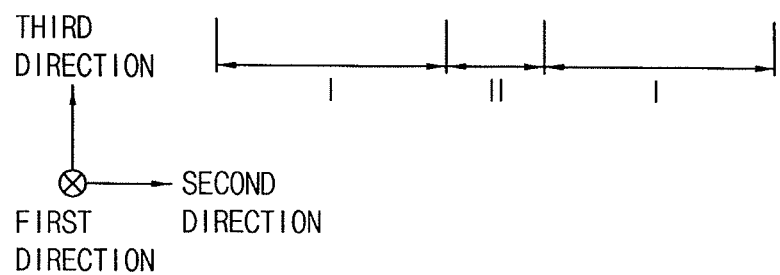

FIG. 29
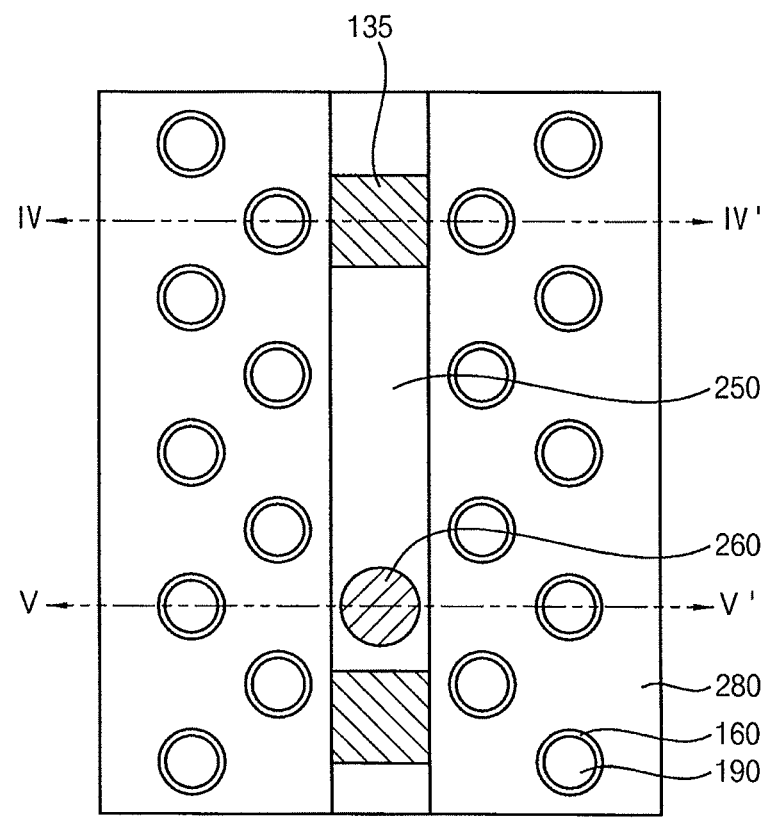
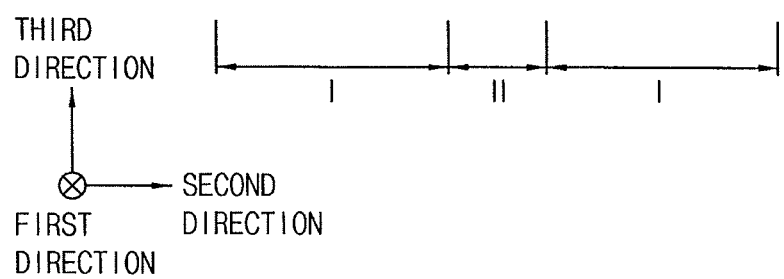

FIG. 32
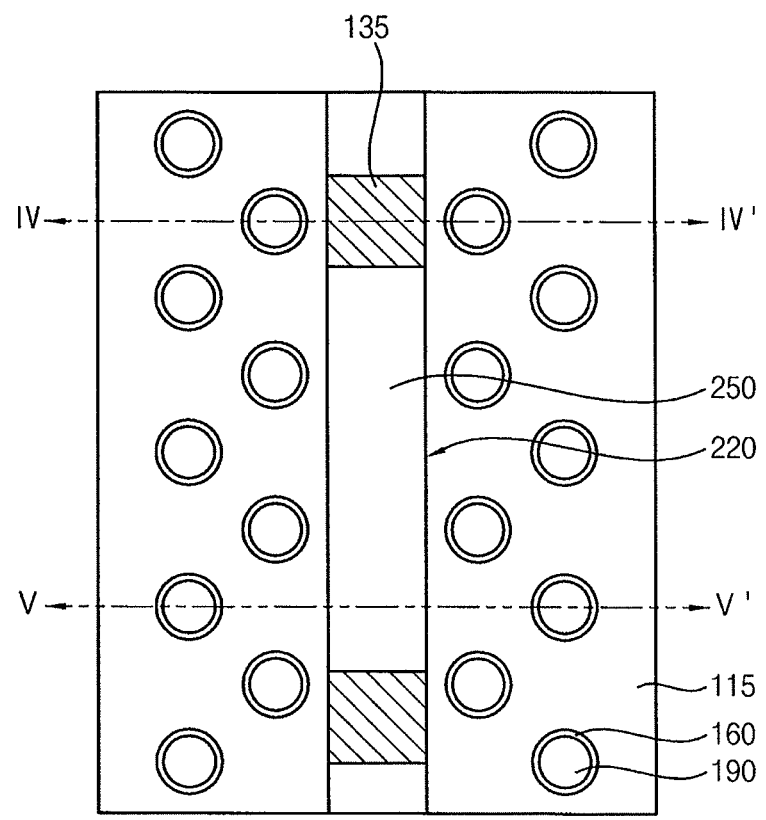
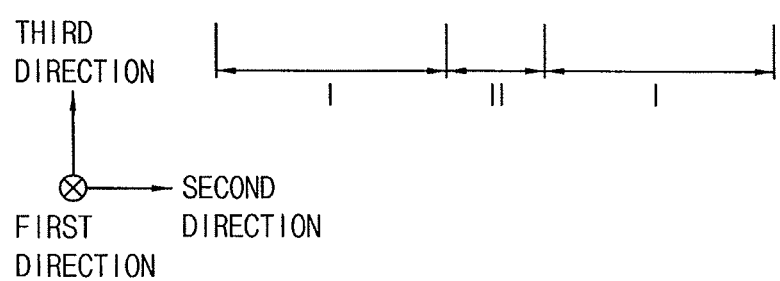

FIG. 34
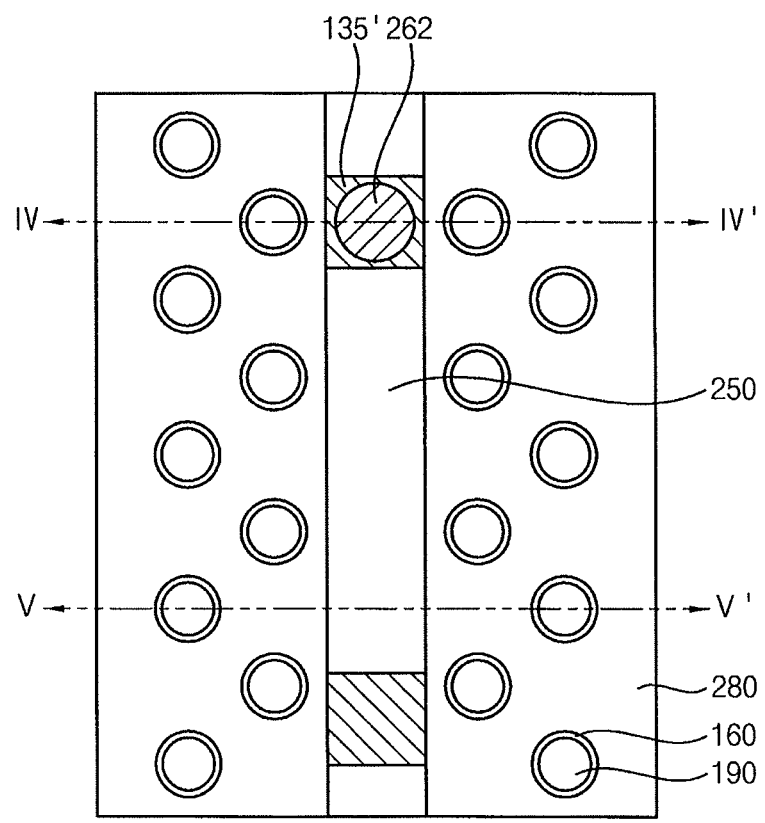
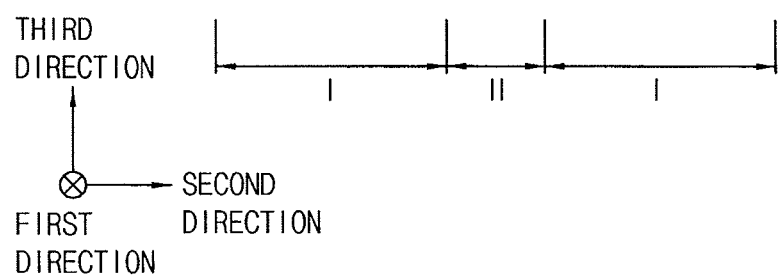

FIG. 42
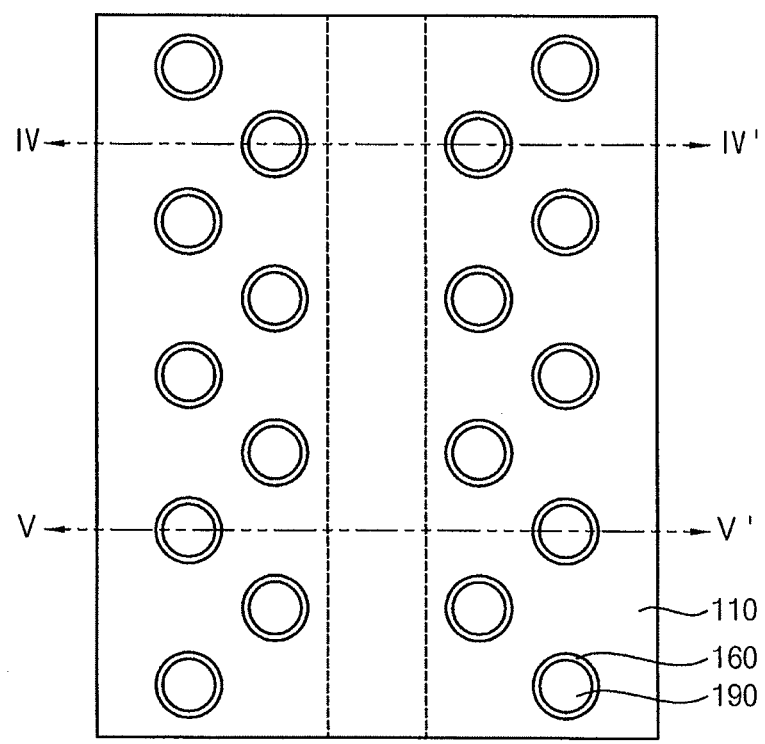
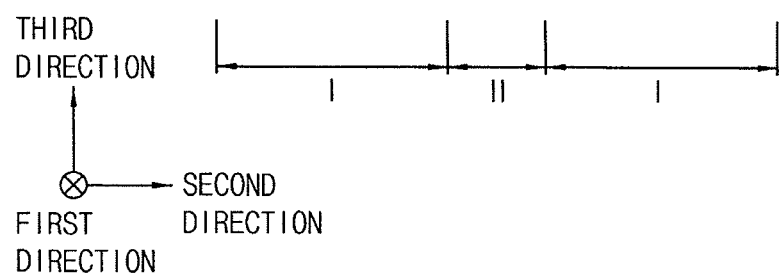

FIG. 44
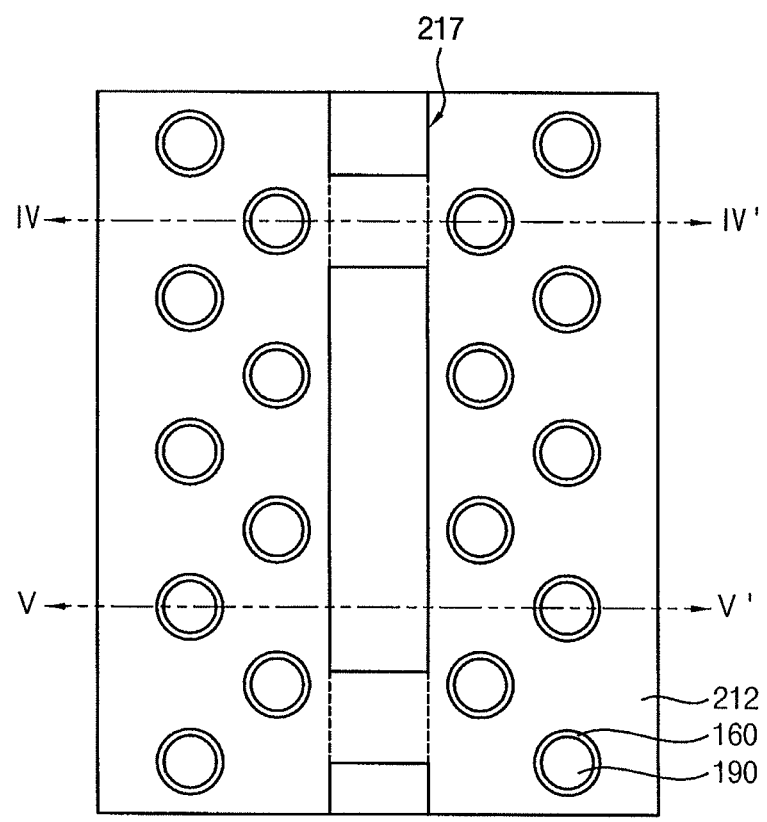
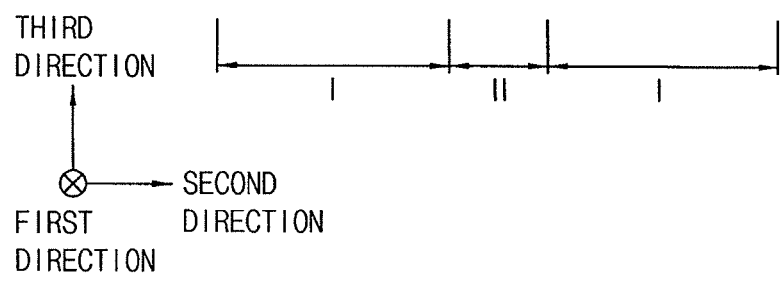

FIG. 46
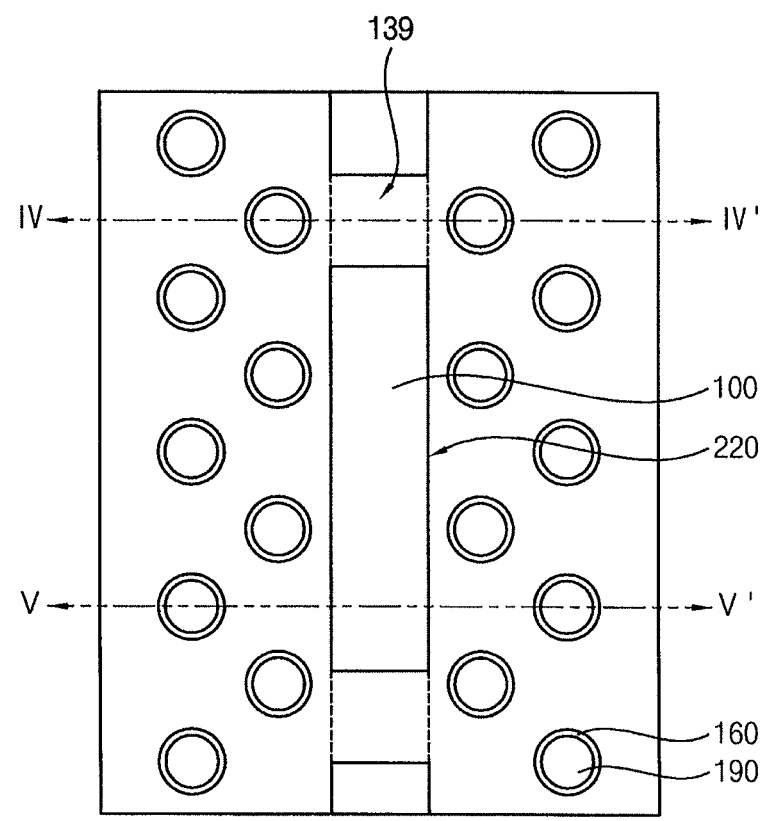
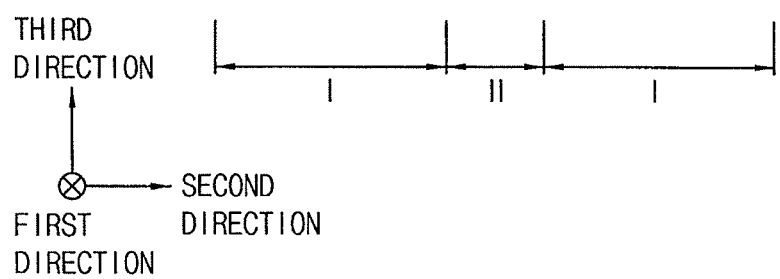

FIG. 49
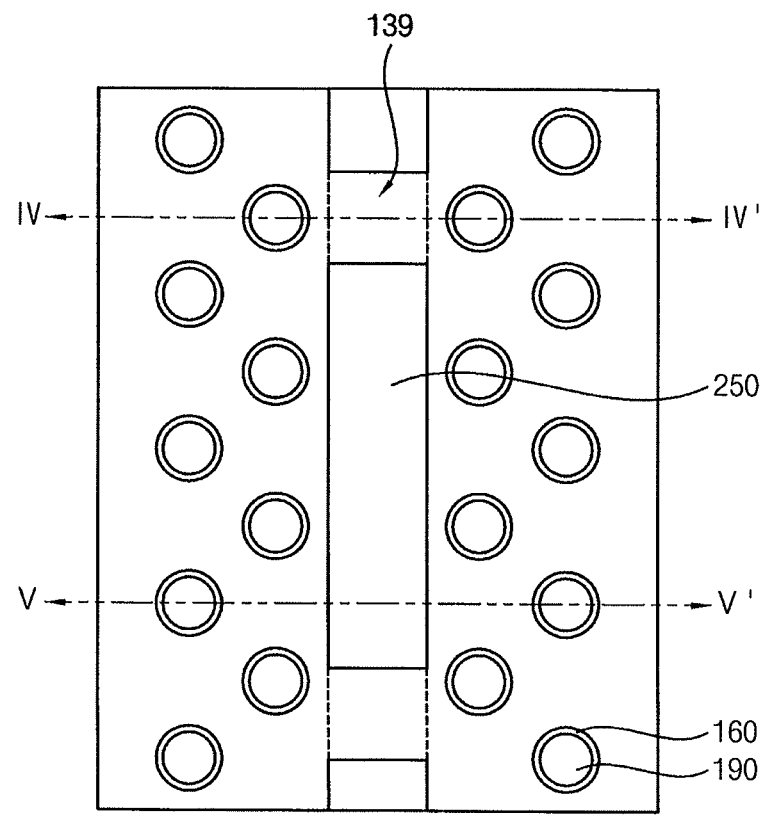
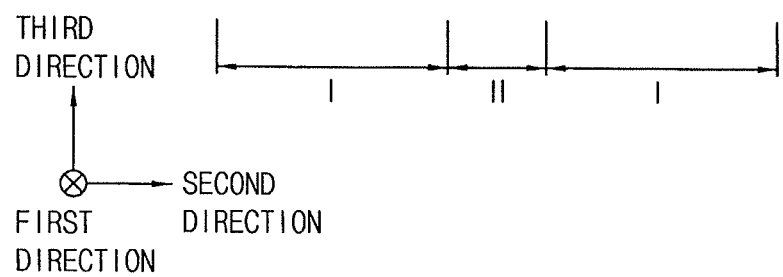

VERTICAL MEMORY DEVICES AND METHODS OF MANUFACTURING THE SAME

CROSS-REFERENCE TO RELATED APPLICATION

Korean Patent Application No. 10-2014-0007963, filed on Jan. 22, 2014, in the Korean Intellectual Property Office, "Vertical Memory Devices and Methods of Manufacturing the Same," is incorporated by reference herein in its entirety.

BACKGROUND

1. Field

Example embodiments relate to vertical memory devices, for example, having a vertical channel, and methods of manufacturing the same.

2. Description of the Related Art

In methods of manufacturing vertical memory devices, insulation layers and sacrificial layers may be alternately and repeatedly formed on a substrate. Holes may be formed though the insulation layers and the sacrificial layers. Channels may be formed to fill the holes. Openings may be formed through the insulation layers and the sacrificial layers. The sacrificial layers exposed by the openings may be removed to form gaps exposing the channels. ONO (oxide-nitride-oxide) layers and gate structures including gate electrodes may be formed to fill the gaps.

During an etching process for forming a word line cut or a gap, the insulation layers may be deformed or may lean. When the insulation layers are deformed, the position of the channel is dislocated, and a misalignment may occur.

SUMMARY

Embodiments may be realized by providing a vertical memory device, including a substrate including first regions and a second region; a plurality of channels in the first regions, the plurality of channels extending in a first direction substantially perpendicular to a top surface of the substrate; a charge storage structure on a sidewall of each channel in a second direction substantially parallel to the top surface of the substrate; a plurality of gate electrodes in the first regions, the plurality of gate electrodes arranged on a sidewall of the charge storage structure and spaced apart from each other in the first direction; and a plurality of supporters in the second region, the plurality of supporters spaced apart from each other in a third direction substantially perpendicular to the first direction and the second direction, the plurality of supporters contacting a sidewall of at least one gate electrode.

The first regions and the second region may be arranged alternately in the second direction, each of the first regions and the second region extending in the third direction.

The supporter may have a width in the second direction that is substantially identical to a width of the second region, and the supporter may have a length in the third direction that is substantially identical to or larger than the width of the second region.

The gate electrodes may include a ground selection line (GSL), a word line and a string selection line (SSL) that are sequentially arranged from the top surface of the substrate, a bottom surface of the supporter may be substantially lower than a bottom surface of the SSL, and the bottom surface of the supporter may be substantially higher than a top surface of the word line.

The gate electrodes may include a ground selection line (GSL), a word line and a string selection line (SSL) that are sequentially arranged from the top surface of the substrate, and a bottom surface of the supporter may directly contact a top surface of the SSL.

The supporter may include silicon oxide or polysilicon.

The supporter may include a second supporter and a first supporter surrounding a bottom surface and a sidewall of the second supporter, the first supporter may include silicon oxide, and the second supporter may include polysilicon.

The vertical memory device may further include insulation layer patterns between the gate electrodes in the first direction. The supporter may directly contact sidewalls of the insulation layer patterns, and the supporter may hold the insulation layer patterns.

The vertical memory device may further include an impurity region at an upper portion of the substrate in the second region, the impurity region extending in the third direction.

The vertical memory device may further include a contact in the second region, the contact extending in the first direction, and directly contacting a top surface of the impurity region.

The contact may penetrate the supporter.

Embodiments may be realized by providing a method of manufacturing a vertical memory device, the method including forming a plurality of sacrificial layers and a plurality of insulation layers on a substrate alternately and repeatedly, the substrate having a first region and a second region; forming a supporter in the second region, the supporter penetrating at least one sacrificial layer and at least one insulation layer; forming holes through the sacrificial layers and the insulation layers to expose a top surface of the substrate in the first region; forming a charge storage structure and a channel filling each hole; partially removing the sacrificial layers and the insulation layers to form an opening, the opening exposing a top surface of the substrate in the second region; forming a plurality of gaps by removing the sacrificial layers to expose a sidewall of each charge storage structure; and forming a gate electrode to fill each gap.

The supporter may prevent the insulation layers from leaning during the steps of forming the opening and forming the gaps.

Forming the gate electrode may include forming a preliminary gate electrode layer on an inner wall of the opening, the preliminary gate electrode layer including a metal; performing a heat treatment process such that the preliminary gate electrode layer and a remaining portion of the sacrificial layers are transformed into a gate electrode layer; and partially removing the gate electrode layer. Forming the plurality of gaps may include partially removing the sacrificial layers, the sacrificial layers including polysilicon.

The supporter may include a silicon oxide or polysilicon.

Embodiments may be realized by providing a vertical memory device, including a substrate including first regions situated on each side of a second region; at least one channel in the first regions, the at least one channel extending in a first direction substantially perpendicular to a top surface of the substrate; a charge storage structure on a sidewall of each channel in a second direction substantially parallel to the top surface of the substrate; a plurality of gate electrodes in the first regions, the plurality of gate electrodes arranged on a sidewall of the charge storage structure and spaced apart from each other in the first direction; and at least one supporter in the second region, the at least one supporter contacting a sidewall of at least one gate electrode.

The vertical memory device as may include a plurality of channels in the first regions.

Each channel may have a pillar shape.

Each channel may have a cup shape of which a central bottom is opened.

The at least one supporter may have a square shape or a rectangular shape, when viewed in the first direction.

BRIEF DESCRIPTION OF THE DRAWINGS

Features will become apparent to those of skill in the art by describing in detail exemplary embodiments with reference to the attached drawings in which:

FIGS. 1 to 4 illustrate a horizontal cross-sectional view, a vertical cross-sectional view, and a perspective view of a vertical memory device in accordance with example embodiments;

FIGS. 9 and 10 illustrate a horizontal cross-sectional view and a vertical cross-sectional view of a vertical memory device in accordance with example embodiments;

FIGS. 11 to 31 illustrate horizontal cross-sectional views and vertical cross-sectional views of a method of manufacturing a vertical memory device in accordance with example embodiments;

FIGS. 32 to 36 illustrate horizontal cross-sectional views and vertical cross-sectional views of a method of manufacturing a vertical memory device in accordance with example embodiments;

FIGS. 42 to 50 illustrate horizontal cross-sectional views and vertical cross-sectional views of a method of manufacturing a vertical memory device in accordance with example embodiments.

DETAILED DESCRIPTION

Figure 1:
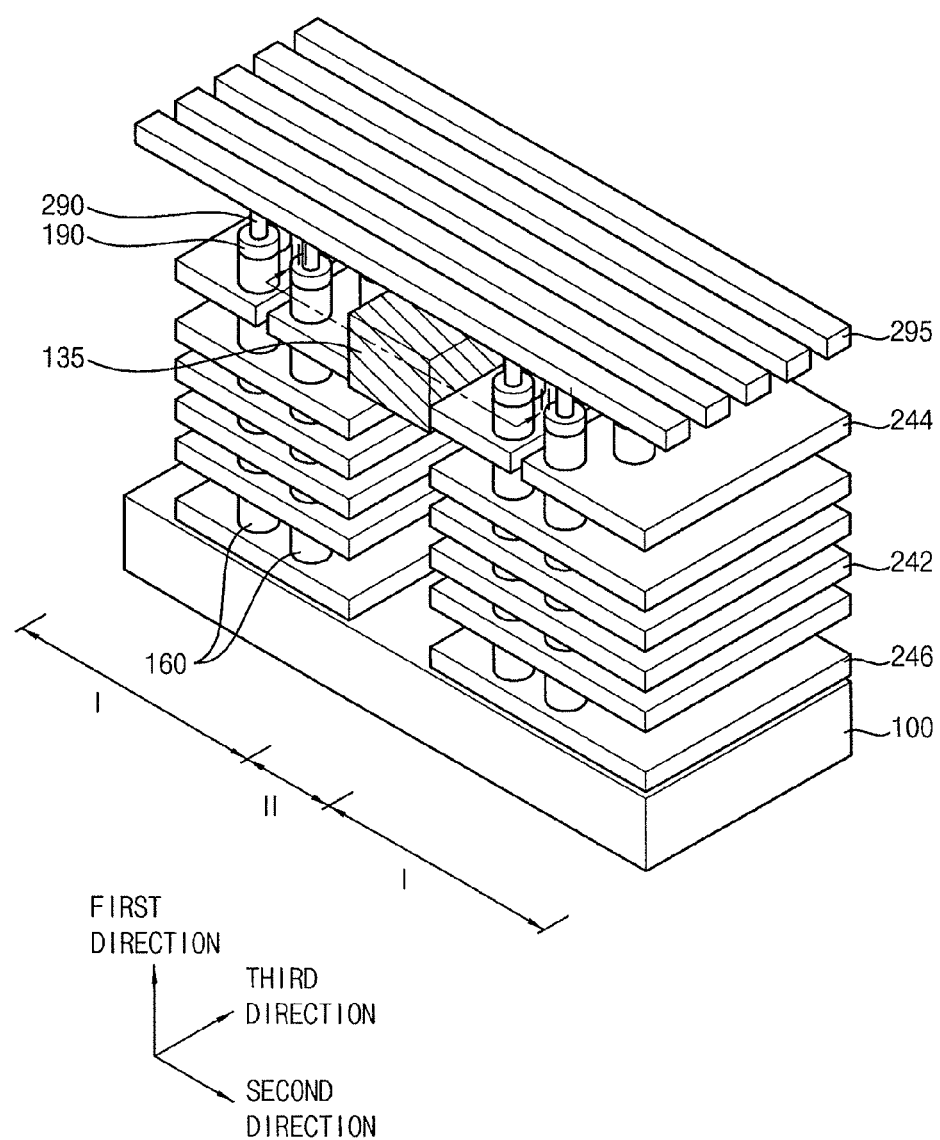

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items. Other words used to describe the relationship between elements or layers should be interpreted in a like fashion (e.g., "under" versus "directly under," "between" versus "directly between," "adjacent" versus "directly adjacent," "on" versus "directly on").

It will be understood that, although the terms first, second, third, etc. may be used herein to describe various elements, components, regions, layers and/or sections, these elements, components, regions, layers and/or sections should not be limited by these terms. Unless indicated otherwise, these terms are only used to distinguish one element, component, region, layer or section from another region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to limit the scope of the present disclosure.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure) is illustrated in a cross-sectional view, an electronic device may include a plurality of the device structures (e.g., memory cell structures), as would be illustrated by a plan view of the electronic device. The plurality of device structures may be arranged in an array and/or in a two-dimensional pattern.

Unless otherwise defined, all terms (including technical and scientific terms) used herein have the same meaning as commonly understood by one of skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3:
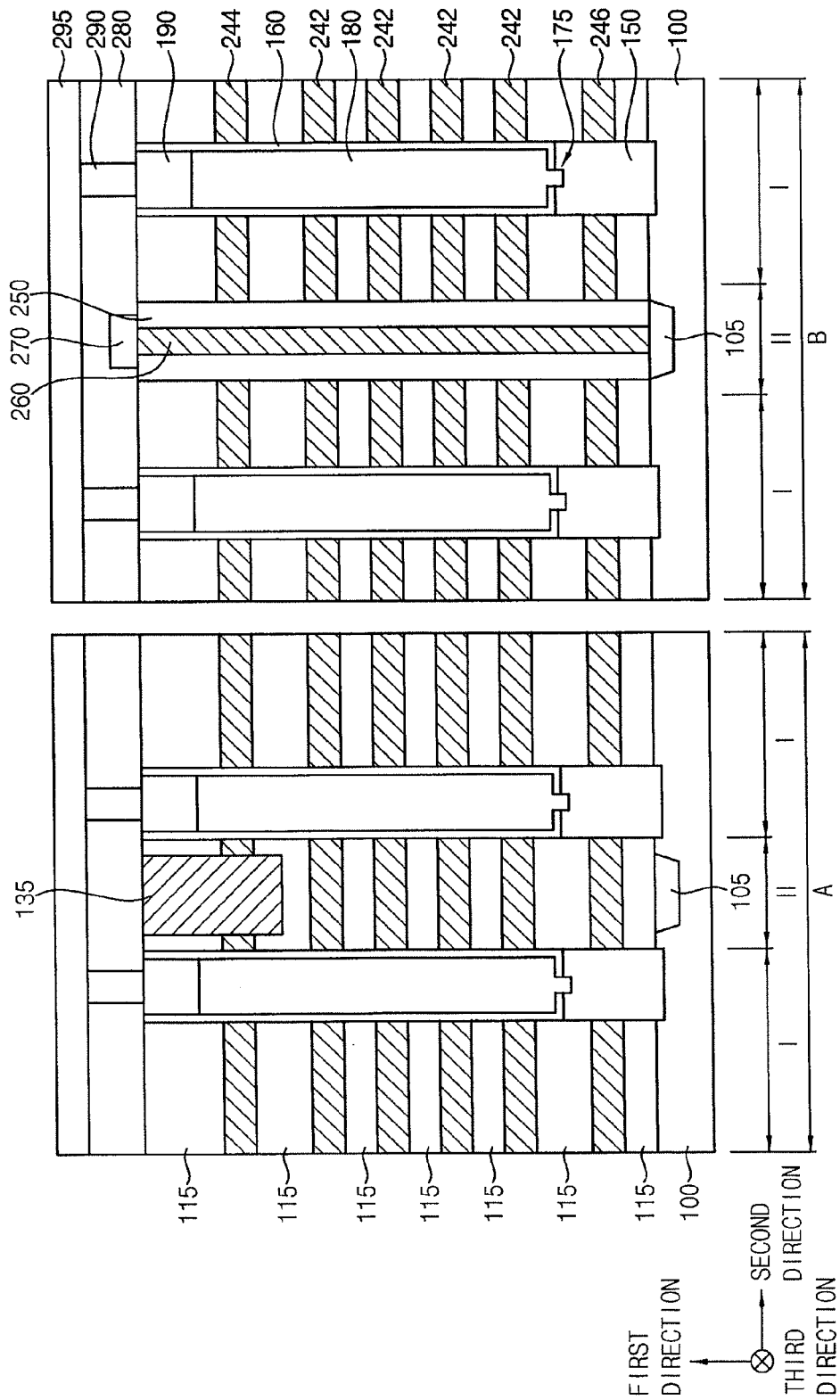
Figure 4:
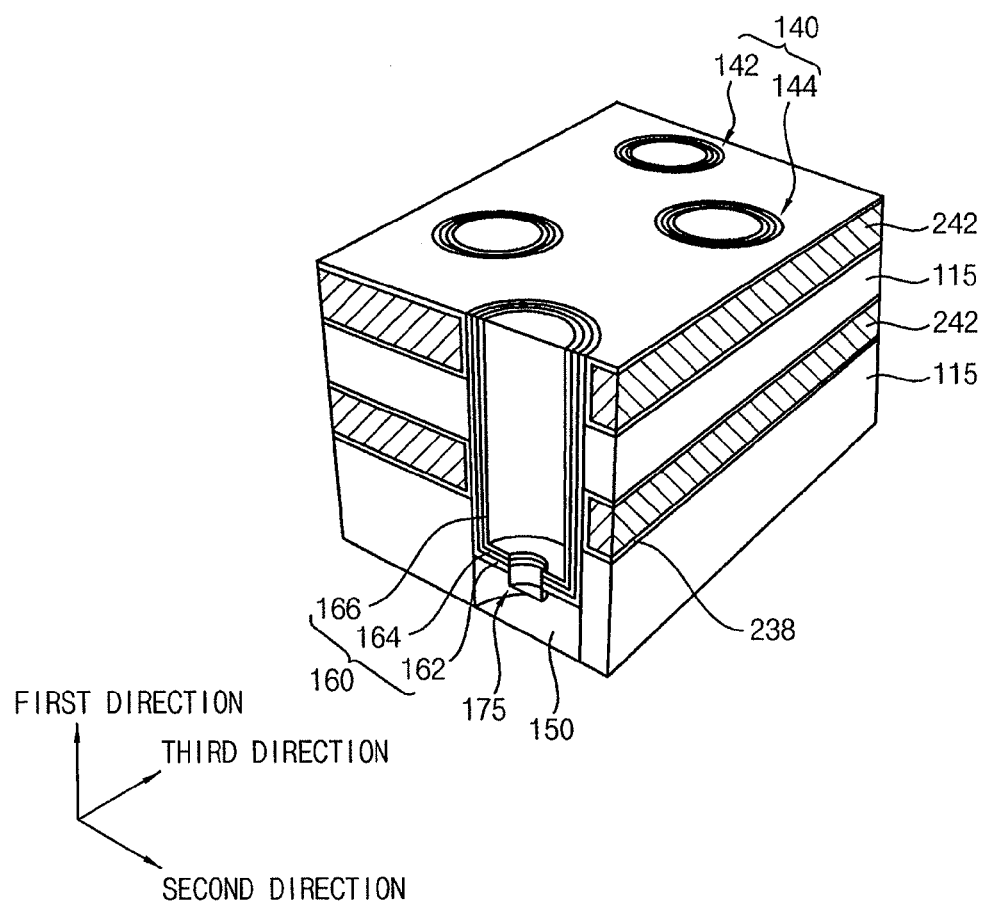

FIGS. 1 to 4 are a horizontal cross-sectional view, a vertical cross-sectional view, and perspective views illustrating a vertical memory device in accordance with example embodiments. FIG. 1 is a perspective view illustrating the vertical memory device, and FIG. 2 is a horizontal cross-sectional view cut along the line III-III' of FIG. 1. FIG. 3 includes a vertical cross-sectional view (A) cut along the line IV-IV' of FIG. 2 and a vertical cross-sectional view (B) cut along the line V-V' of FIG. 2. FIG. 4 is an enlarged perspective view illustrating the vertical memory device.

In all figures in this specification, a direction substantially perpendicular to a top surface of the substrate is referred to as a first direction, and two directions substantially parallel to the top surface of the substrate and substantially perpendicular to each other are referred to as a second direction and a third direction. Further, a fourth direction is substantially parallel to the top surface of the substrate and at an acute angle to the third direction. Additionally, a direction indicated by an arrow in the figures and a reverse direction thereto may be considered as the same direction.

Referring to FIGS. 1 to 4, the vertical memory device may include a plurality of channels 180, each of which may extend in the first direction on a substrate 100, a charge storage structure 160 stacked on an outer sidewall of each channel 180, and a plurality of gate electrodes 242, 244, and 246 disposed on an outer sidewall of the charge storage structure 160. The vertical memory device may further include a bit line contact 290 and a bit lines 295 electrically connected to the channel 180. For example, the vertical memory device may include first insulation layer patterns 115 disposed between the gate electrodes 242, 244, and 246 at each level and a supporter 135 for supporting the first insulation layer patterns 115.

The substrate 100 may include a semiconductor material, e.g., silicon, germanium, etc. The substrate 100 may include a first region I and a second region II. In example embodiments, the first region I may be a cell region in which vertical memory elements including the channels 180 and the gate electrodes 242, 244, and 246 may be formed, and the second region II may be a word line cut region in which a fourth insulation layer pattern 250 may be disposed to insulate the gate electrodes 242, 244, and 246. A plurality of first regions I and a plurality of second regions II may be disposed alternately in the second direction, and each of the first regions I and the second regions II may extend in the third direction.

Each channel 180 may extend in the first direction in the first region I. In example embodiments, each channel 180 may have a pillar shape. In other example embodiments, each channel 180 may have a cup shape of which a central bottom is opened. A space defined by an inner wall of each channel 180 may be filled with an insulation pattern. For example, each channel 180 may include doped or undoped polysilicon or single crystalline silicon.

In example embodiments, the plurality of channels 180 may be arranged in both of the second and third directions. For example, the plurality of channels 180 may be arranged in a zigzag pattern (for example, a staggered pattern) with respect to the third direction, and a channel array may be formed. The channel array may include a plurality of channel columns which may be arranged in the second direction. Further, each of the channel columns may include a plurality of channels 180 which may be arranged in the third direction. In example embodiments, the channel array may include, for example, two channel columns as illustrated in FIGS. 1 and 2. For example, the channel array may include one channel columns to five channel columns.

Referring to FIGS. 3 and 4, the charge storage structure 160 stacked on the outer sidewall of each channel 180 may include a tunnel insulation layer pattern 166, a charge storage layer pattern 164 and a first blocking layer pattern 162. For example, the tunnel insulation layer pattern 166, the charge storage layer pattern 164 and the first blocking layer pattern 162 may surround the outer sidewall and a bottom surface of the channel 180. In example embodiments, a plurality of charge storage layer structures 160 may be formed, each of which may correspond to each channel 180.

In example embodiments, the tunnel insulation layer pattern 166 may include an oxide, e.g., silicon oxide, the charge storage layer pattern 164 may include a nitride, e.g., silicon nitride, and the first blocking layer pattern 162 may include an oxide, e.g., silicon oxide.

In example embodiments, a semiconductor pattern 150 making contact with the top surface of the substrate 100 may be formed beneath each channel 180. As the channel 180 may have a portion at a bottom thereof protruding from the charge storage layer structure 160, the semiconductor pattern 150 may have a concave portion at a top surface thereof. The semiconductor pattern 150 may directly contact the channel 180 through the protrusion portion thereof. In example embodiments, the semiconductor pattern 150 may include doped or undoped polysilicon, single crystalline polysilicon, doped or undoped polygermanium or single crystalline germanium.

Further, a pad 190 may be formed on top surfaces of the channel 180 and the charge storage layer structure 160. In example embodiments, the pad 190 may include doped or undoped polysilicon or single crystalline silicon. In example embodiments, a plurality of pads 190 may be formed, each of which may correspond to each channel 180.

Referring now to FIGS. 3 and 4, a plurality of first insulation patterns 115 may be formed in the first direction on sidewalls of the charge storage layer structures 160, respectively. For example, the first insulation patterns 115 may include silicon oxide. Further, a space between the first insulation layers 115 in the first direction may be defined as a gap.

In example embodiments, the second blocking layer pattern 238 may extend along and contact, e.g., directly contact, a sidewall of the first blocking layer pattern 162. Thus, portions of the outer sidewalls of the channels 180 may be surrounded by the second blocking layer pattern 238. The second blocking layer pattern 238 may be formed in the gap between adjacent first insulation patterns 115. Top and bottom end portions of the second blocking layer pattern 238 may extend in both of the second and third directions, e.g., may be between one or more of the plurality of gate electrodes 242, 244, and 246 and the first insulation patterns 115. The second blocking layer pattern 238 may include, e.g., aluminum oxide and/or silicon oxide. In an embodiment, the second blocking layer pattern 238 may be omitted.

The plurality of gate electrodes 242, 244, and 246 may be formed on a sidewall of the second blocking layer pattern 238. In example embodiments, the plurality of gate electrodes 242, 244, and 246 may extend along the third direction in the first region I.

The plurality of gate electrodes 242, 244, and 246 may include a ground selection line (GSL) 246, a word line 242 and a string selection line (SSL) 244 that are spaced apart from each other along the first direction.

Each of the GSL 246, the word line 242 and the SSL 244 may be at a single level (e.g., one of each, each at a different height) or more than one level, and each of the first insulation layer patterns 115 may be interposed therebetween. In example embodiments, the GSL 246 and the SSL 244 may be at one level (e.g., two of each at different heights), respectively, and the word line 242 may be at 4 levels between the GSL 246 and the SSL 244. However, the GSL 246 and the SSL 244 may be at two levels, and the word line 242 may be formed at 2, 8, 16, 32 or 64 levels.

In example embodiments, the plurality of gate electrodes 242, 244, and 246 may include, for example, a metal and/or a metal nitride. For example, the plurality of gate electrodes 242, 244, and 246 may include a metal and/or a metal nitride with low electrical resistance (e.g., tungsten, tungsten nitride, titanium, titanium nitride, tantalum, tantalum nitride and/or platinum.)

The charge storage layer structure 160 and the plurality of gate electrodes 242, 244, and 246 may define a gate structure. A plurality of gate structures may be disposed on the sidewall of the channel 180, and may be arranged in the first direction.

Referring now to FIGS. 2 and 3, a first impurity region 105, a fourth insulation layer pattern 250 and the supporter 135 may be disposed on the second region II on the substrate 100.

The first impurity region 105 may be disposed at an upper portion of the substrate 100 in the second region II. The first impurity region 105 may extend in the third direction, and may serve as a common source line (CSL) of the vertical memory device. In example embodiments, the first impurity region 105 may include n-type impurities, e.g., phosphorus, arsenic, and the like.

The fourth insulation layer pattern 250 may be disposed between the gate electrodes 242, 244, and 246 in the second region II. The fourth insulation layer pattern 250 may be disposed between some gate electrodes 242, 244, and 246 in one first region I and other gate electrodes 242, 244, and 246 in another first region I, and the fourth insulation layer pattern 250 may isolate above gate electrodes 242, 244, and 246 from each other.

In example embodiments, the fourth insulation layer pattern 250 may have a width in the second direction which may be substantially the same as a width of the second region II. The fourth insulation layer pattern 250 may have a length in the third direction which may be substantially larger than the width of the second region II. Further, the fourth insulation layer pattern 250 may have a bottom surface which may directly contact a top surface of the substrate 100, and may have a top surface which may have the same height of the top surface of the pad 190.

In example embodiments, a plurality of fourth insulation layer patterns 250 may be arranged in the second direction. Each of the fourth insulation layer patterns 250 may extend in the third direction.

A contact 260 may be disposed through the fourth insulation layer pattern 250, and the contact 260 may be electrically connected to the first impurity region 105. A sidewall of the contact 260 may be surrounded by the fourth insulation layer pattern 250, a bottom surface of the contact 260 may directly contact the first impurity region 105, and a top surface of the contact 260 may contact the wiring 270. The contact 260 may serve as a common source line contact.

Referring now to FIGS. 1 to 3, the supporter 135 may be disposed between the fourth insulation layer patterns 250 in the second region II.

In example embodiments, the supporter 135 may have a width in the second direction which may be substantially the same as the width of the second region II, and may have a length in the third direction which may be substantially the same as or larger than the width of the second region II, and the supporter 135 may have a square shape or a rectangular shape, when viewed in the first direction.

Further, a top surface of the supporter 135 may have a height substantially the same as the top surface of the pad 190. A bottom surface of the supporter 135 may be substantially higher than a top surface of the word line 242, e.g., an uppermost word line 242, and may be substantially lower than a bottom surface of the SSL 244, and the supporter 135 may be disposed through the SSL 244 in the second region II, and may not be disposed through the word line 242.

In example embodiments, a plurality of supporters 135 may be arranged in the third direction. A distance between adjacent supporters 135 in the third direction may be, for example, substantially four times larger than the width of the second region II as illustrated in FIG. 2. For example, the distance between adjacent supporters 135 may be substantially 10 times to 200 times of the width of the second region II.

The supporter 135 may hold the first insulation layer pattern 115. During etching processes for forming the fourth insulation layer pattern 250 or the gate electrodes 242, 244, and 246 (refer to FIGS. 22 to 24), the supporter 135 may prevent the first insulation layer pattern 115 and the channel 180 from leaning, and a misalignment between the bit line contact 280 and the channels 180 (or the pad 190) may be prevented. For example, the supporter 135 may include silicon oxide or silicon nitride.

Referring now to FIG. 3, the bit lines 295 may be electrically connected to the channels 180 and the pads 190 through the bit line contacts 290. For example, the bit lines 295 may include a metal, a metal nitride, a doped polysilicon, etc.

In example embodiments, the vertical memory device may include the plurality of supporters 135 that may be disposed in the second region II of the substrate 100, and may be arranged in the third direction. The supporter 135 may support the first insulation layer pattern 115, misalignment between the bit line contact 280 and channels 180 (or the pad 190) may be prevented, and reliability of the vertical memory device may be improved.

Figure 5:
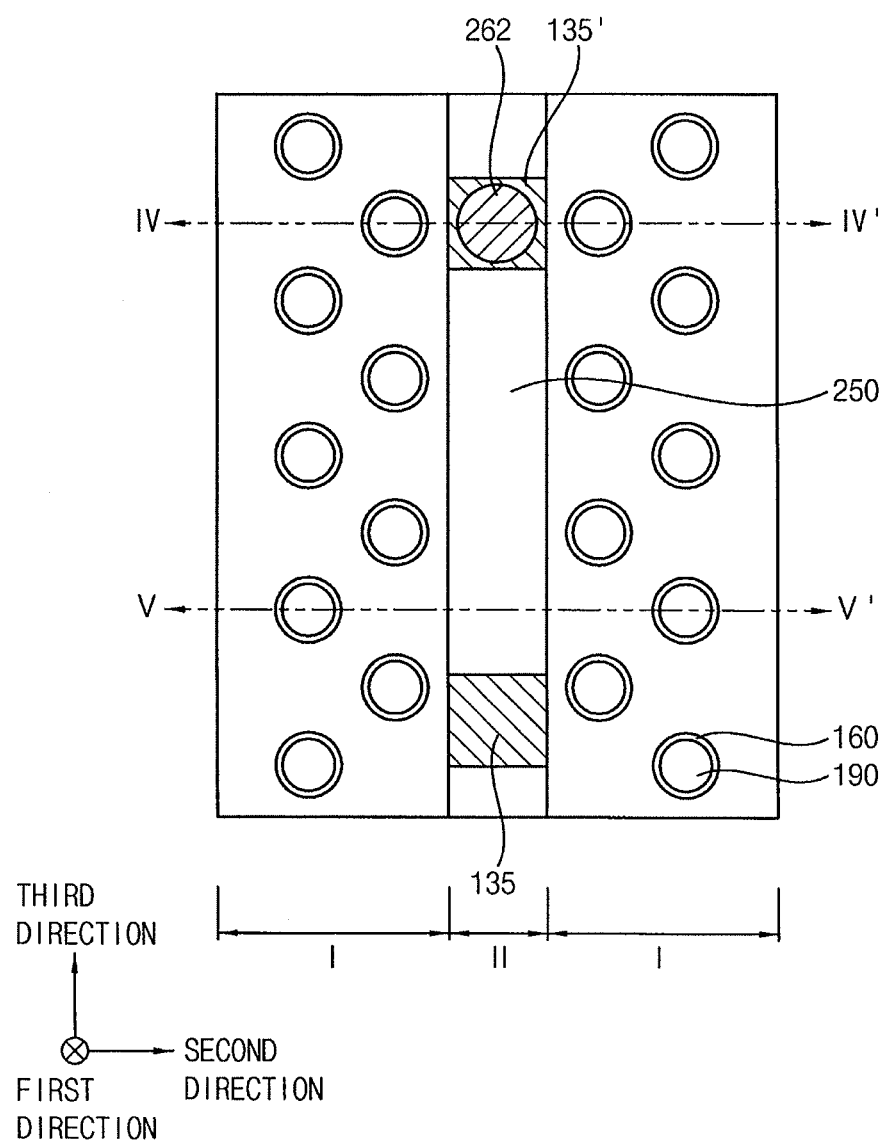
FIGS. 5 and 6 illustrate a horizontal cross-sectional view and a vertical cross-sectional view of a vertical memory device in accordance with example embodiments.
Figure 6:
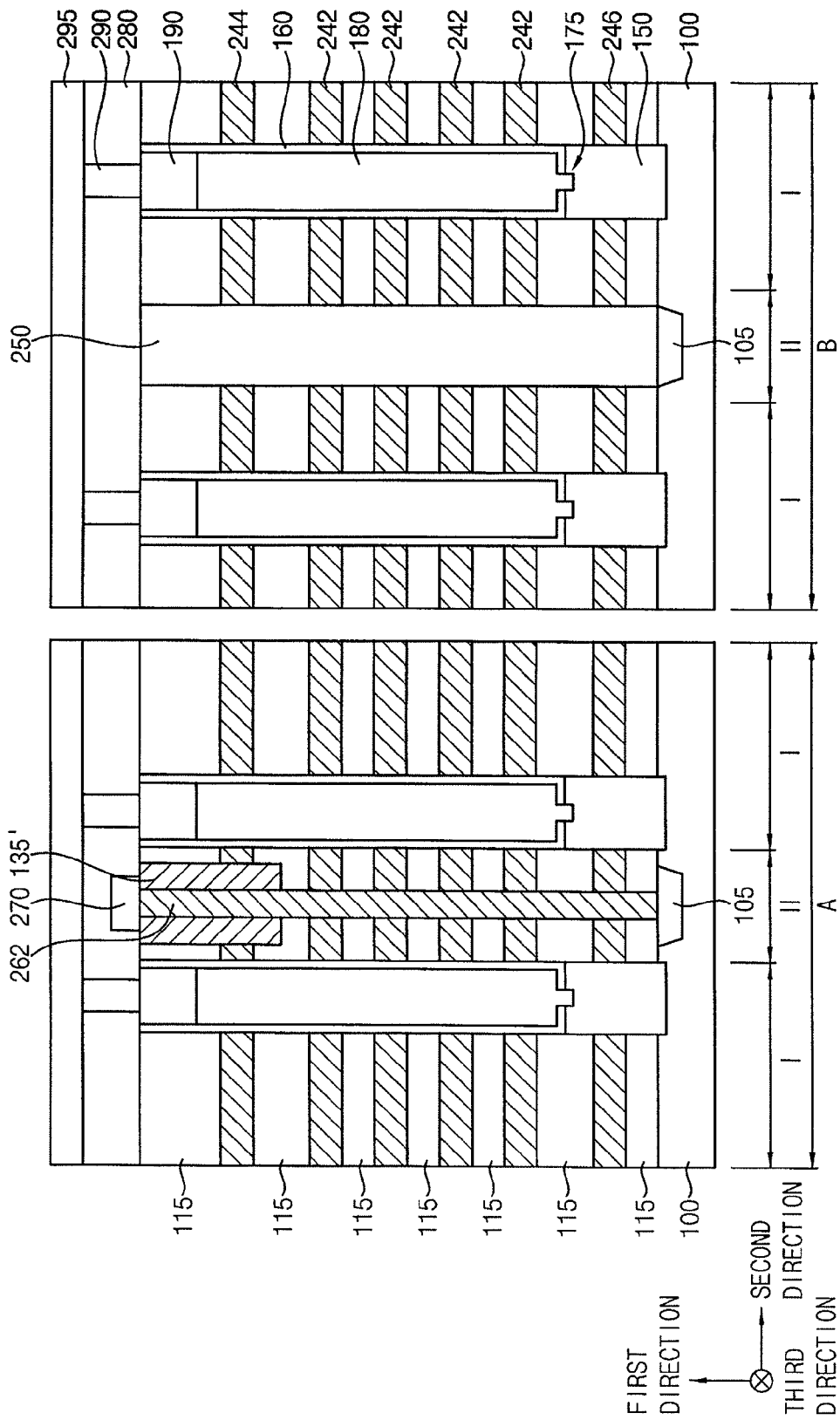

FIGS. 5 and 6 are a horizontal cross-sectional view and a vertical cross-sectional view illustrating a vertical memory device in accordance with example embodiments. The vertical memory device may be substantially the same as or similar to that of FIGS. 1 to 4, except for a position of a contact 262 and wiring 270.

Referring to FIGS. 5 and 6, the vertical memory device may include channels 180, each of which may extend in the first direction on the substrate 100, the charge storage structure 160 stacked on an outer sidewall of each channel 180, and the gate electrodes 242, 244, and 246 disposed on an outer sidewall of the charge storage structure 160. The vertical memory device may further include the bit line contact 290 and the bit lines 295 electrically connected to the channel 180. For example, the vertical memory device may include first insulation layer patterns 115 disposed between the gate electrodes 242, 244, and 246 at each level and a supporter 135' for supporting the first insulation layer patterns 115.

The supporter 135' may be disposed in a second region II of the substrate 100. The supporter 135' may be substantially the same as or similar to that of FIGS. 1 to 4, except that the contact 262 extends therethrough.

The contact 262 may penetrate the supporter 135', the gate electrodes 242 and 246 and the first insulation layer patterns 115, and a bottom surface of the contact 262 may contact a first impurity region 105. An upper sidewall of the contact 262 may be surrounded by the supporter 135', and a lower sidewall of the contact 262 may be surrounded by gate electrodes 242 and 246 and the first insulation layer patterns 115. Further, a bottom surface of the contact 262 may directly connected to the first impurity region 105, and a top surface of the contact 262 may directly connected to a wiring 270. In example embodiments, the contact 262 may serve as a CSL contact.

During an etching process and a deposition process for forming the contact 262, some channels 180 disposed adjacent to the contact 262 may be degraded. In example embodiments, those channels 180 disposed adjacent to the contact 262 may be a dummy channel that does not serve as a memory device. Further, other channels 180 disposed adjacent to the supporter 135' also may be a dummy channel that does not serve as a memory device. According to example embodiment, the contact 262 and the supporter 135' may be disposed to overlap each other, the number of the dummy channels disposed adjacent to the contact 262 and the supporter 135' may decrease, and a degree of integration of the vertical memory device may increase.

Figure 7:
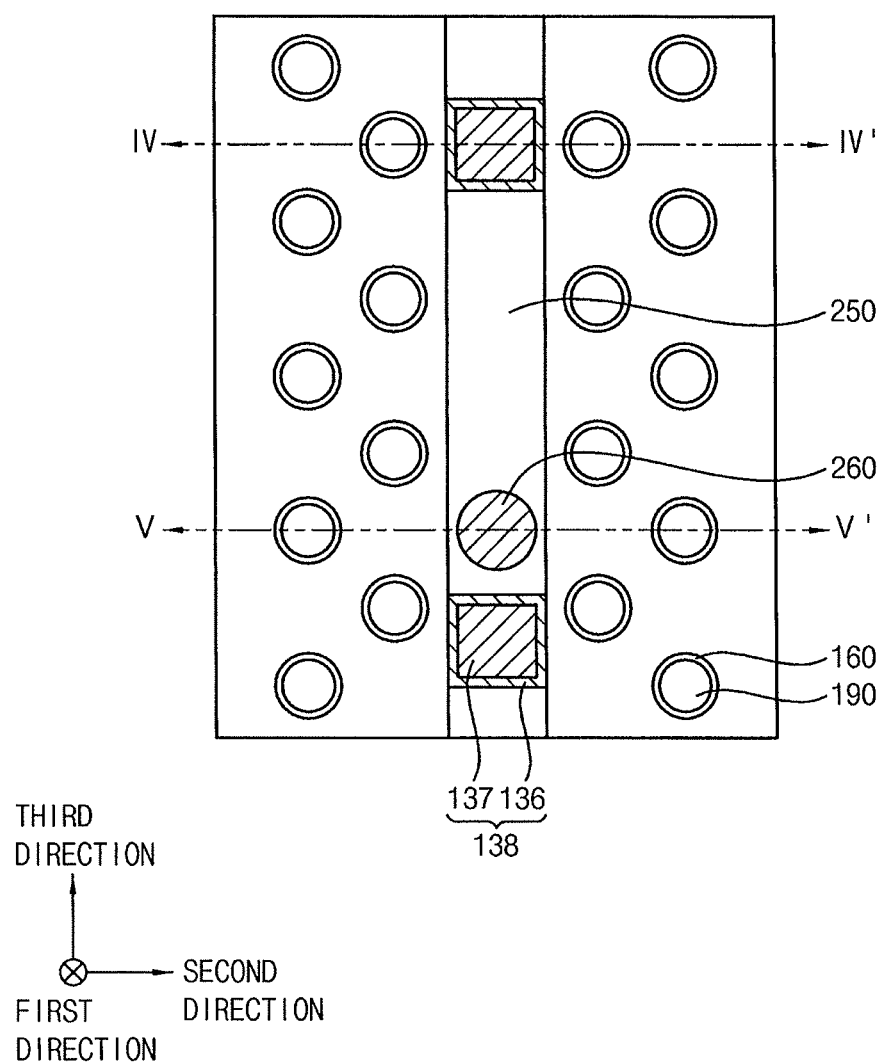
FIGS. 7 and 8 illustrate a horizontal cross-sectional view and a vertical cross-sectional view of a vertical memory device in accordance with example embodiments.
Figure 8:
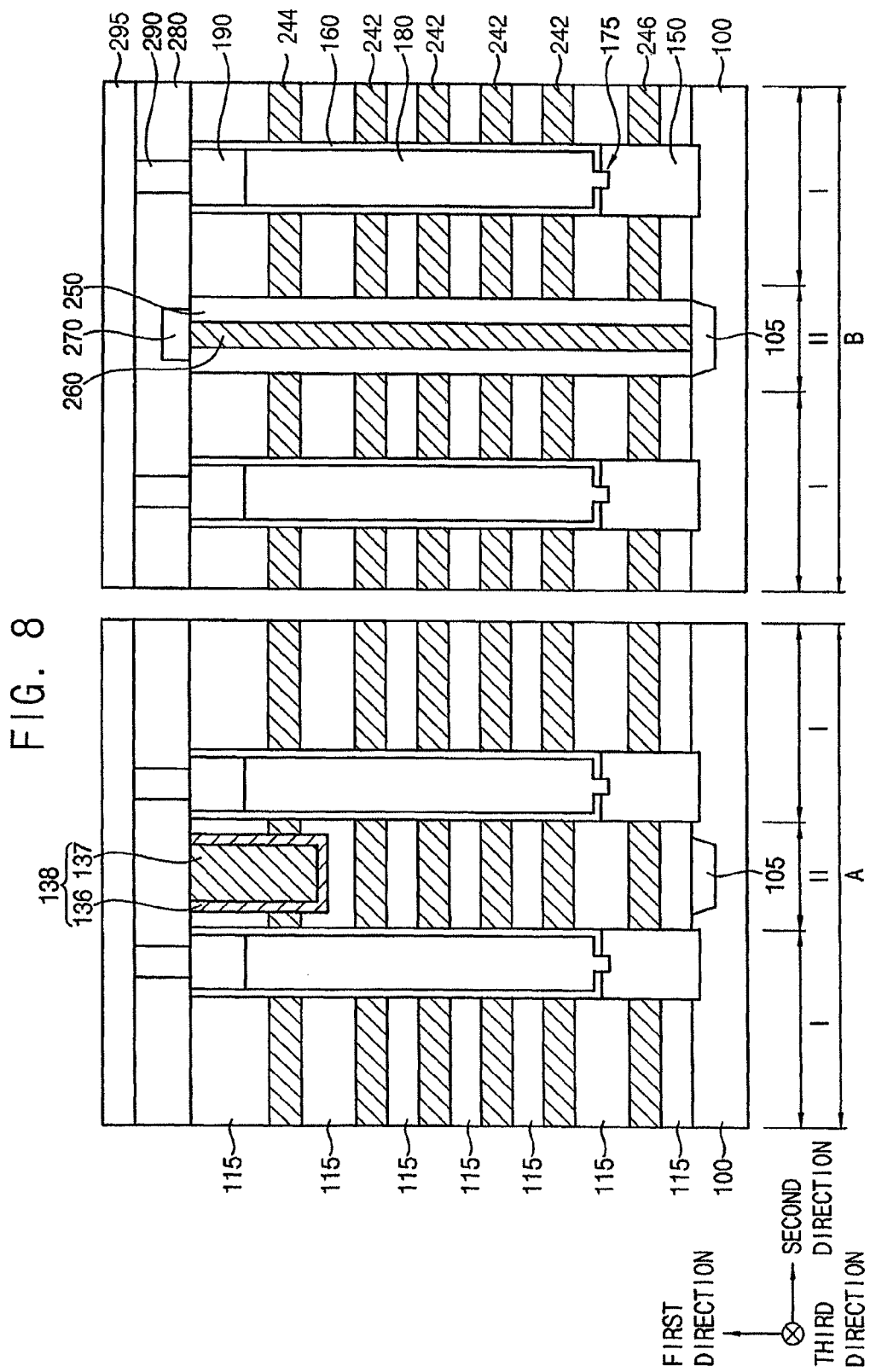

FIGS. 7 and 8 are a horizontal cross-sectional view and a vertical cross-sectional view illustrating a vertical memory device in accordance with example embodiments. The vertical memory device may be substantially the same as or similar to that of FIGS. 1 to 4, except for a supporter 138.

Referring to FIGS. 7 and 8, the vertical memory device may include channels 180, each of which may extend in the first direction on the substrate 100, the charge storage structure 160 stacked on an outer sidewall of each channel 180, and the gate electrodes 242, 244, and 246 disposed on an outer sidewall of the charge storage structure 160. The vertical memory device may further include the bit line contact 290 and the bit lines 295 electrically connected to the channel 180. For example, the vertical memory device may include first insulation layer patterns 115 disposed between the gate electrodes 242, 244, and 246 at each level and a supporter 138 for supporting the first insulation layer patterns 115.

The supporter 138 may be disposed between fourth insulation layer patterns 250 in a second region II. In example embodiments, the supporter 138 may have a width in a second direction that may be substantially the same as a width of the second region II. The supporter 138 may have a length in a third direction that may be substantially the same as or larger than the width of the second region II, and the supporter 138 may have a square shape or a rectangular shape, when viewed in a first direction.

Further, a top surface of the supporter 138 may have a height substantially the same as a top surface of a pad 190, and a bottom surface of the supporter 138 may be substantially higher than a top surface of a word line 242, e.g., an uppermost word line 242, and may be substantially lower than a bottom surface of a SSL 244, and the supporter 138 may be disposed through the SSL 244.

The supporter 138 may include a first supporter 136 and a second supporter 137. In example embodiments, the first supporter 136 may surround a sidewall and a bottom surface of the second supporter 137, and the first supporter 136 may directly contact a fourth insulation layer pattern 250 and a first insulation layer pattern 115, and the second supporter 137 may have a volume that may be above a half of a volume of the supporter 138.

In example embodiments, the first supporter 136 and the second supporter 137 may include different materials. For example, the first supporter 136 may include silicon oxide, the second supporter 137 may include silicon nitride, and the first supporter 136 may prevent the supporter 138 from being removed during an etching process for manufacturing the memory device. The second supporter 137 may have a density which may be higher than that of the first supporter 136, and the second supporter 137 may not be deformed during an etching process, and may effectively support the first insulation layer patterns 115.

In example embodiments, the supporter 138 may support the first insulation layer patterns 115, the channels 180 and the pad 190. The supporter 138 may prevent the first insulation layer pattern 115 and the channel 180 from leaning, and misalignment between the bit line contact 280 and channels 180 (or the pad 190) may be prevented.

Figure 10:
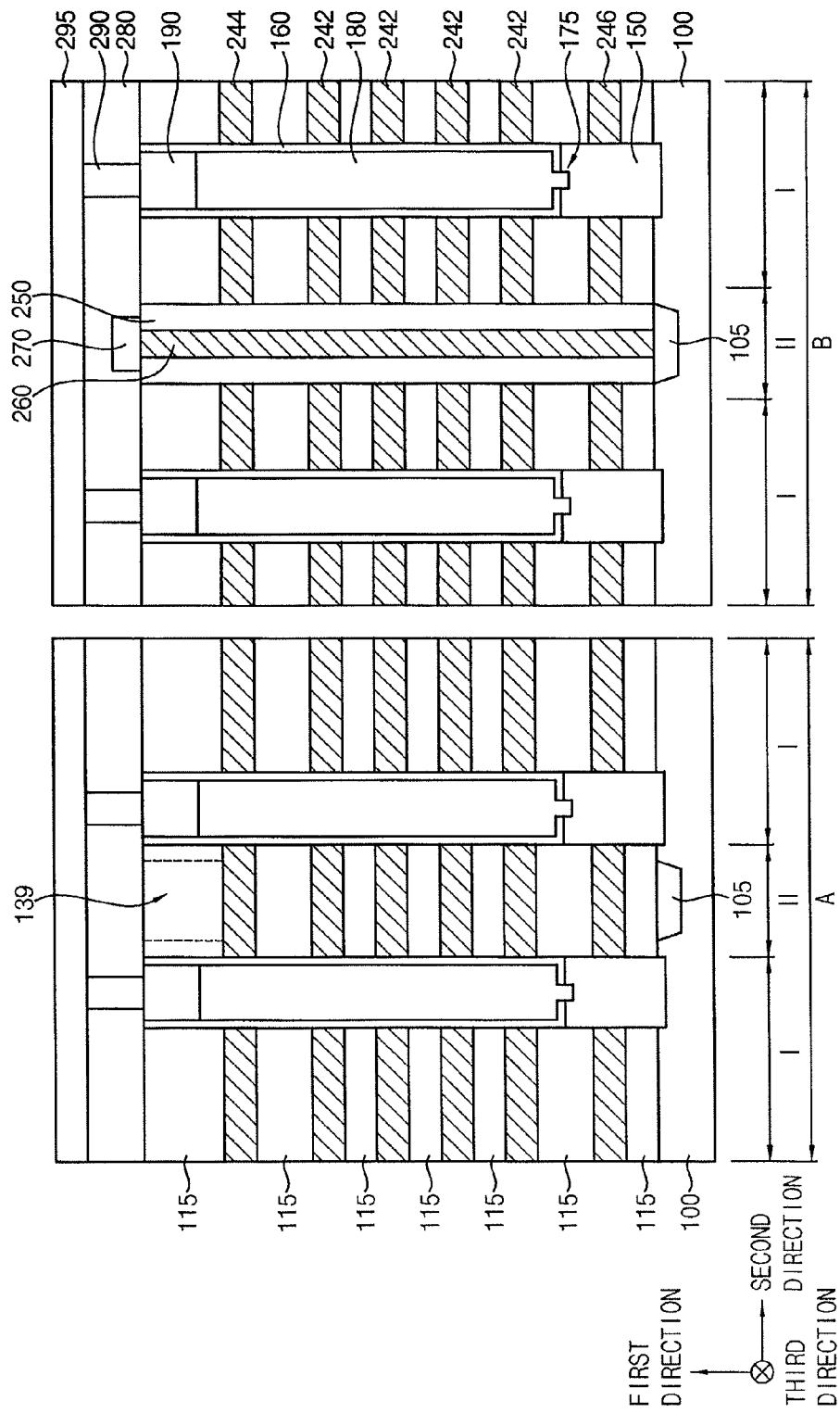

FIGS. 9 and 10 are a horizontal cross-sectional view and a vertical cross-sectional view illustrating a vertical memory device in accordance with example embodiments. The vertical memory device may be substantially the same as or similar to that of FIGS. 1 to 4, except for supporter 139.

Referring to FIGS. 9 and 10, the vertical memory device may include channels 180, each of which may extend in the first direction on the substrate 100, the charge storage structure 160 stacked on an outer sidewall of each channel 180, and the gate electrodes 242, 244, and 246 disposed on an outer sidewall of the charge storage structure 160. The vertical memory device may further include the bit line contact 290 and the bit lines 295 electrically connected to the channel 180. For example, the vertical memory device may include first insulation layer patterns 115 disposed between the gate electrodes 242, 244, and 246 at each level and a supporter 139 for supporting the first insulation layer patterns 115.

The supporter 139 may be disposed between fourth insulation layer patterns 250 in a second region II. In example embodiments, the supporter 139 may have a width in a second direction that may be substantially the same as a width of the second region II. The supporter 139 may have a length in a third direction that may be substantially the same as or larger than the width of the second region II, and the supporter 139 may have a square shape or a rectangular shape, when viewed in a first direction.

Further, the supporter 139 may be integrally formed with an uppermost first insulation layer pattern 115. The supporter 139 may include a material that may be substantially identical to that of the uppermost first insulation layer pattern 115. Further, a top surface and a bottom surface of the supporter 139 may have the same height as those of the uppermost first insulation layer pattern 115.

In example embodiments, a plurality of supporters 139 and fourth insulation layer patterns 250 may be arranged alternately and repeatedly. The fourth insulation layer patterns 250 and the supporters 139 do not overlap each other, when viewed in a first direction.

Further, portions of the first insulation layer patterns 115 and the gate electrodes 242, 244, and 246 under the supporter 139 are not removed during an etching process for performing a word line cut process, and adjacent gate electrodes 242, 244, and 246 at each level may be connected to each other in a second direction.

In example embodiments, the supporter 139 may support the first insulation layer patterns 115, the channels 180, and the pad 190. The supporter 139 may prevent the first insulation layer pattern 115 and the channel 180 from leaning, and misalignment between the bit line contact 280 and channels 180 (or the pad 190) may be prevented.

FIGS. 11 to 31 are horizontal cross-sectional views and vertical cross-sectional views illustrating a method of manufacturing a vertical memory device in accordance with example embodiments. FIGS. 11, 13, 16, 18, 20, 22, 25, 27 and 29 are horizontal cross-sectional views illustrating methods of manufacturing the vertical memory device, and FIGS. 12, 14, 15, 17, 19, 21, 23, 24, 26, 28, 30 and 31 includes a vertical cross-sectional view (A) cut along the line IV-IV' of the horizontal cross-sectional view and a vertical cross-sectional view (B) cut along the line V-V' of the horizontal cross-sectional view, respectively. The figures show exemplary methods of manufacturing the vertical memory device of FIGS. 1 to 4.

Figure 12:
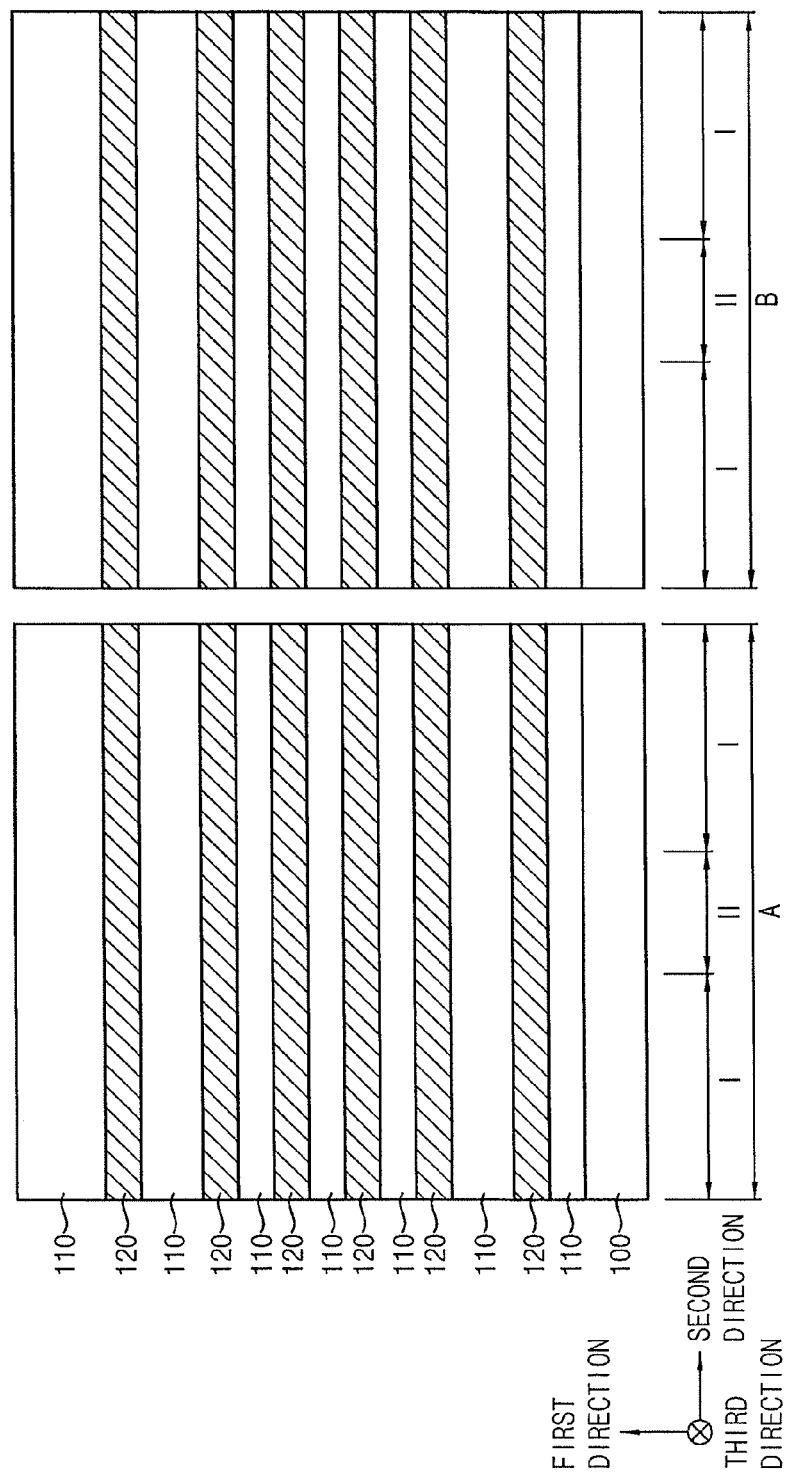

Referring to FIGS. 11 and 12, a first insulation layer 110 and a first sacrificial layer 120 may be alternately and repeatedly formed on the substrate 100. A plurality of first insulation layers 110 and a plurality of first sacrificial layers 120 may be alternately formed on each other at a plurality of levels, respectively.

The substrate 100 may include a semiconductor material, for example, silicon and/or germanium. The substrate 100 may be divided into a first region I and a second region II in accordance with positions. In example embodiments, the first region I may be a cell region in which vertical memory elements including the channels 180 (refer to FIGS. 18 and 19) and the gate electrodes 242, 244, and 246 (Refer to FIG. 28) may be formed, and the second region II may be a word line cut region in which a fourth insulation layer pattern 250 (refer to FIGS. 25 and 26) may be disposed to insulate the gate electrodes 242, 244, and 246. A plurality of first regions I and a plurality of second regions II may be disposed alternately in the second direction, and each of the first regions I and the second regions II may extend in the third direction.

In example embodiments, the first insulation layer 110 and the first sacrificial layer 120 may be formed by, for example, a chemical vapor deposition (CVD) process, a plasma enhanced chemical vapor deposition (PECVD) process and/or an atomic layer deposition process (ALD) process. A lowermost first insulation layer 110, which may be formed directly on a top surface of the substrate 100, may be formed by, for example, a thermal oxidation process. In example embodiments, the first insulation layer 110 may be formed to include a silicon oxide, and the first sacrificial layers 120 may be formed to include, for example, a material with etch selectivity to the first insulation layer 110 (e.g., silicon nitride).

Figure 28:
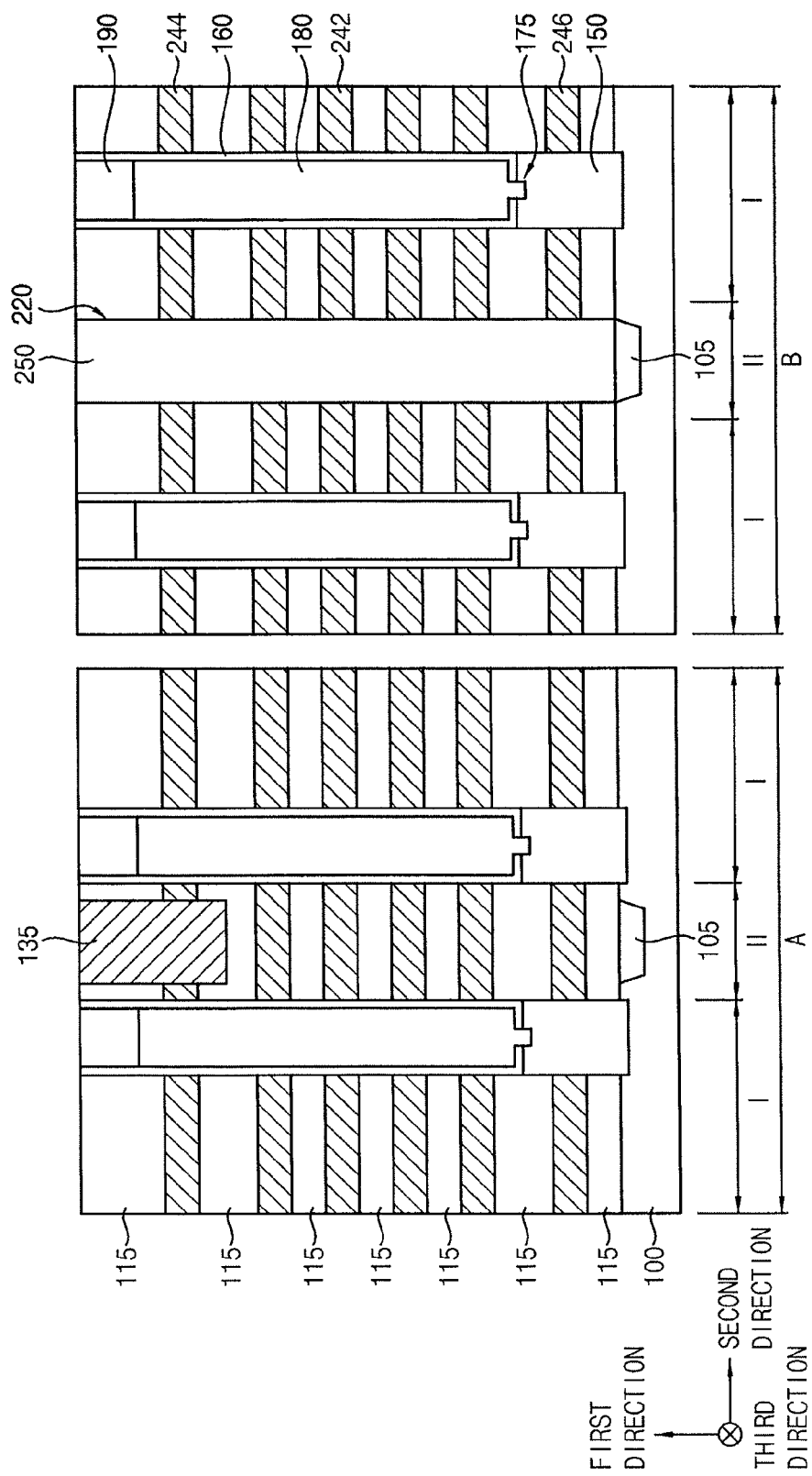

The number of the first insulation layers 110 and the number of the first sacrificial layers 120 stacked on the substrate 100 may vary according to the desired number of a GSL 246, a word line 242, and a SSL 244 (refer to FIG. 28). According to example embodiments, each of the GSL 246 and the SSL 244 may be formed at a single level, and the word line 242 may be formed at 4 levels. The first sacrificial layer 120 may be formed at 6 levels, and the first insulation layer 110 may be formed at 7 levels. According to example embodiments, each of the GSL 246 and the SSL 244 may be formed at, for example, two levels, and the word line 242 may be formed at, for example, 2, 8, 16, 32 or 64 levels. The number of the first insulation layers 110 and the number of the first sacrificial layers 120 may vary.

Figure 13:
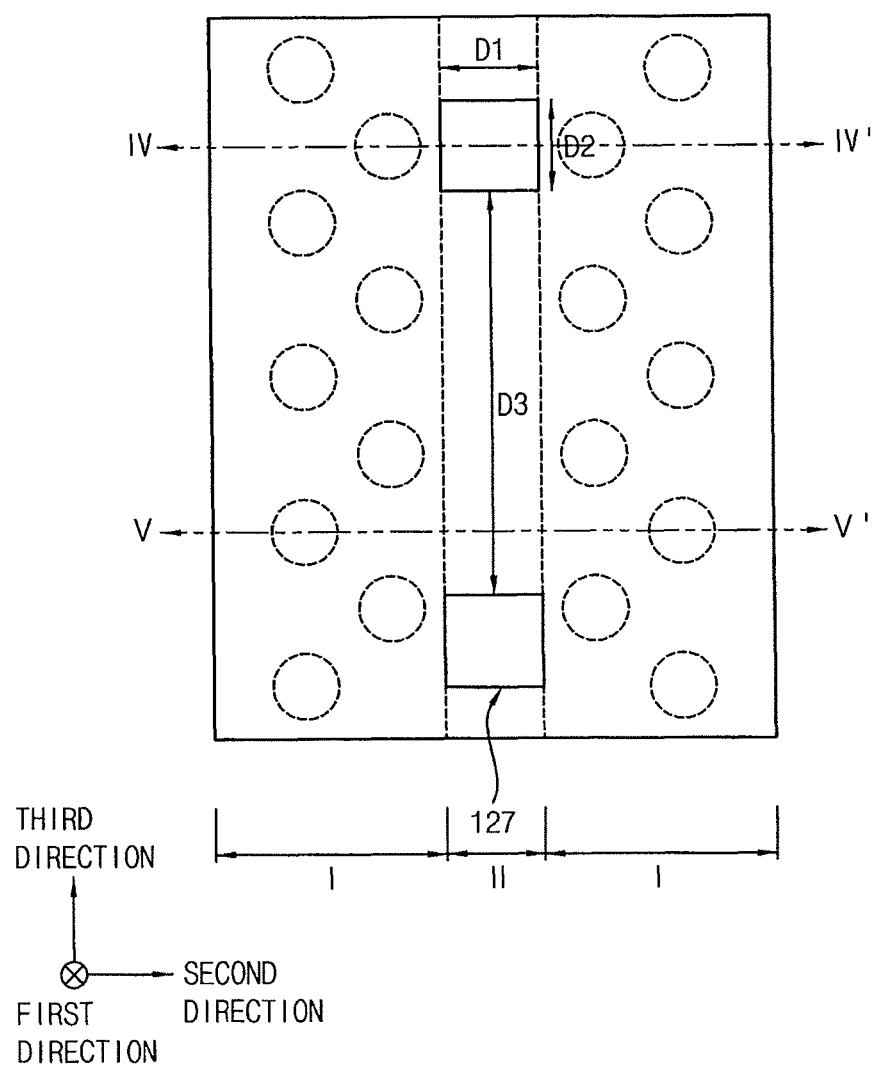
Figure 14:
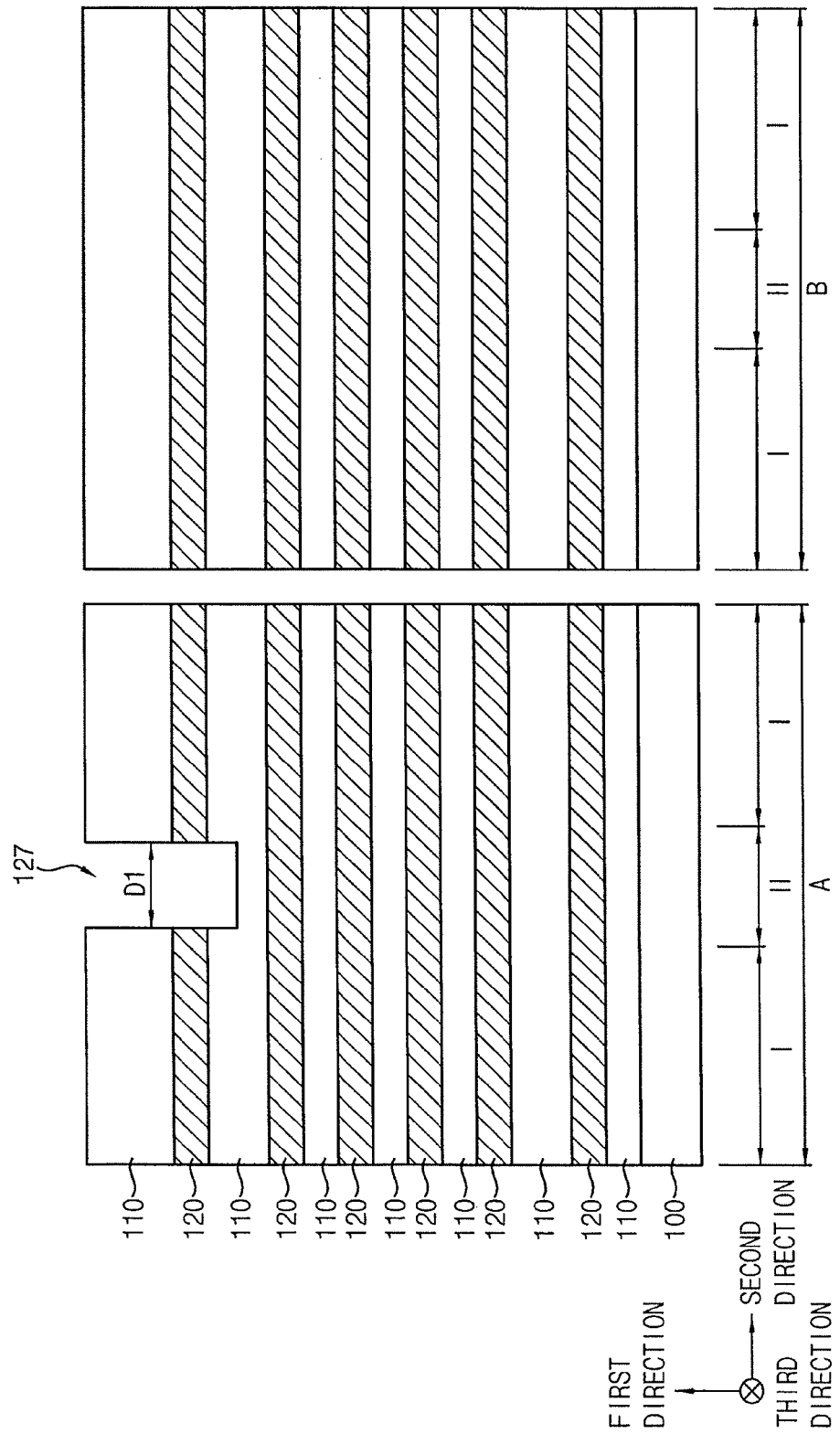

Referring to FIGS. 13 and 14, the first insulation layers 110 and the first sacrificial layers 120 may be partially removed to form a first recess 127.

The first recess 127 may be disposed in the second region II on the substrate 100. In example embodiments, the first recess may have a square shape or a rectangular shape, when viewed in the first direction. A width of the first recess 127 in the second direction may be a first distance D1, and a length of the first recess 127 in the third direction may be a second distance D2. The first distance D1 of the first recess 127 may be substantially the same as a width of the second region II on the second direction.

For example, the first recess 127 may have a square shape, when the first distance D1 is identical to the second distance D2. In an embodiment, the first recess 127 may have a rectangular shape, when the second distance D2 is larger than the first distance D1.

In example embodiments, a plurality of first recesses 127 may be arranged in the third direction. A distance between adjacent first recesses 127 may be defined as a third distance D3. The third distance D3 may be, for example, substantially four times larger than the first distance D1 as illustrated in FIG. 13. For example, the third distance D3 may be substantially 10 times to 200 times larger than the first distance D1.

In example embodiments, the first recess 127 may be formed through the first sacrificial layer 120, in which the SSL 244 (Refer to FIG. 28) may be formed subsequently. However, the first recess 127 does not penetrate the first sacrificial layer 120, in which the word lines 242 (Refer to FIG. 28) may be formed subsequently. A bottom surface of the first recess 127 may be substantially lower than a bottom surface of the SSL 244 (Refer to FIG. 28) that may be formed subsequently. The bottom surface of the first recess 127 may be substantially higher than a top surface of the word line 242 (Refer to FIG. 28) that may be formed subsequently.

Figure 15:
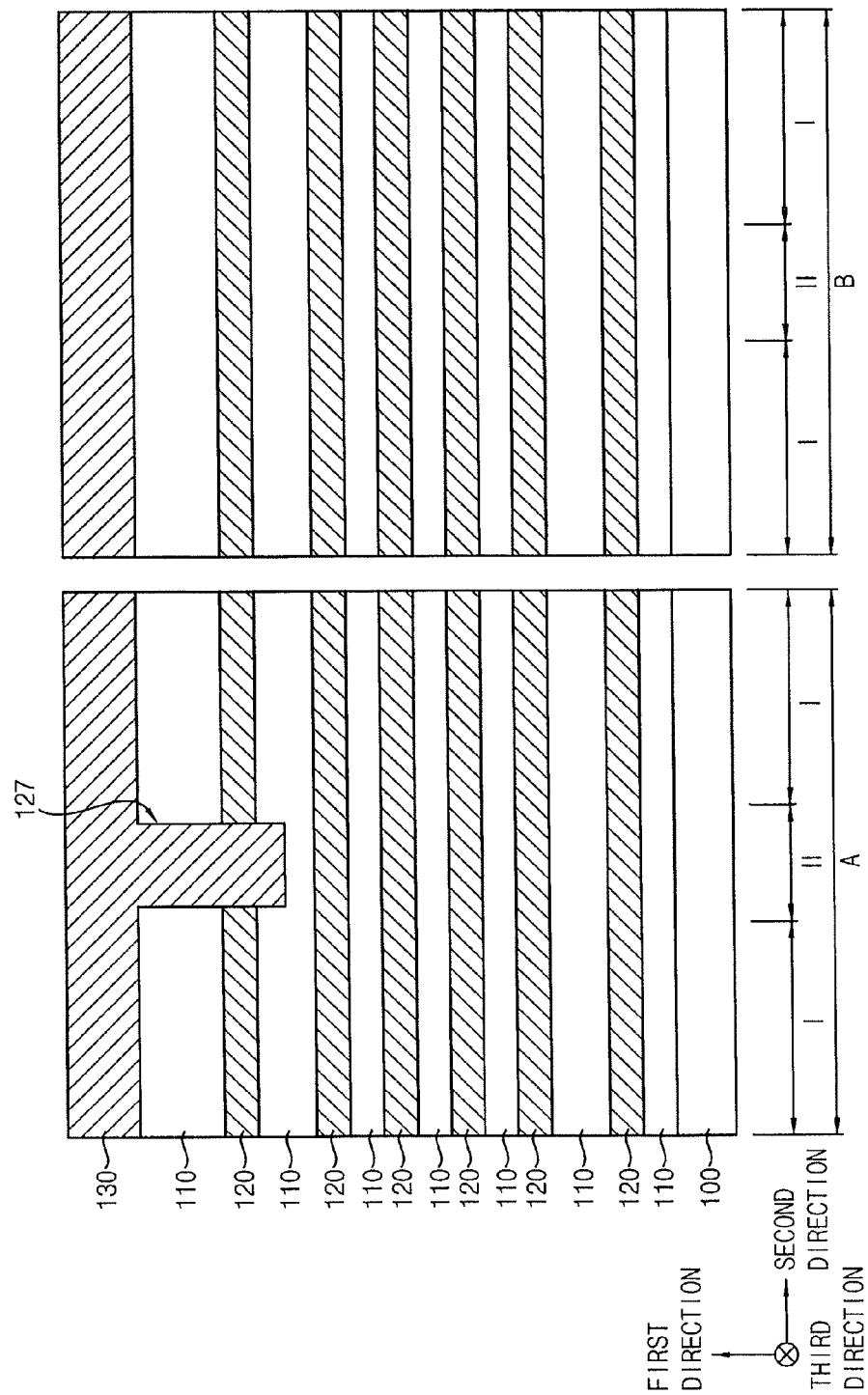

Referring to FIG. 15, a second insulation layer 130 may be formed on the uppermost first insulation layer 110 to fill the first recess 127.

The second insulation layer 130 may be formed using a material having an etching selectivity with respect to the first sacrificial layers 120. When the first sacrificial layers 120 includes silicon nitride, the second insulation layer 130 may be formed by a CVD process, a PECVD process, an ALD process, etc. using a silicon oxide or polysilicon.

Figure 17:
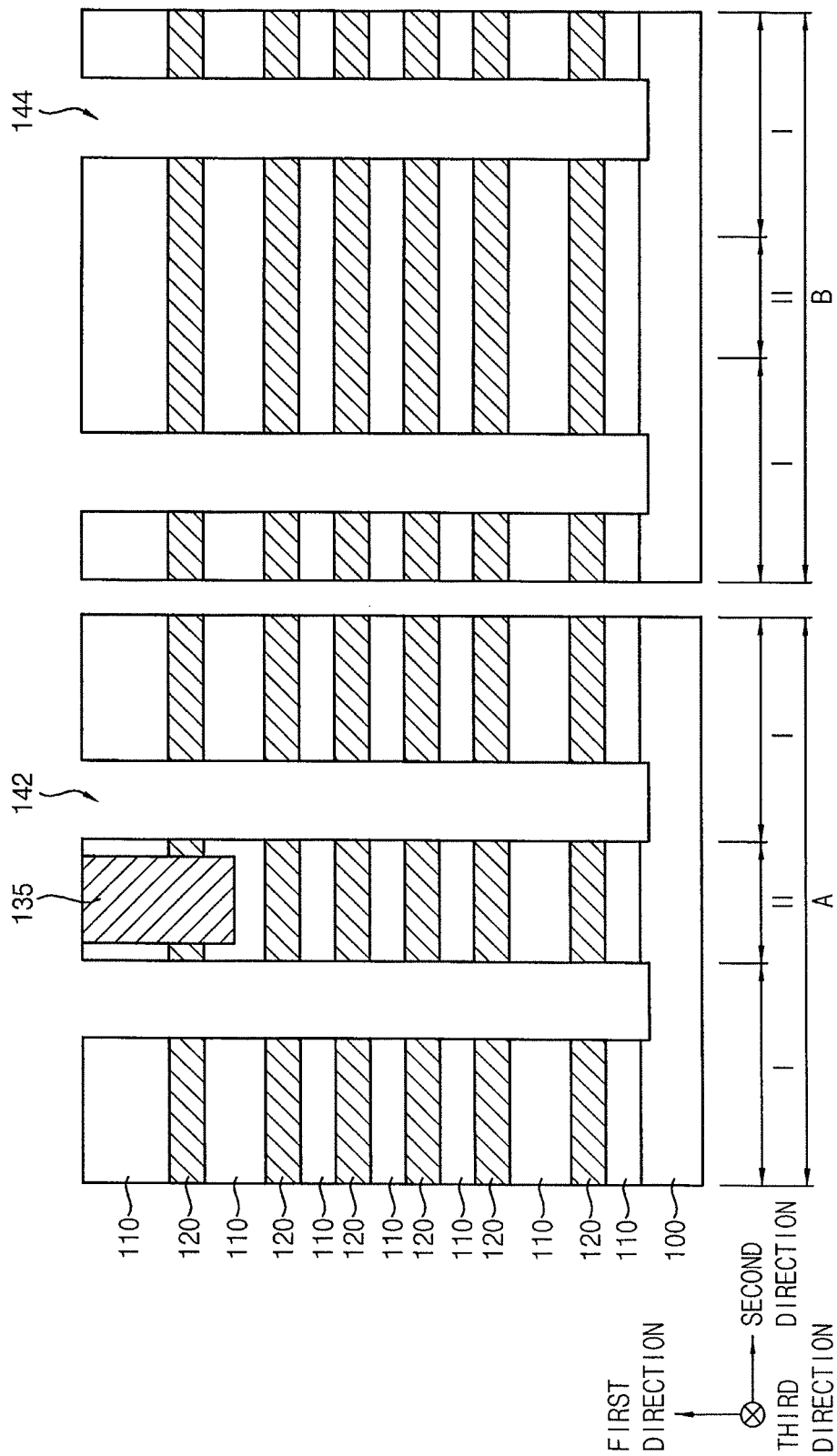

Referring to FIGS. 16 and 17, an upper portion of the second insulation layer 130 may be removed to form a supporter 135, and a plurality of holes 142 and 144 may be formed through the first insulation layers 110 and the first sacrificial layers 120.

For example, an etch back process or a planarization process may be performed to remove the upper portion of the second insulation layer 130, and the supporter 135 filling the first recess 127 may be formed. The supporter 135 may have a shape that may correspond to the first recess 127.

A width of the supporter 135 in the second direction may be a first distance D1, and a length of the supporter 135 in the third direction may be a second distance D2. Further, a plurality of supporters 135 may be arranged in the third direction. A distance between the adjacent supporters 135 may be the same as the third distance D3.

Then, after forming a hard mask on the uppermost first insulation layer 110, the first insulation layers 110 and the first sacrificial layers 120 may be dry etched using the hard mask as an etch mask to form the holes 142 and 144. Bottom surfaces of the holes 142 and 144 may be substantially the same as or lower than the top surface of the substrate 100.

When viewed in the first direction, each of the holes 142 and 144 may have a circular shape or an elliptical shape, and a diameter of each of the holes 142 and 144 may be a fourth distance D4. In example embodiments, the fourth distance D4 may be smaller than the first distance D1 or the second distance D2.

In example embodiments, the plurality of holes 142 and 144 may be arranged in the second direction and the third direction. For example, the plurality of holes 142 and 144 may be arranged in a zigzag pattern with respect to the third direction, and a hole array 140 may be formed. The hole array 140 may include a plurality of hole columns which may be arranged in the second direction. Each of the hole columns may include the plurality of holes 142 or 144 arranged in the second direction. In example embodiments, the hole array may include, for example, two hole columns as illustrated in FIG. 16. For example, the hole array may include one hole columns to five hole columns.

Figure 19:
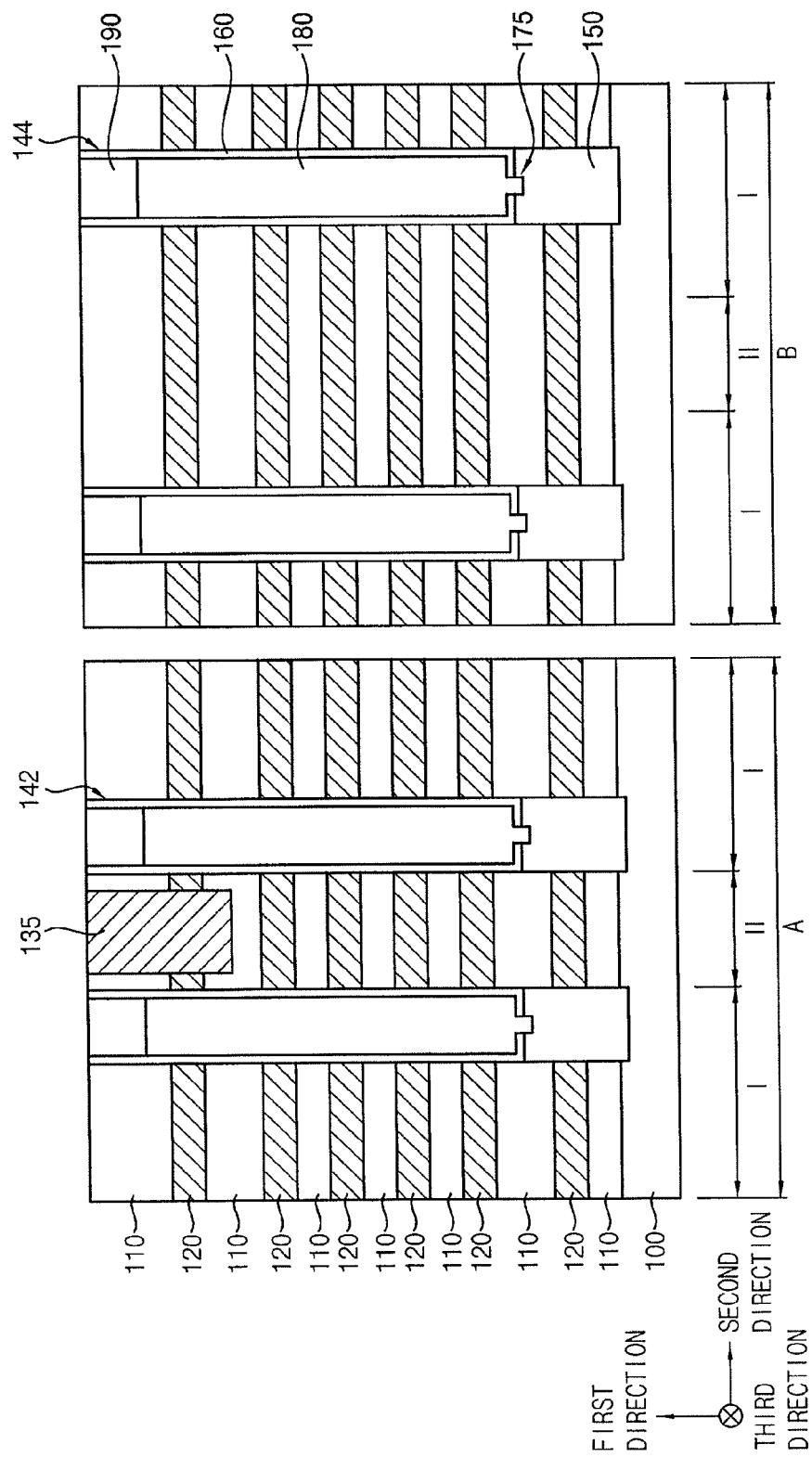

Referring to FIGS. 18 and 19, a semiconductor pattern 150 may be formed to partially fill each holes 142 and 144, a charge storage structure 160 may be formed on an inner wall of each holes 142 and 144. Then, channels 180 and pads 190 may be formed to fill the holes 142 and 144.

For example, a selective epitaxial growth (SEG) process may be performed using the exposed top surface of the substrate 100 as a seed to form the semiconductor pattern 150, the semiconductor pattern 150 may be formed to include single crystalline silicon or single crystalline germanium according to the material of the substrate 100, and in some cases, impurities may be doped thereinto. In an embodiment, an amorphous silicon layer may be formed to fill the holes 142 and 144, and a laser epitaxial growth (LEG) process or a solid phase epitaxial (SPE) process may be performed on the amorphous silicon layer to form the semiconductor pattern 150. In example embodiments, the semiconductor pattern 150 may be formed to have a top surface higher than that of the first sacrificial layer 120, in which the GSL 246 (Refer to FIG. 28) may be formed subsequently.

Then, a first blocking layer, a charge storage layer and a tunnel insulation layer may be sequentially stacked on inner walls of the holes 142 and 144, a top surface of the semiconductor pattern 150 and a top surface of the uppermost first insulation layer 110. In example embodiments, the tunnel insulation layer may be formed using an oxide, e.g., silicon oxide, the charge storage layer may be formed using a nitride, e.g., silicon nitride, and the first blocking layer may be formed using an oxide, e.g., silicon oxide.

Further, the first blocking layer, the charge storage layer and the tunnel insulation layer may be partially removed to form a second recess 175 exposing a top surface of the semiconductor pattern 150, a channel layer may be formed to fill the second recess 175 and the holes 142 and 144, and then upper portions of the first blocking layer, the charge storage layer, the tunnel insulation layer and the channel on the uppermost first insulation layer 110 may be removed to form the charge storage structure 160 and the channels 180.

In example embodiment, a plurality of channels 180 may constitute a channel array. The channel array may include the plurality of channels 180 that may be arranged in the second direction and the third direction.

Then, an etch back process may be performed to remove an upper portion of the channel 180, a third recess may be formed, and then the pad 190 may be formed to fill the third recess. For example, the pad 190 may be formed using doped or undoped polysilicon or single crystalline silicon.

Figure 20:
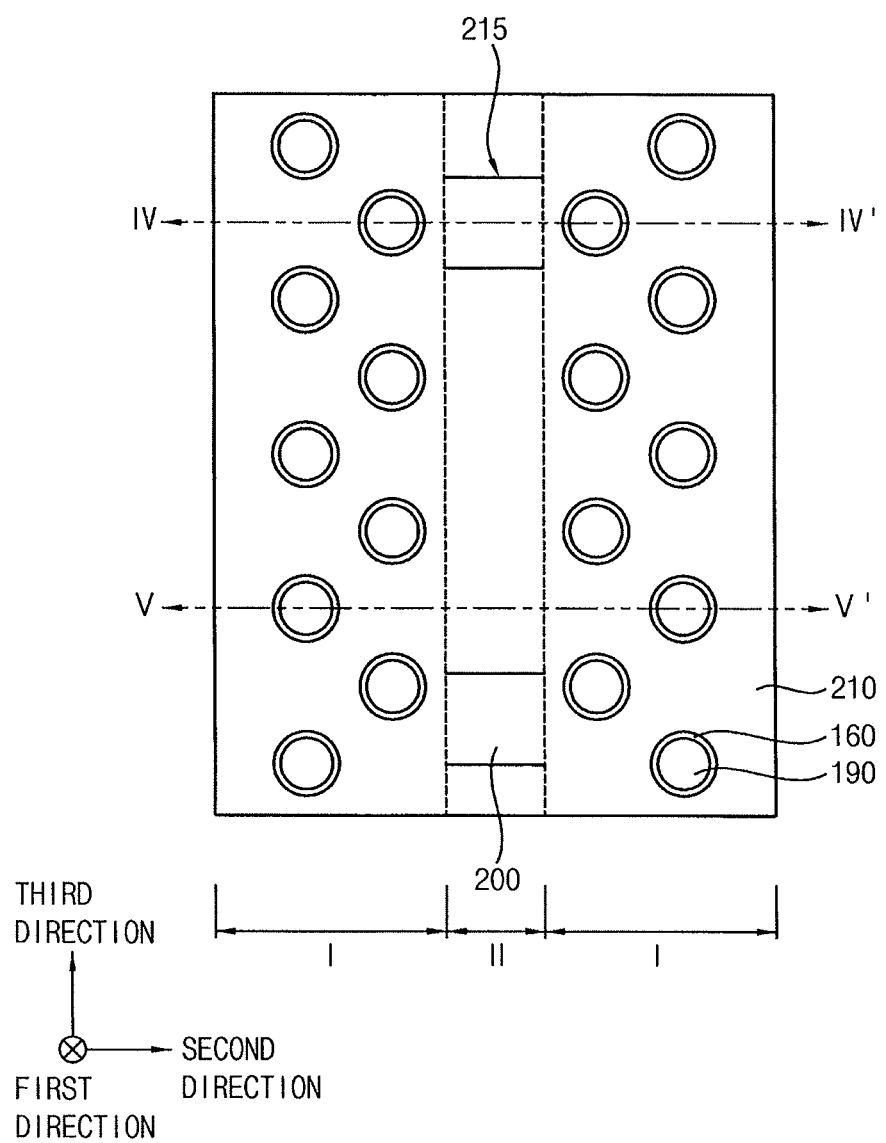
Figure 21:
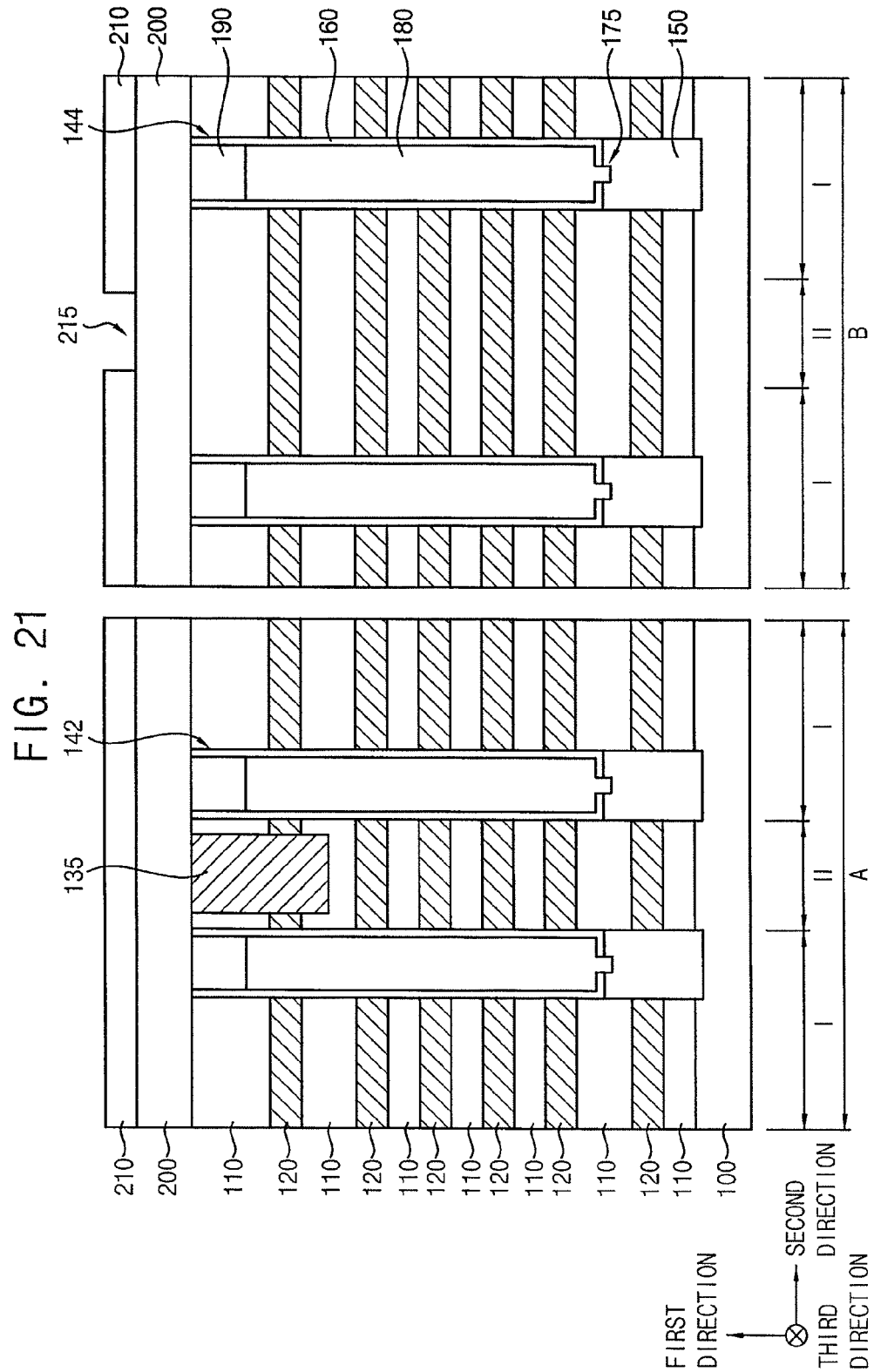

Referring to FIGS. 20 and 21, a third insulation layer 200 may be formed on the uppermost first insulation layer 110, the pads 190 and the supporter 135, and a photoresist pattern 210 may be formed on the third insulation layer 200.

The third insulation layer 200 may be formed by a CVD process, a PECVD process, an ALD process, etc. using a silicon oxide. In example embodiments, the third insulation layer 200 may be substantially thicker than the first insulation layer 110.

Then, a photoresist layer may be formed on the third insulation layer 200, and the photoresist layer may be partially remove to form the photoresist pattern 210 having an opening 215. In example embodiments, the photoresist pattern 210 may sufficiently cover the first region I of the substrate 100, and may cover the supporter 135 in the second region II. The photoresist pattern 210 may have the opening 215 that may expose a portion of the second region II where the supporter 135 may not be disposed.

Figure 23:
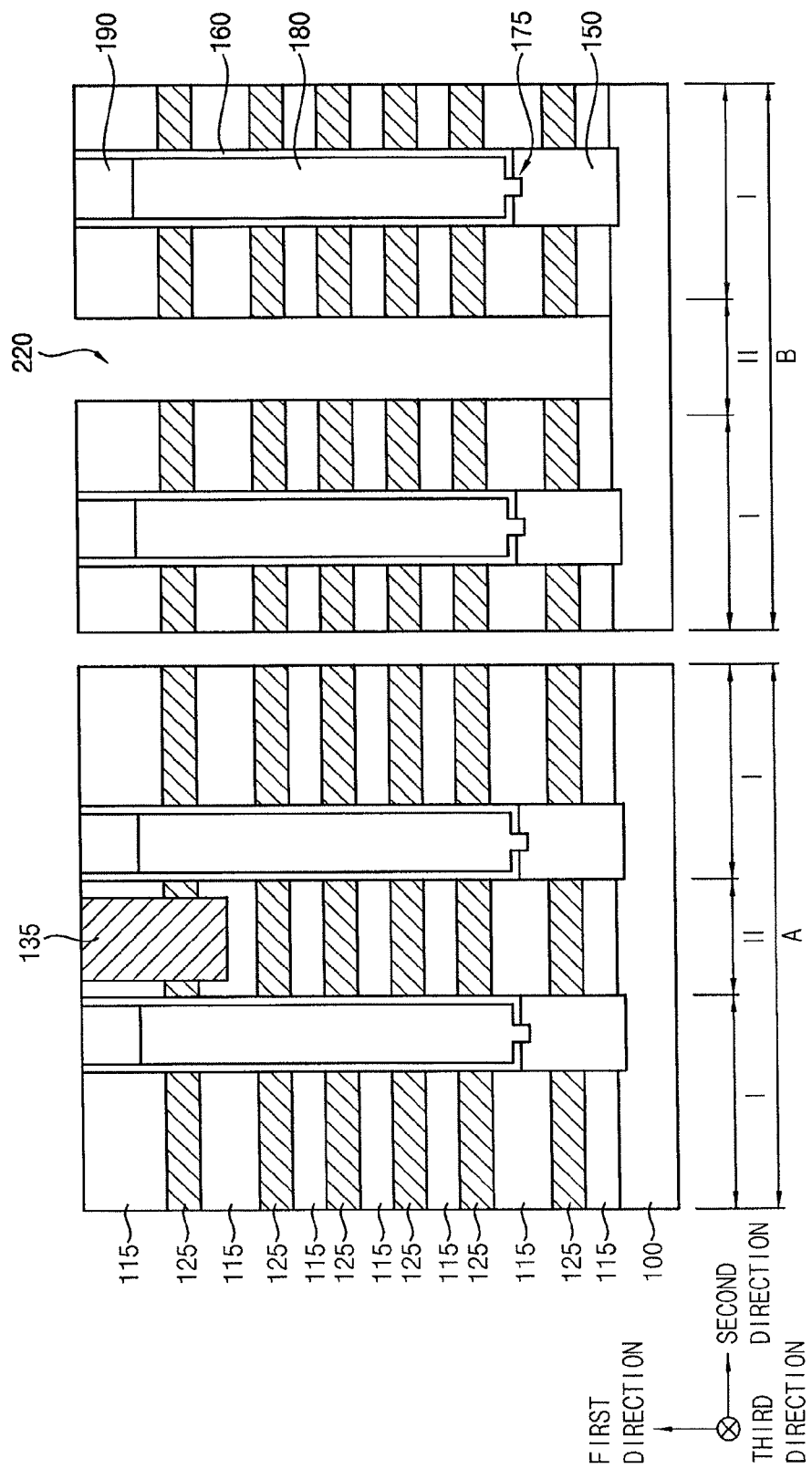

Referring to FIGS. 22 and 23, the first insulation layers 110 and the first sacrificial layers 120 may be partially removed to form a second opening 220 exposing the top surface of the substrate 100.

For example, the third insulation layer 200 may be partially removed by an etching process using the photoresist pattern 210 as an etching mask, and a third insulation layer pattern may be formed. Then, the first insulation layers 110 and the first sacrificial layers 120 may be partially removed by an etching process using the third insulation layer pattern as an etching mask, and the second opening 220 may be formed.

In example embodiments, the second opening 220 may be disposed in the second region II on the substrate 100, and the second opening 220 does not overlap the supporter 135. The supporters 135 and the second opening 220 may be disposed alternately and repeatedly in the third direction. Further, the second opening 220 may have a rectangular shape, when viewed in the first direction. For example, a width of the second opening 220 in the second direction may be substantially the same as the first distance D1, and a length of the second opening 220 in the third direction may be substantially the same as the third distance D3.

As the second opening 220 is formed, the first insulation layers 110 and the first sacrificial layers 120 may transfer into the first insulation layer patterns 115 and the first sacrificial layer patterns 125, respectively. The first insulation layer patterns 115 and the first sacrificial layer patterns 125 at each level may extend in the third direction, and may be disposed alternately and repeatedly in the first direction.

In example embodiments, the first insulation layer patterns 115 and the first sacrificial layer patterns 125 may be separated by the second opening 220. However, the supporter 135 disposed in the second region II may hold the first insulation layer pattern 115 and the first sacrificial layer patterns 125. The supporter 135 may prevent the first insulation layer pattern 115 and the first sacrificial layer patterns 125 from leaning.

Figure 24:
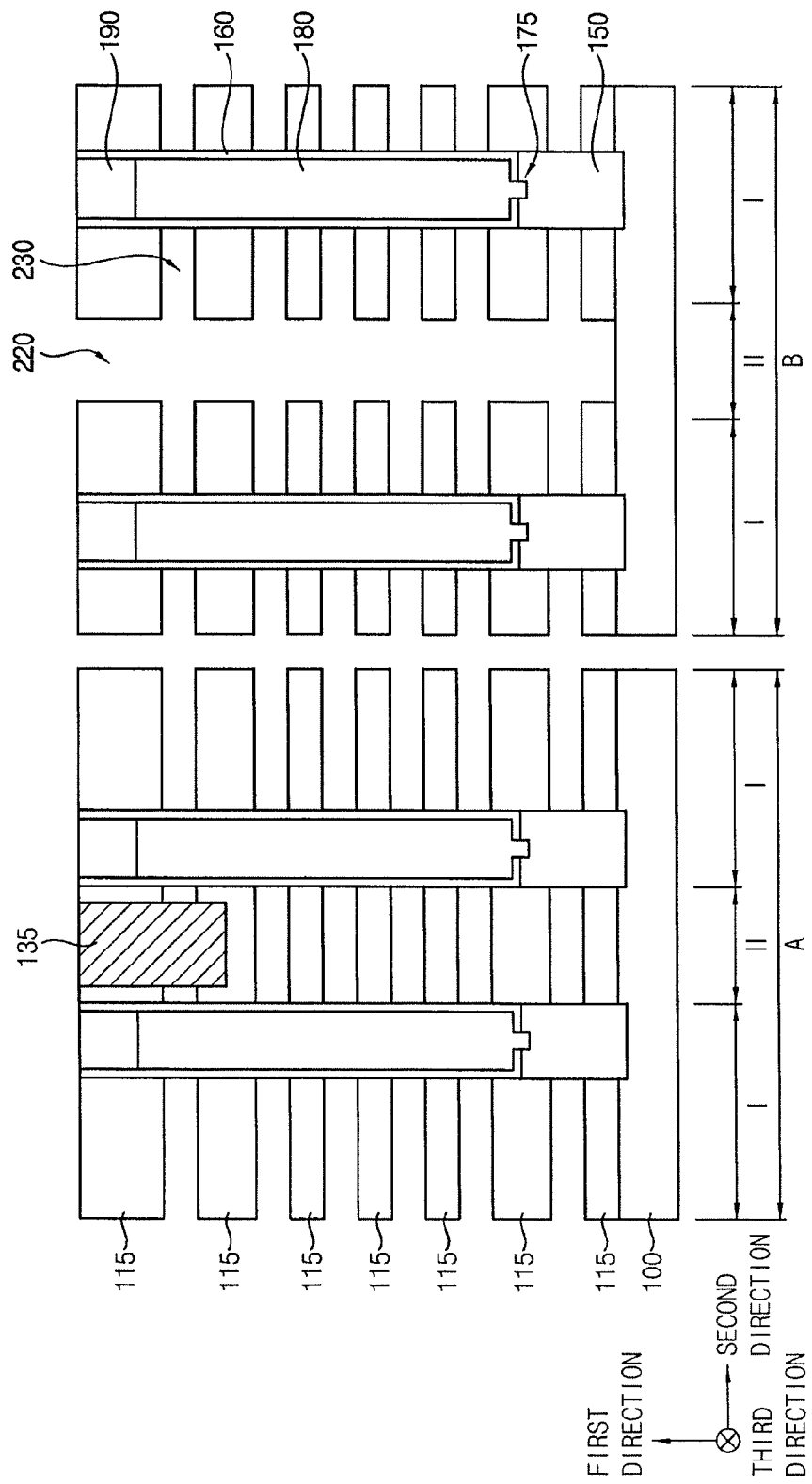

Referring to FIG. 24, the first sacrificial layer patterns 125 exposed by the second opening 220 may be removed to form a gap 230 between the first insulation layers 115 in the first direction.

The first sacrificial layer patterns 125 may be removed by a wet etching process. For example, the first sacrificial layer patterns 125 exposed by the second opening 220 may be removed by an etching process using an etching solution including phosphoric acid or sulfuric acid, and an outer sidewall of the charge storage structure 160 may be partially exposed by the gap 230.

The supporter 135 may include a material that may have an etching selectivity with respect to the first sacrificial layer 120, and the supporter 135 may not be removed by the above etching process. Further, the supporter 135 may prevent the first insulation layer pattern 115 from leaning during the etching process.

Figure 26:
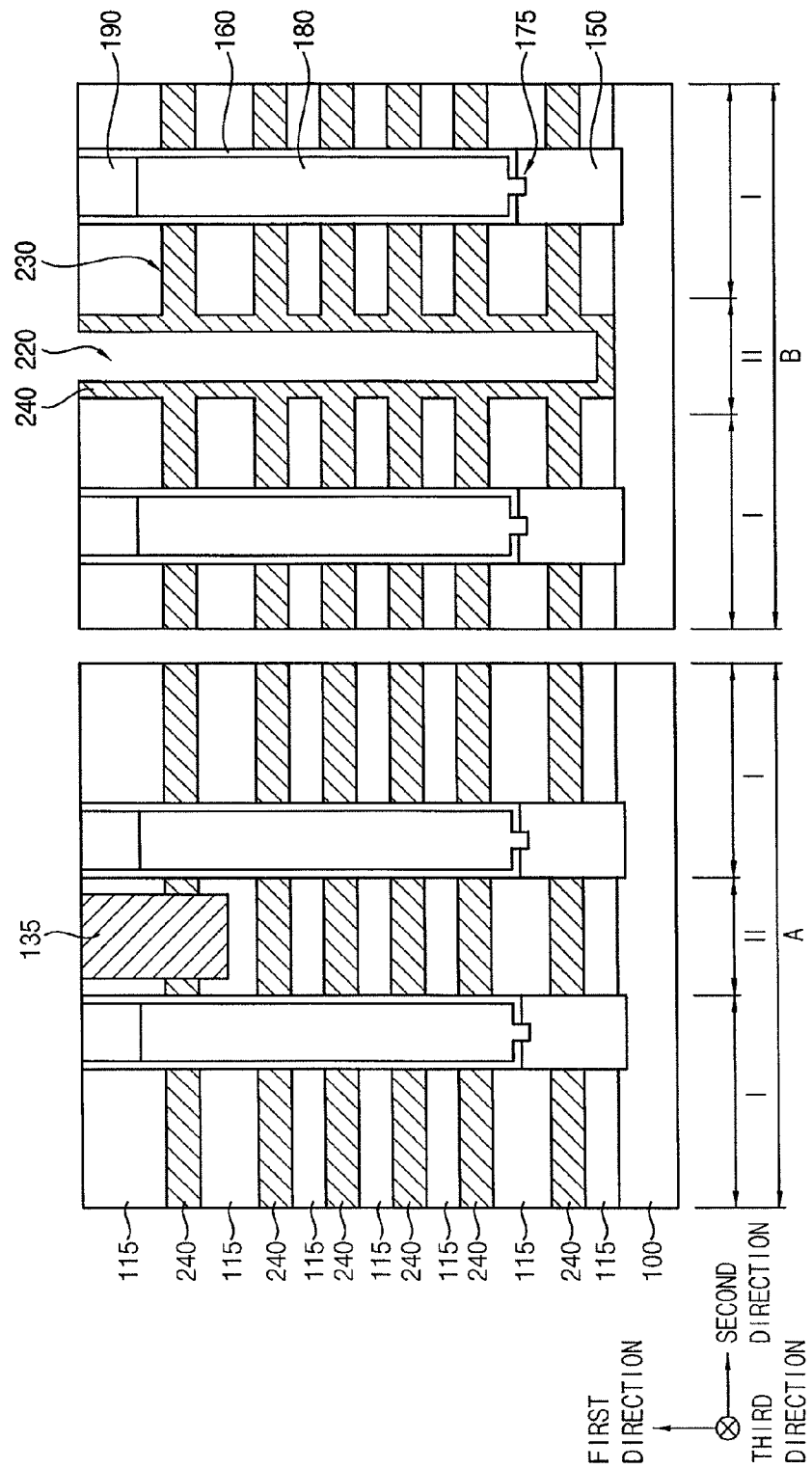

Referring to FIGS. 25 and 26, a gate electrode layer 240 may be formed on an outer sidewall of the charge storage structure 160, an inner wall of the gap 230, a surface of the first insulation layer pattern 115, a top surface of the substrate 100, and a top surface of the pad 190.

In example embodiment, the gate electrode layer 240 may be formed using a metal or a metal nitride. For example, the gate electrode layer 240 may include a metal and/or a metal nitride with low electrical resistance (e.g., tungsten, tungsten nitride, titanium, titanium nitride, tantalum, tantalum nitride and/or platinum). In an example embodiment, the gate electrode layer 240 may be formed by a CVD process or a sequential flow deposition (SFD) process using tungsten.

In example embodiments, a second blocking layer may be formed before forming the gate electrode layer 240.

Figure 27:
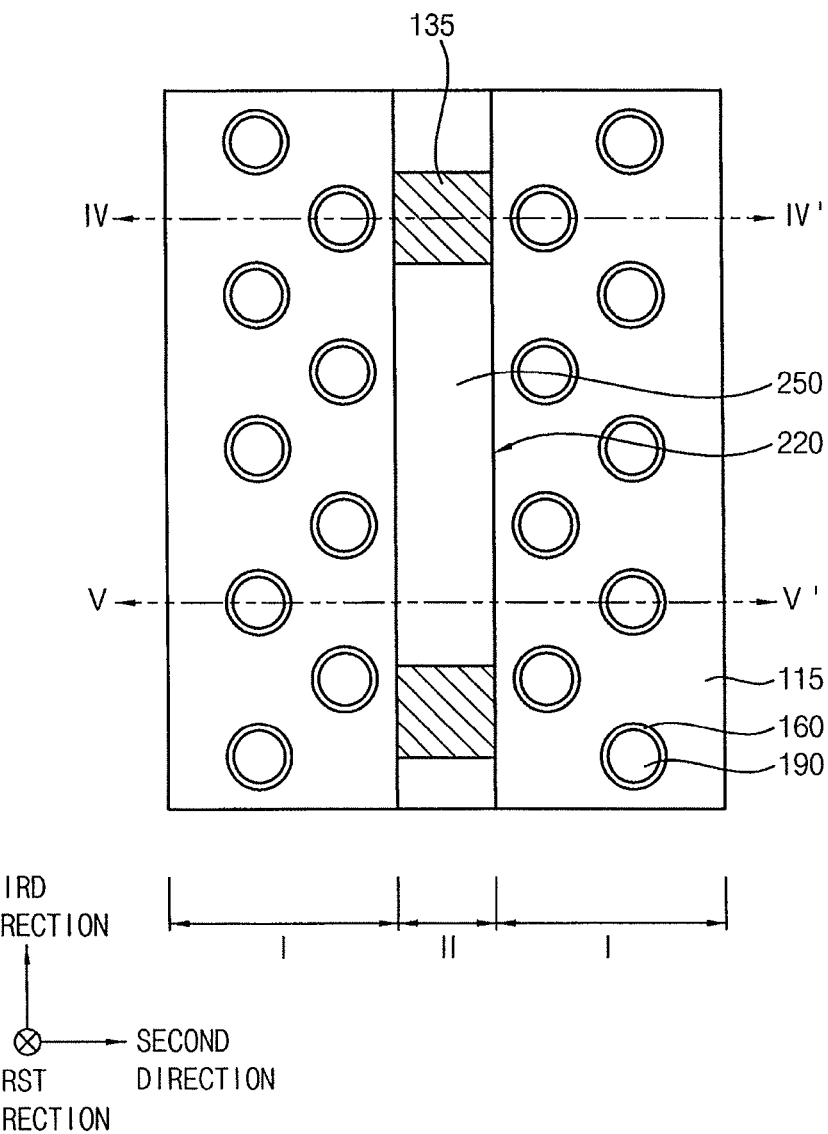

Referring to FIGS. 27 and 28, the gate electrode layer 240 may be partially removed to form the gate electrodes 242, 244, and 246, and a first impurity region 105 may be formed at an upper portion of the substrate 100 Then, a fourth insulation layer pattern 250 may be formed to fill the second opening 220.

The gate electrode layer 240 may be partially removed by an etching process, and the second opening 220 may be formed to expose the top surface of the substrate 100. Remaining portions of the gate electrode layer 240 in the gap 230 may be defined as the gate electrodes 242, 244, and 246, and the gate electrodes 242, 244, and 246 may extend in the third direction.

The plurality of gate electrodes 242, 244, and 246 may include a ground selection line (GSL) 246, a word line 242 and a string selection line (SSL) 244 that are spaced apart from each other along the first direction.

Each of the GSL 246, the word line 242 and the SSL 244 may be at a single level (e.g., one of each, each at a different height) or more than one level, and each of the first insulation layer patterns 115 may be interposed therebetween. In example embodiments, the GSL 246 and the SSL 244 may be at one level (e.g., two of each at different heights), respectively, and the word line 242 may be at 4 levels between the GSL 246 and the SSL 244.

The channel 180, the charge storage structure 160 and the word line 242 may constitute a memory cell.

Then, the first impurity region 105 may be formed by implanting impurities at an upper portion of the substrate 100 exposed by the second opening 220. In example embodiments, the impurities may include n-type impurities, e.g., phosphorus, arsenic, and the like. The impurities may be diffused during the impurity implantation process and/or a heat treatment process, and the first impurity region 105 may extend in the third direction, and the first impurity region 105 may be disposed to overlap the supporter 135. The first impurity region 105 may serve as a common source line (CSL).

Then, the fourth insulation layer pattern 250 may be formed to fill the second opening 220. In example embodiments, a fourth insulation layer may be formed on the substrate 100 and the uppermost first insulation layer pattern 115 to fill the second opening 220, then an upper portion of the fourth insulation layer pattern 250 may be removed to form the fourth insulation layer pattern 250, and a plurality of fourth insulation layer patterns 250 and a plurality of supporters 135 may be arranged alternately and repeatedly.

Figure 30:
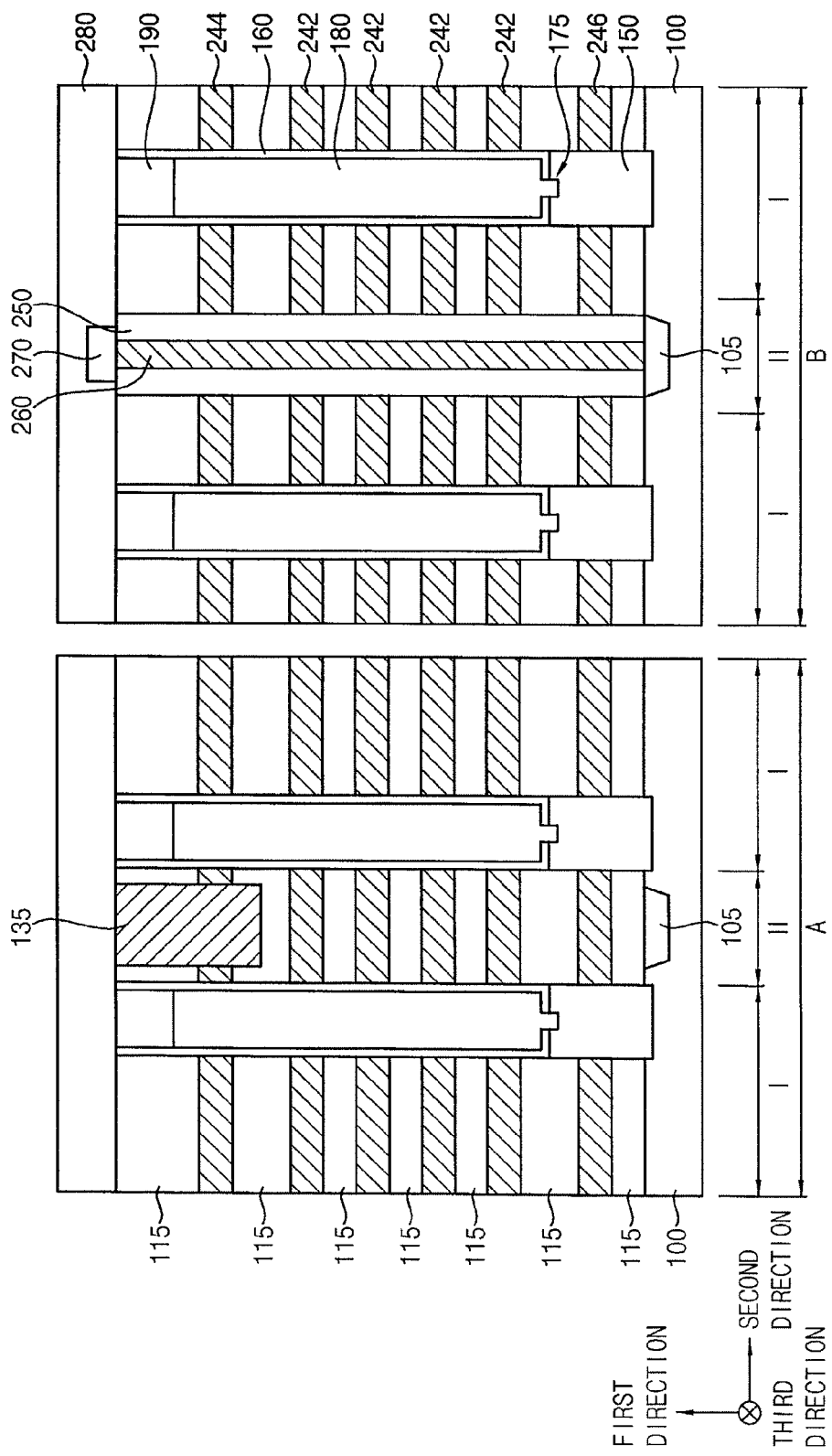

Referring to FIGS. 29 and 30, the contact 260 may be formed through the fourth insulation layer pattern 250, and the wiring 270 and the fifth insulation layer 280 may be formed on the fourth insulation layer pattern 250 and the first insulation layer pattern 115.

The fourth insulation layer 250 may be partially removed to form a contact hole, and then the contact 260 may be formed to fill the contact hole. In example embodiments, the contact 260 may be formed in the second region II on the substrate 100, and may be surrounded by the fourth insulation layer pattern 250. The contact 260 does not overlap the supporter 135, when viewed in the first direction. The contact 260 may serve as a CSL contact that may be electrically connected to the first impurity region 105.

Figure 31:
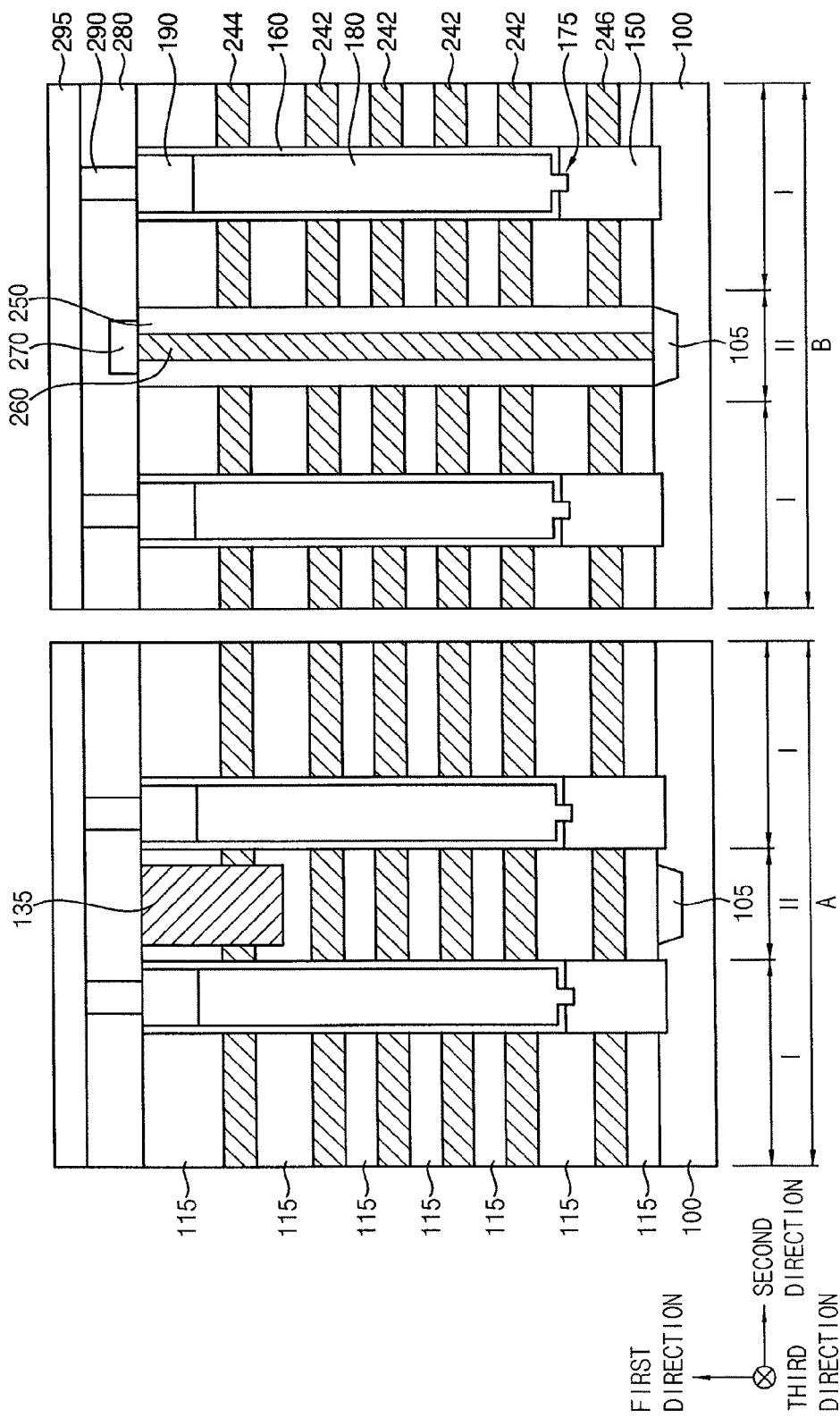

Referring to FIG. 31, a bit line contact 290 may be formed through the fifth insulation layer 280, and a bit line 295 may be formed on the bit line contact 290.

In example embodiments, a plurality of bit line contacts 290 may be arranged in the second direction and the third direction, and a bit line contact array may be formed. Each of the bit line contacts 290 may correspond to each of the pads 190.

Further, a plurality of bit lines 295 may be arranged in the third direction. Each of the bit lines 295 may extend in the second direction.

FIGS. 32 to 36 are horizontal cross-sectional views and vertical cross-sectional views illustrating a method of manufacturing a vertical memory device in accordance with example embodiments. FIGS. 32 and 34 are horizontal cross-sectional views illustrating the method of manufacturing the vertical memory device, and FIGS. 33, 35 and 36 include a vertical cross-sectional view (A) cut along the line IV-IV' of FIGS. 32 and 34 and a vertical cross-sectional view (B) cut along the line V-V' of FIGS. 32 and 34. The method of manufacturing the vertical memory device may be substantially the same as or similar to that of FIGS. 11 to 31, and repetitive explanations thereon may be omitted herein.

Figure 33:
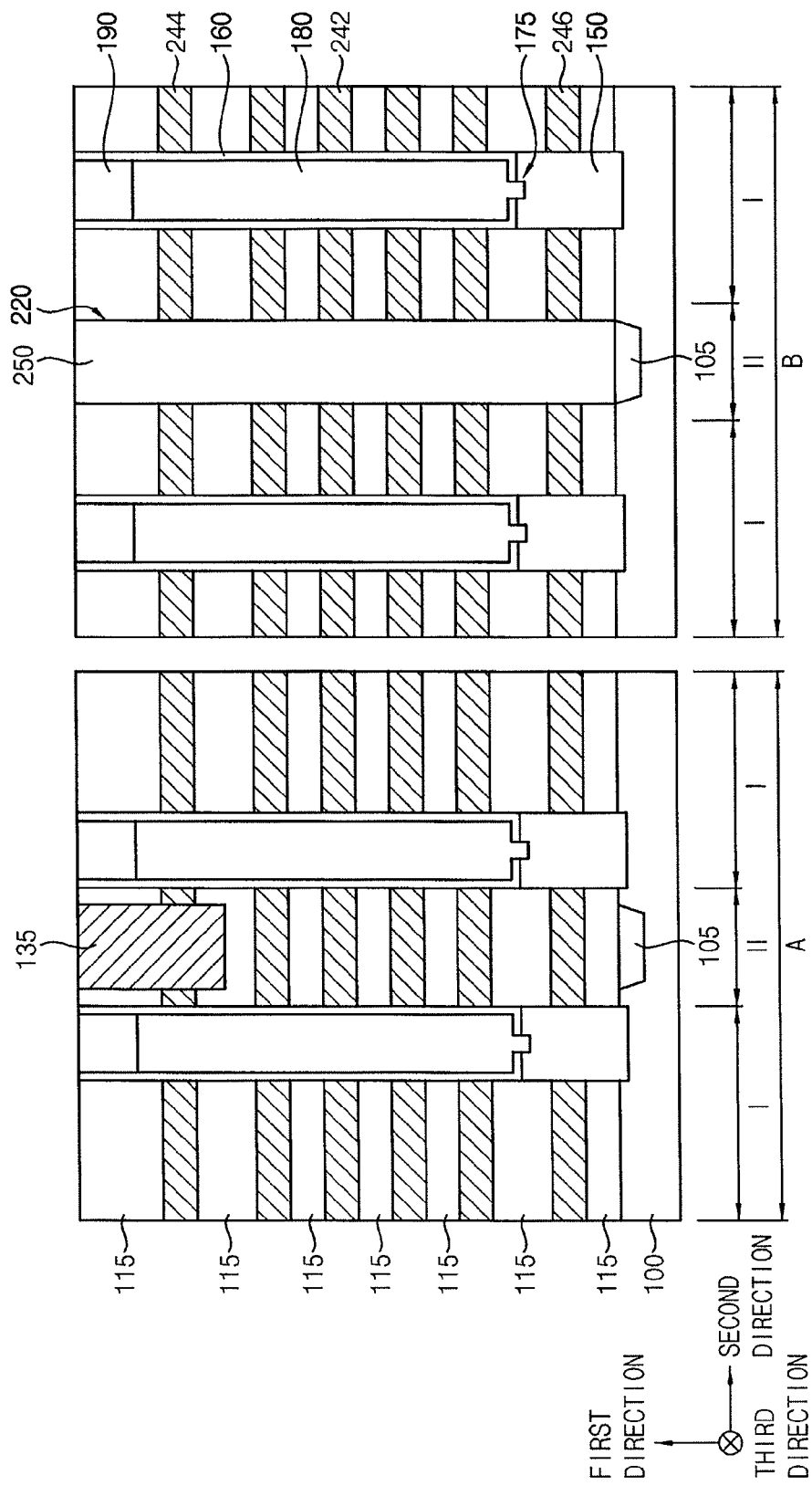

Referring to FIGS. 32 and 33, processes substantially the same as or similar to those illustrated with reference to FIGS. 11 to 28 may be performed.

A plurality of first insulation layers and a plurality of first sacrificial layers may be alternately and repeatedly formed on a substrate 100, the first insulation layers and the first sacrificial layers may be partially removed to form a first recess, and then a supporter 135 may be formed to fill the first recess. A plurality of holes may be formed through the first insulation layers and the first sacrificial layers, and then a semiconductor pattern 150, a charge storage structure 160, a channel 180 and a pad 190 may be formed to fill the hole. The first insulation layers and the first sacrificial layers may be partially removed to form a second opening 220 exposing the top surface of the substrate 100, the first sacrificial layers may be removed to form a gap, and then gate electrodes 242, 244, and 246 may be formed to fill the gap. Then, a first impurity region 105 may be formed at an upper portion of the substrate 100, and a fourth insulation layer pattern 250 may be formed to fill the second opening 220.

Figure 35:
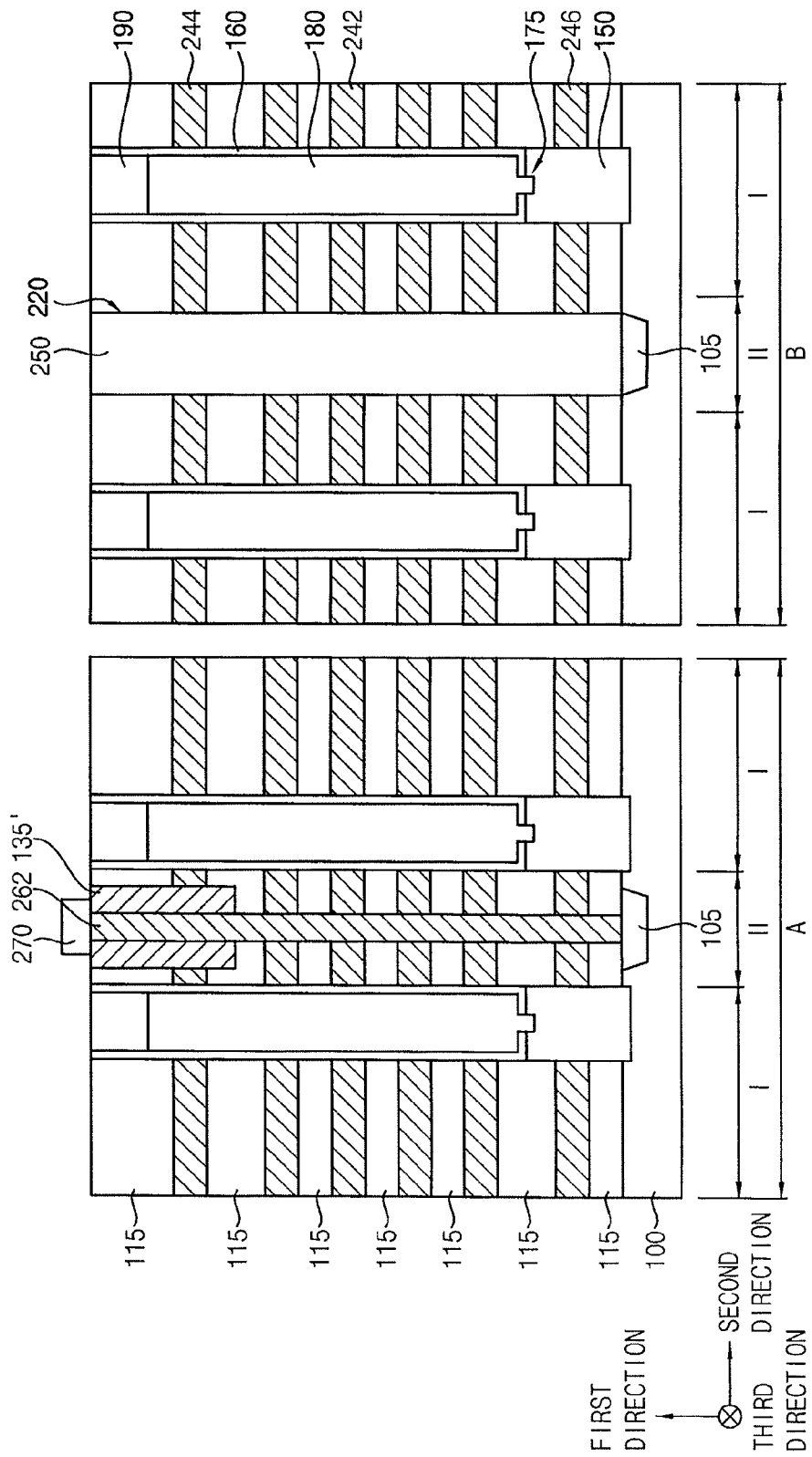

Referring to FIGS. 34 and 35, a contact 262 may be formed through the first insulation layer pattern 115 and the gate electrodes 242 and 246, and a wiring 270 may be formed on the contact 262.

The supporter 135', the first insulation layer pattern 115 and the gate electrodes 242 and 246 may be partially removed to form a contact hole exposing the first impurity region 105, and then the contact 262 may be formed to fill the contact hole. An upper sidewall of the contact 262 may be surrounded by the supporter 135', and a lower sidewall of the contact 262 may be surrounded by gate electrodes 242 and 246 and the first insulation layer patterns 115. In example embodiments, the contact 262 may serve as a CSL contact.

During an etching process and a deposition process for forming the contact 262, some channels 180 disposed adjacent to the contact 262 may be degraded. In example embodiments, those channels 180 disposed adjacent to the contact 262 may be a dummy channel that does not serve as a memory device. Further, other channels 180 disposed adjacent to the supporter 135' also may be a dummy channel that does not serve as a memory device. According to example embodiment, the contact 262 and the supporter 135' may be disposed to overlap each other, the number of the dummy channels disposed adjacent to the contact 262 and the supporter 135' may decrease, and a degree of integration of the vertical memory device may increase.

Figure 36:
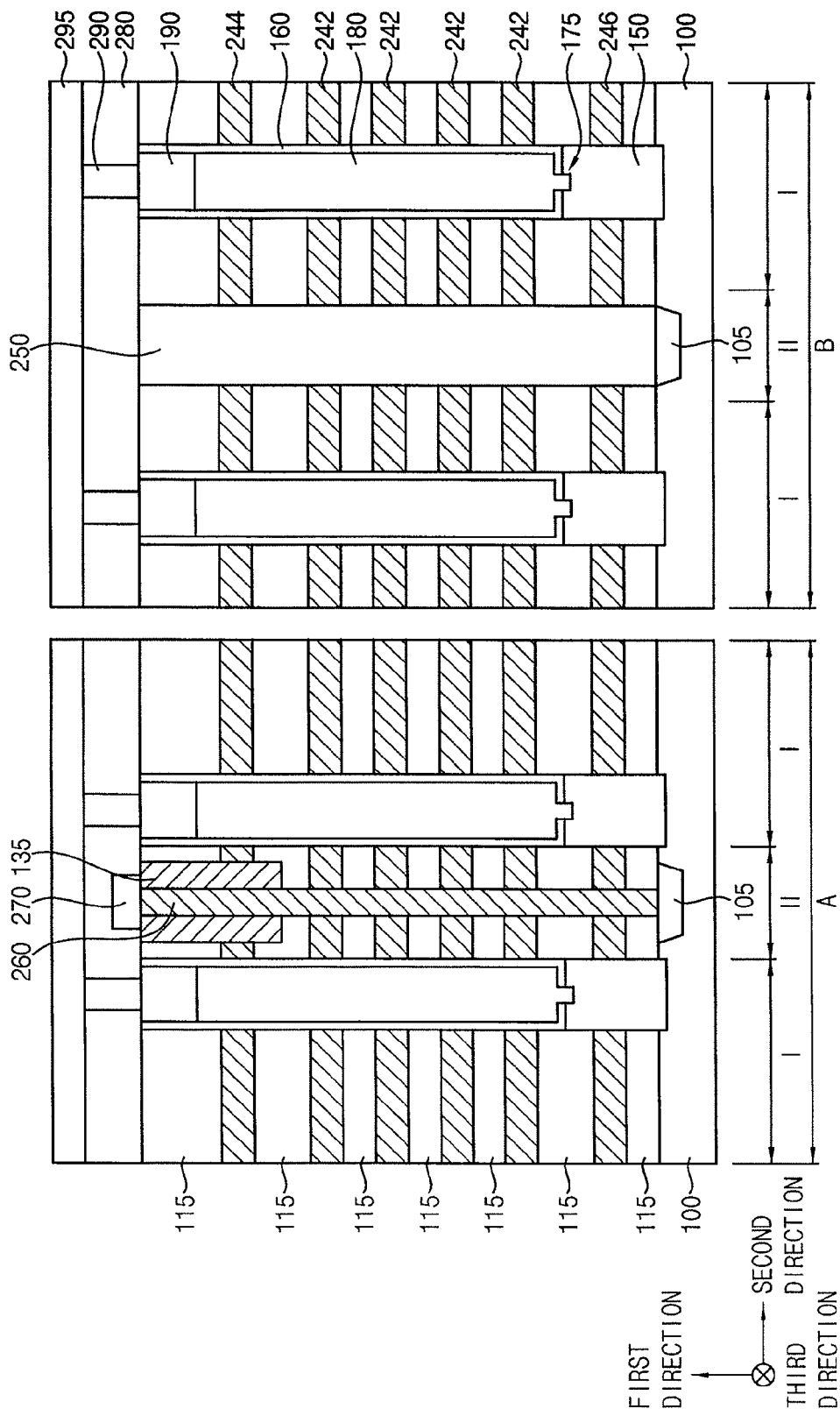

Referring to FIG. 36, a bit line contact 290 may be formed through a fifth insulation layer 280, and a bit line 295 may be formed on the bit line contact 290. Processes for forming the bit line contact 290 and the bit line 295 may be substantially the same as or similar to those illustrated with reference to FIG. 31.

Figure 37:
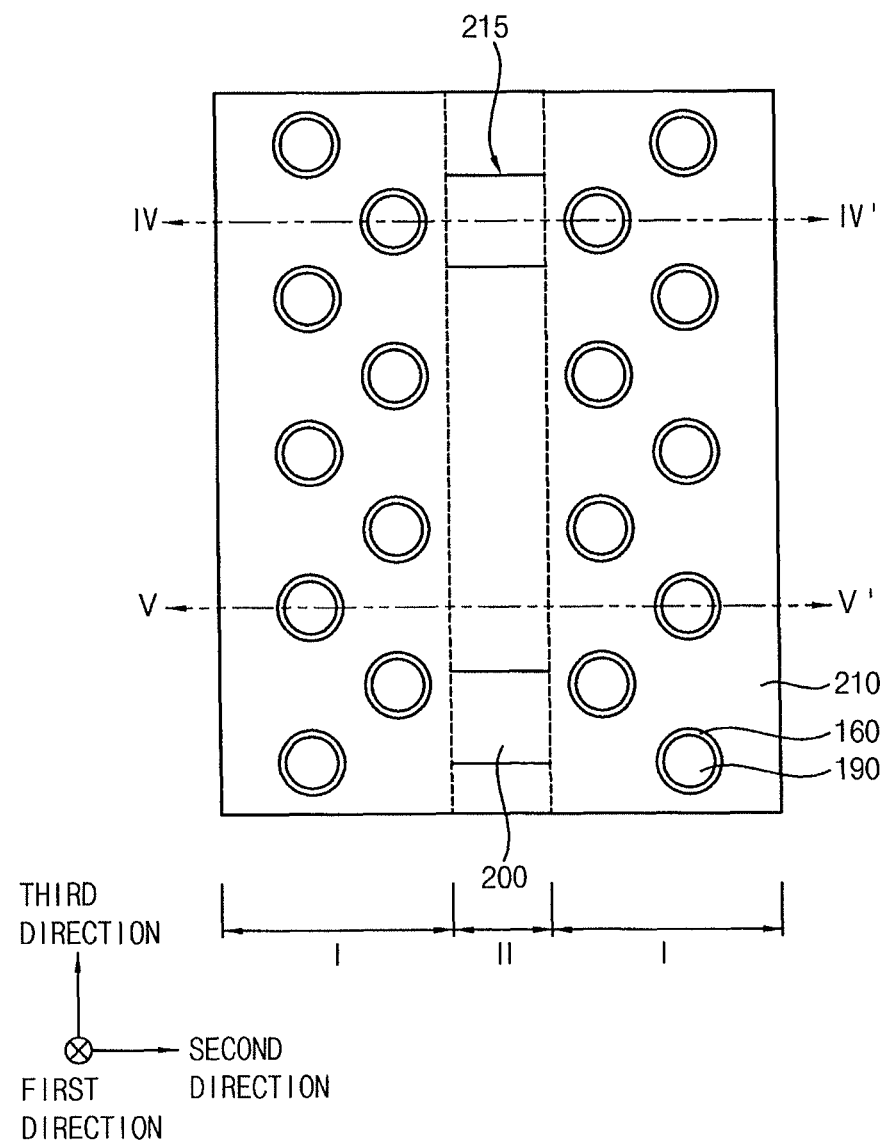
FIGS. 37 to 41 illustrate horizontal cross-sectional views and vertical cross-sectional views of a method of manufacturing a vertical memory device in accordance with example embodiments.

FIGS. 37 to 41 are horizontal cross-sectional views and vertical cross-sectional views illustrating a method of manufacturing a vertical memory device in accordance with example embodiments. FIG. 37 is a horizontal cross-sectional view illustrating the method of manufacturing the vertical memory device, and FIGS. 38 to 41 includes a vertical cross-sectional view (A) cut along the line IV-IV' of FIG. 37 and a vertical cross-sectional view (B) cut along the line V-V' of FIG. 37. The method of manufacturing the vertical memory device may be substantially the same as or similar to that of FIGS. 11 to 31, and repetitive explanations thereon may be omitted herein.

Figure 38:
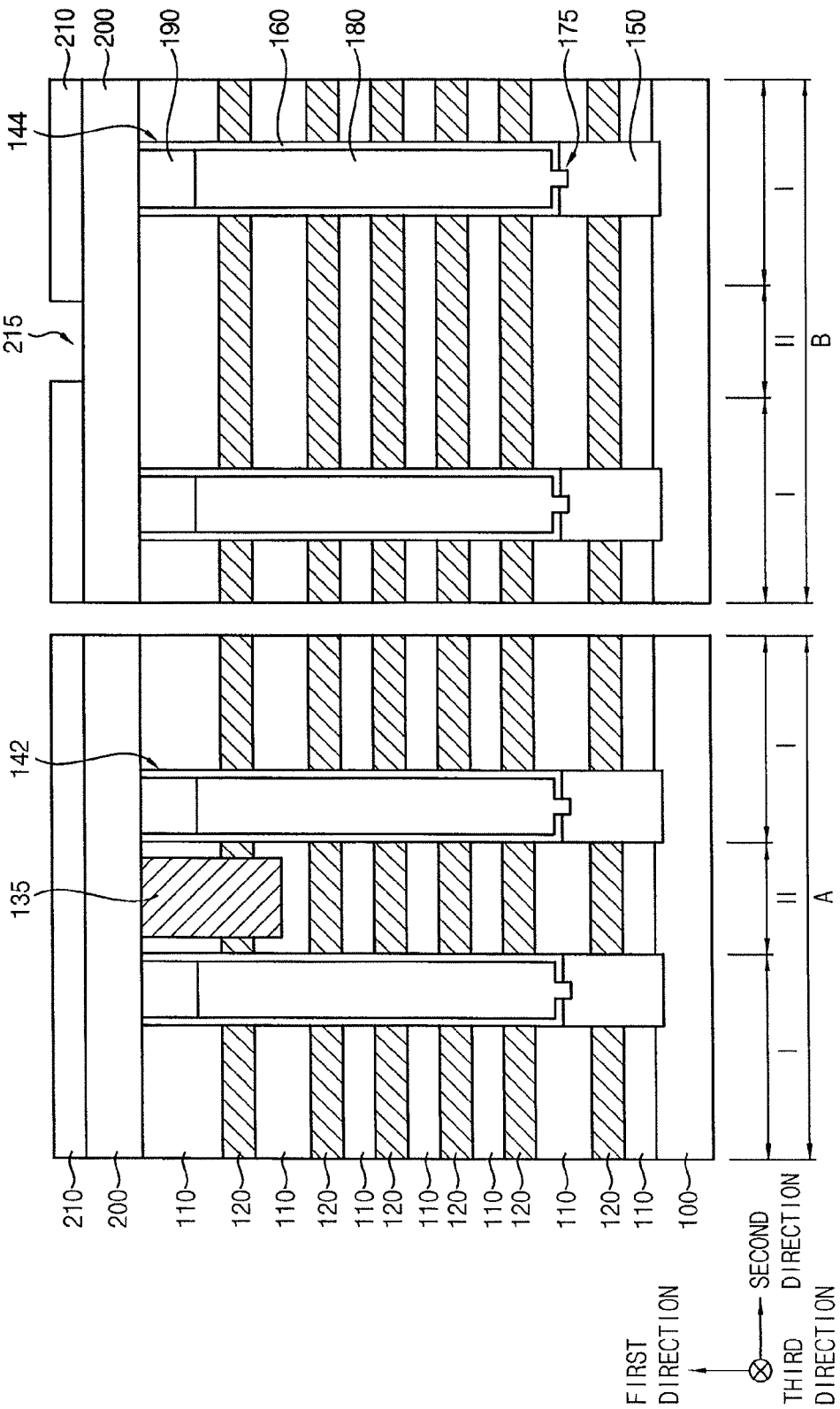

Referring to FIGS. 37 and 38, processes substantially the same as or similar to those illustrated with reference to FIGS. 11 to 21 may be performed.

A plurality of first insulation layers 110 and a plurality of first sacrificial layers 120 may be alternately and repeatedly formed on a substrate 100, the first insulation layers 110 and the first sacrificial layers 120 may be partially removed to form a first recess, and then a supporter 135 may be formed to fill the first recess. A plurality of holes may be formed through the first insulation layers 110 and the first sacrificial layers 120, and then a semiconductor pattern 150, a charge storage structure 160, a channel 180 and a pad 190 may be formed to fill the hole. Further, a third insulation layer 200 may be formed on the uppermost first insulation layer 110, the pads 190 and the supporter 135, and a photoresist pattern 210 may be formed on the third insulation layer 200.

However, the first sacrificial layers 120 may be formed using poly silicon, and the first insulation layer may be formed using a silicon oxide.

Figure 39:
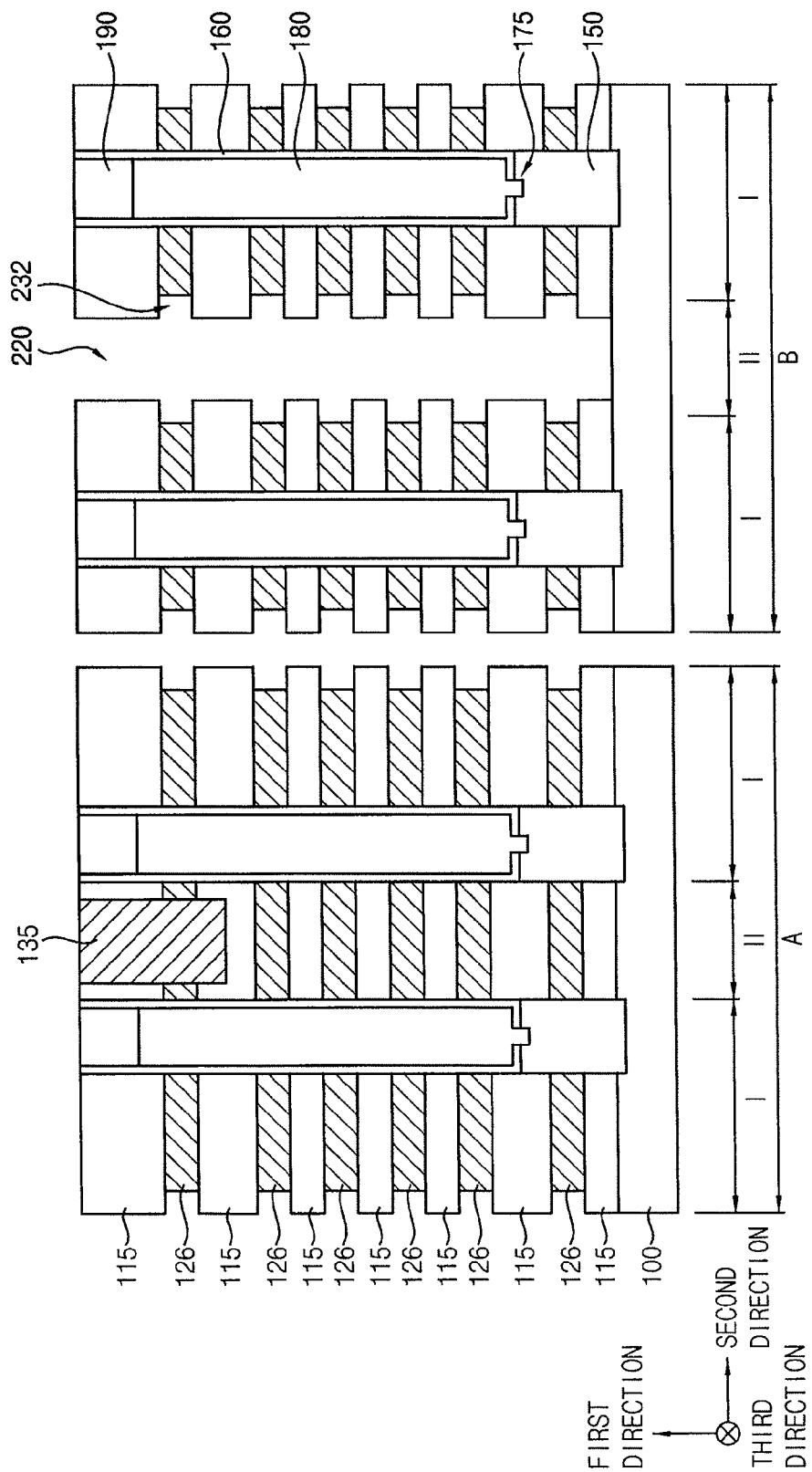

Referring to FIG. 39, the first insulation layers 110 and the first sacrificial layers 120 may be partially removed to form a second opening 220 exposing the top surface of the substrate 100, and then a first sacrificial layer pattern 126 may be removed to form a gap 232.

Processes for forming the second opening 220 may be substantially the same as or similar to those illustrated with reference to FIGS. 22 and 23. As the second opening 220 is formed, the first insulation layers 110 and the first sacrificial layers 120 may transfer into the first insulation layer patterns 115 and the first sacrificial layer patterns 126, respectively.

Then, the first sacrificial layer patterns 126 exposed by the second opening 220 may be partially removed by a wet etching process, and the gap 232 may be formed. In example embodiments, a process time of the etching process may be adjusted, and portions of the first sacrificial layer patterns 126 may be removed.

In example embodiments, the supporter 135 may hold the first insulation layer patterns 115 and the first sacrificial layer patterns 126. The supporter 135 may prevent the first insulation layer pattern 115 and the channel 180 from leaning.

Figure 40:
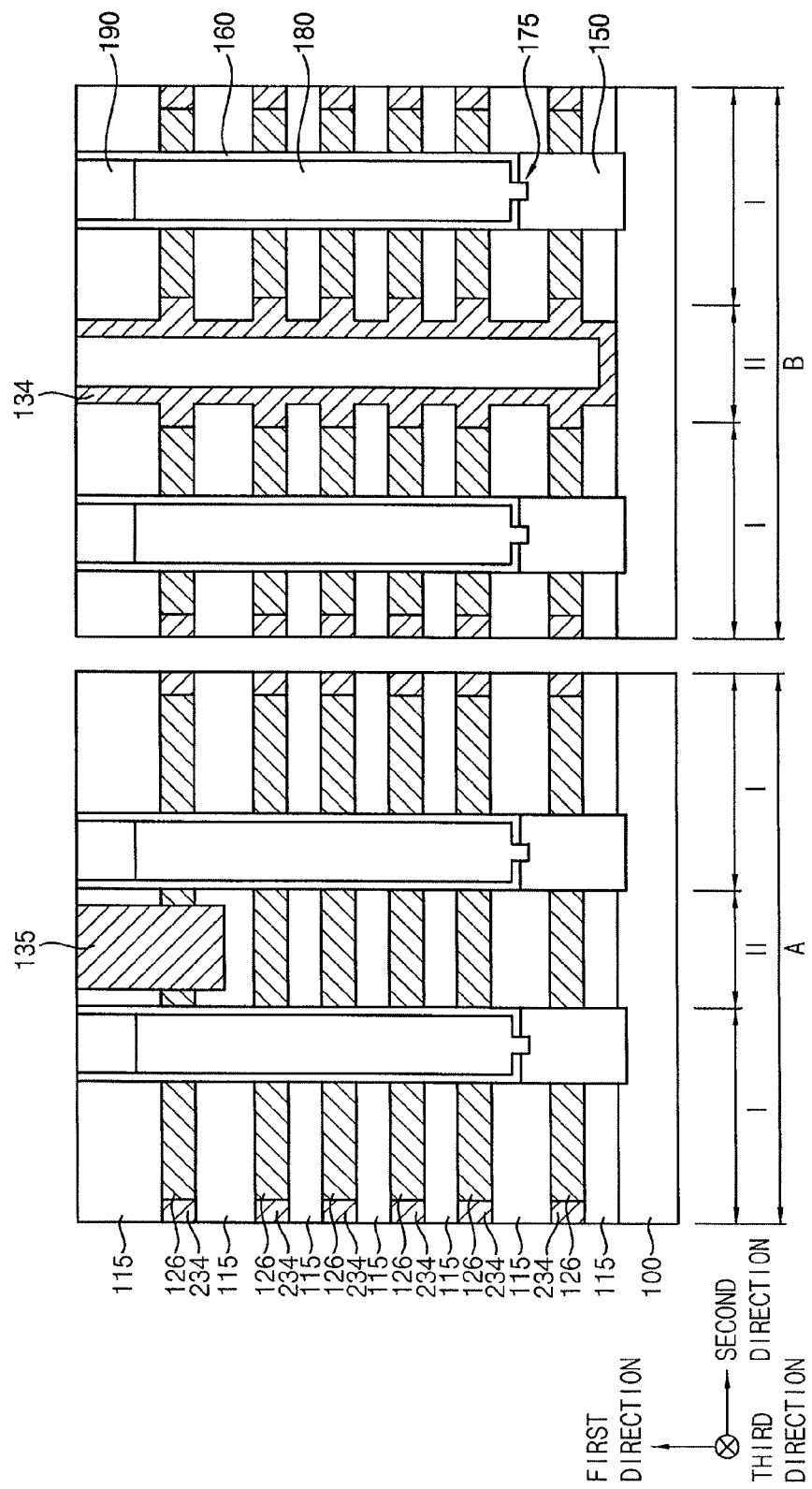

Referring to FIG. 40, a preliminary gate electrode layer 234 may be formed to fill the gap 232 and a portion of the second opening 220.

In example embodiments, the preliminary gate electrode layer 234 may be formed using a metal. For example, the preliminary gate electrode layer 234 may include a metal with low electrical resistance (e.g., tungsten, titanium, tantalum and/or platinum). In an example embodiment, the preliminary gate electrode layer 234 may be formed by a CVD process or a sequential flow deposition (SFD) process using tungsten.

Figure 41:
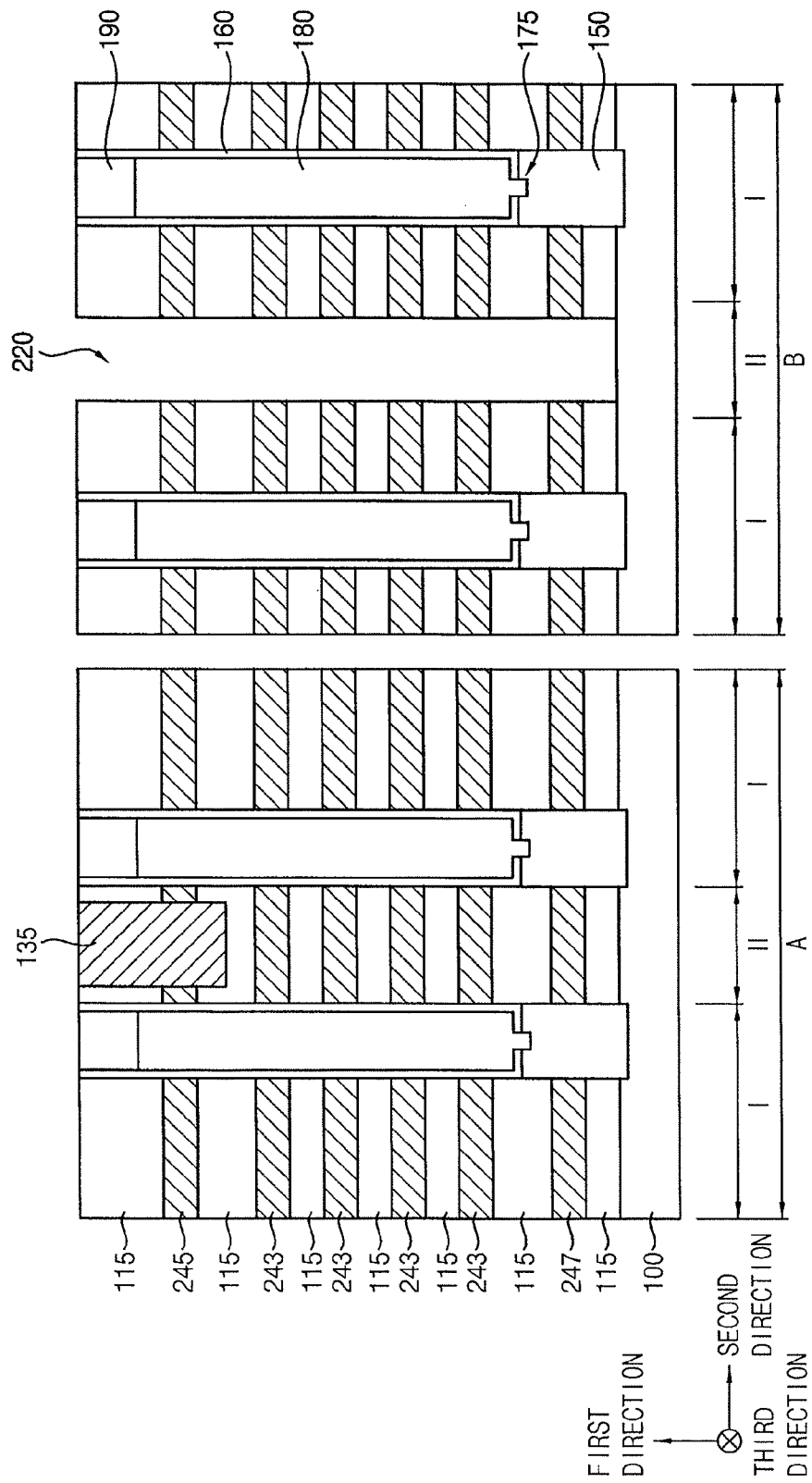

Referring to FIGS. 40 and 41, a heat treatment process may be performed to form a gate electrode layer, and then the gate electrode layer may be partially removed to form gate electrodes 243, 245, and 247.

The gate electrode layer may be formed by performing the heat treatment process about the first sacrificial layer patterns 126 and the preliminary gate electrode layer 234. During the heat treatment process, the metal atoms in the preliminary gate electrode layer 234 may be diffused into the first sacrificial layer patterns 126, and the gate electrode layer including a metal silicide may be formed. For example, when the preliminary gate electrode layer 234 includes nickel, the gate electrode layer may include nickel silicide.

Then, the gate electrode layer may be partially removed to form the gate electrodes 243, 245, and 247 disposed between the first insulation layer patterns 115 at each level.

According to example embodiments, the first sacrificial layer patterns 126 may not be removed during the processes for forming the gate electrodes 243, 245, and 247, and the supporter 135 and the first sacrificial layer patterns 126 may prevent the first insulation layer pattern 115 from leaning.

Then, processes substantially the same as similar to those described with reference to FIGS. 27 to 31 may be performed to form the vertical memory device. The supporter 135 and the first sacrificial layer patterns 126 may prevent the first insulation layer pattern 115 from leaning, and reliability of the vertical memory device may be improved.

FIGS. 42 to 50 are horizontal cross-sectional views and vertical cross-sectional views illustrating a method of manufacturing a vertical memory device in accordance with example embodiments.

FIGS. 42, 44, 46 and 49 are horizontal cross-sectional views illustrating the method of manufacturing the vertical memory device, and FIGS. 43, 45, 47, 48 and 50 include a vertical cross-sectional view (A) cut along the line IV-IV' of the horizontal cross-sectional view and a vertical cross-sectional view (B) cut along the line V-V' of the horizontal cross-sectional view. The method of manufacturing the vertical memory device may be substantially the same as or similar to that of FIGS. 11 to 31, and repetitive explanations thereon may be omitted herein.

Figure 43:
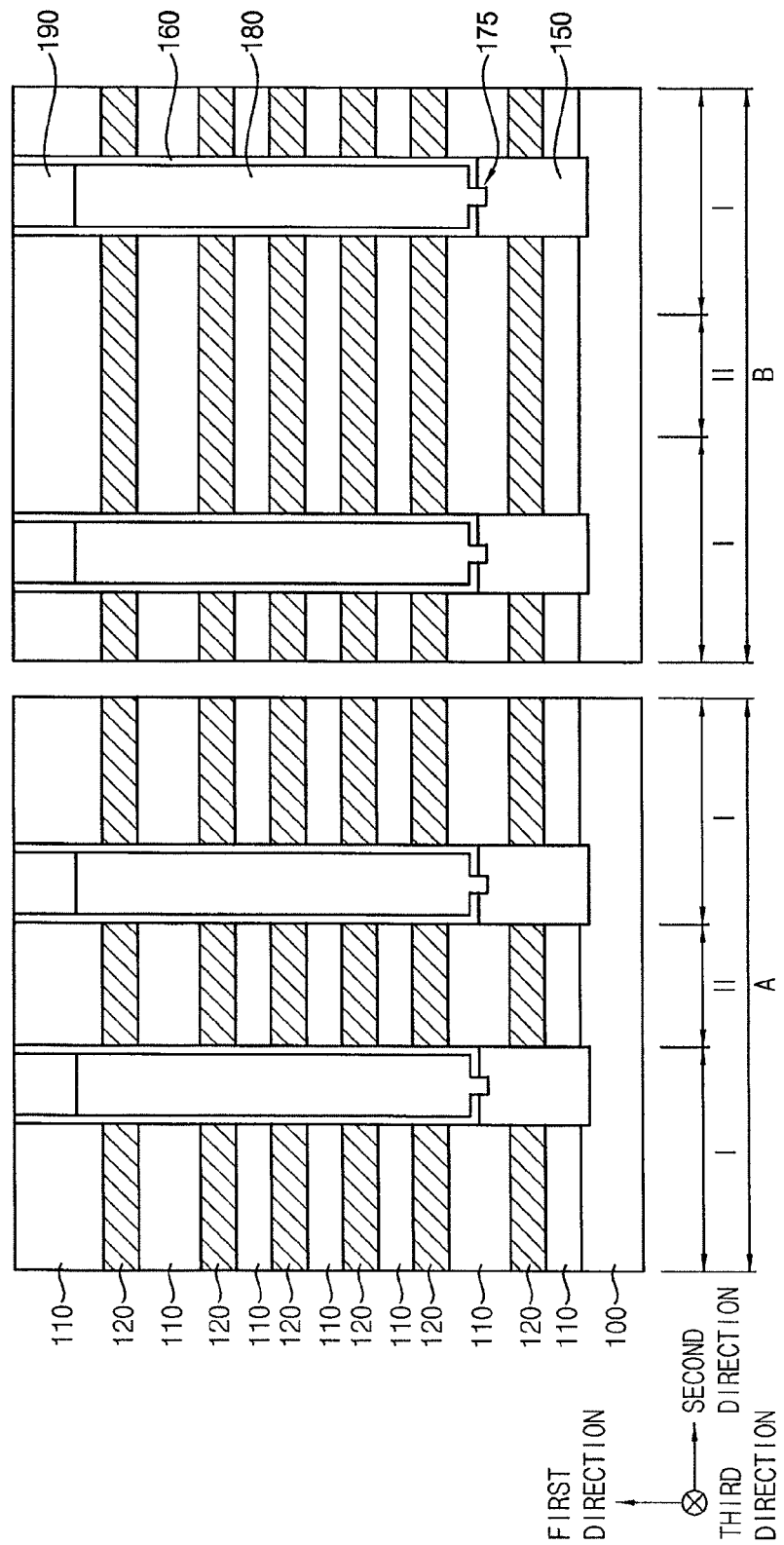
Figure 45:
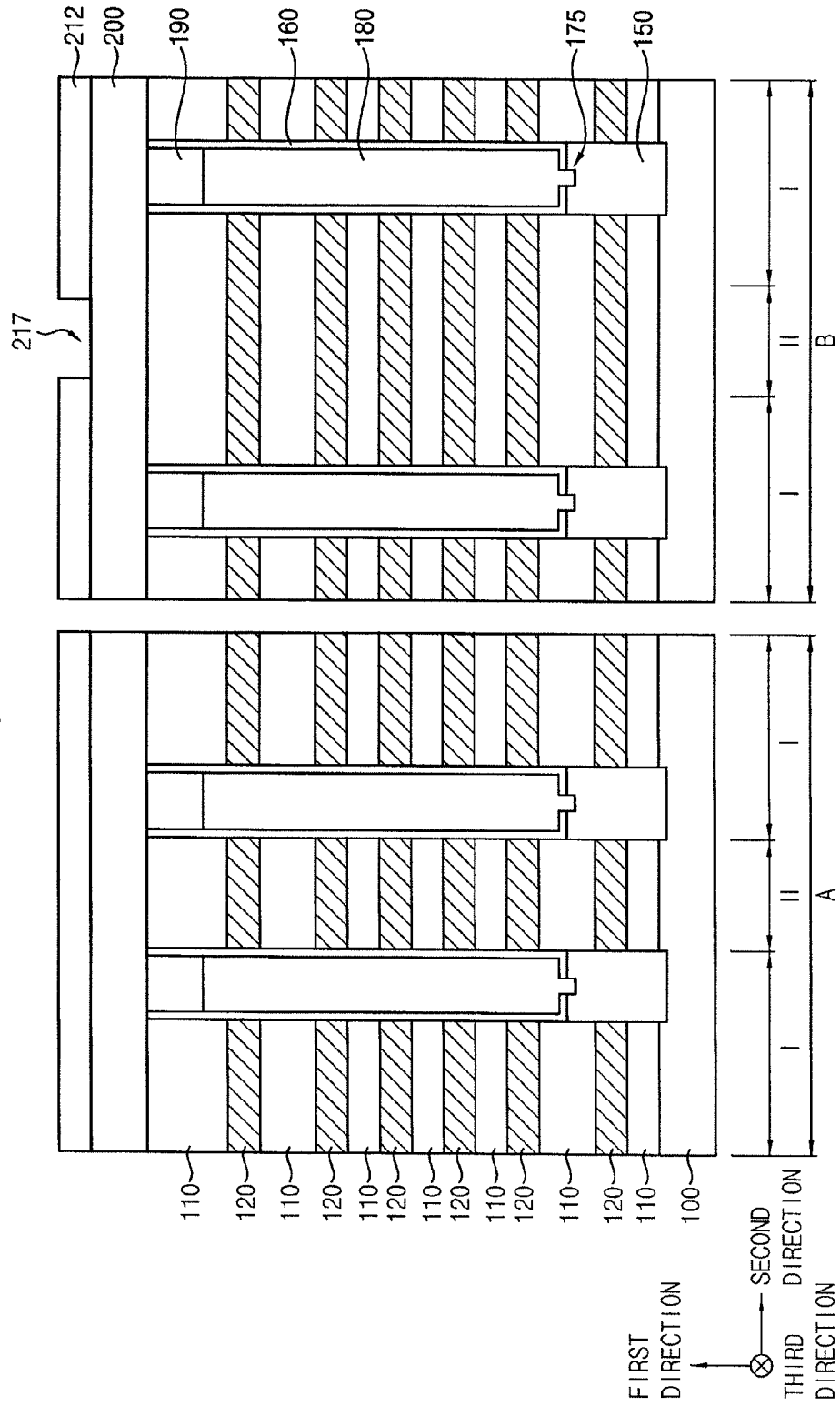

Referring to FIGS. 42 and 43, a plurality of first insulation layers 110 and a plurality of first sacrificial layers 120 may be alternately and repeatedly formed on a substrate 100. A plurality of holes may be formed through the first insulation layers 110 and the first sacrificial layers 120, and then a semiconductor pattern 150, a charge storage structure 160, a channel 180 and a pad 190 may be formed to fill the hole Referring to FIGS. 44 and 45, a third insulation layer 200 may be formed on the uppermost first insulation layer 110 and the pads 190, and a photoresist pattern 212 may be formed on the third insulation layer 200.

The third insulation layer 200 may be formed by a CVD process, a PECVD process, an ALD process, etc. using a silicon oxide. In example embodiments, the third insulation layer 200 may be thicker than the first insulation layer 110.

Then, a photoresist layer may be formed on the third insulation layer 200, and the photoresist layer may be partially remove to form the photoresist pattern 212 having an opening 217. In example embodiments, the photoresist pattern 212 may sufficiently cover a first region I of the substrate 100, and may partially cover a second region II. The opening 217 of the photoresist pattern 212 may partially expose the second region II.

Figure 47:
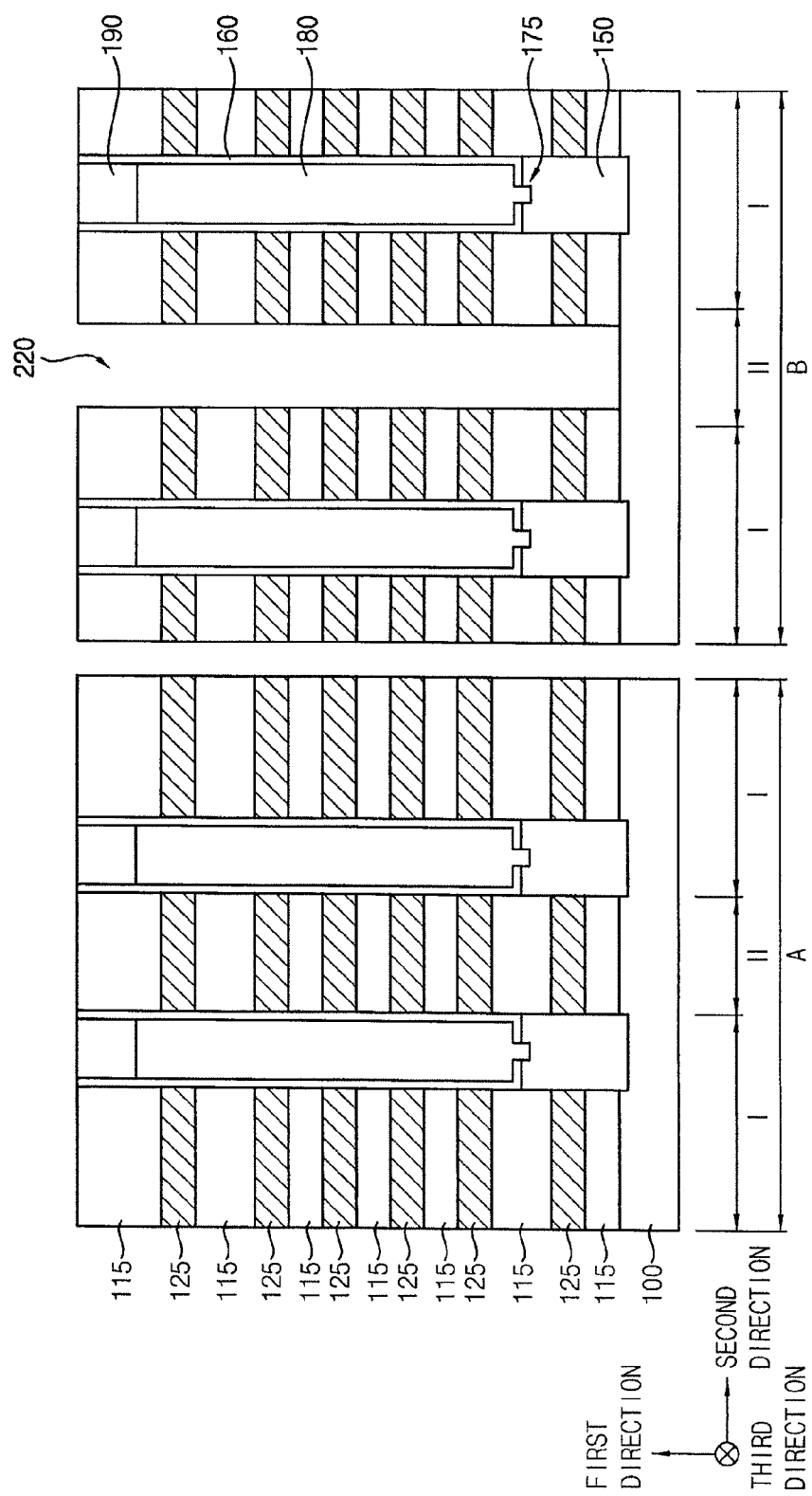

Referring to FIGS. 46 and 47, a second opening 220 may be formed through the first insulation layers 110 and the first sacrificial layers 120, and a top surface of the substrate 100 may be exposed.

For example, the third insulation layer 200 may be partially removed by an etching process using the photoresist pattern 212 as an etching mask, and a third insulation layer pattern may be formed. Then, the first insulation layers 110 and the first sacrificial layers 120 may be partially removed by an etching process using the third insulation layer pattern as an etching mask, and the second opening 220 may be formed.

In example embodiments, a plurality of second openings 220 may be arranged in the third direction. The plurality of second openings 220 may be spaced apart from each other. Portions of the uppermost first insulation layer 110 between the adjacent second openings 220 may be defined as a supporter 139.

Further, the second opening 220 may have a rectangular shape, when viewed in the first direction. For example, a width of the second opening 220 in the second direction may be substantially the same as a width of the second region II, and a length of the second opening 220 in the third direction may be substantially larger than a width of the second region II.

As the second opening 220 is formed, the first insulation layers 110 and the first sacrificial layers 120 may transfer into the first insulation layer patterns 115 and the first sacrificial layer patterns 125, respectively. The first insulation layer patterns 115 and the first sacrificial layer patterns 125 at each level may extend in the third direction, and may be disposed alternately and repeatedly in the first direction.

According to example embodiments, the supporter 139 may prevent the first insulation layer pattern 115 and the first sacrificial layer patterns 125 from leaning.

Figure 48:
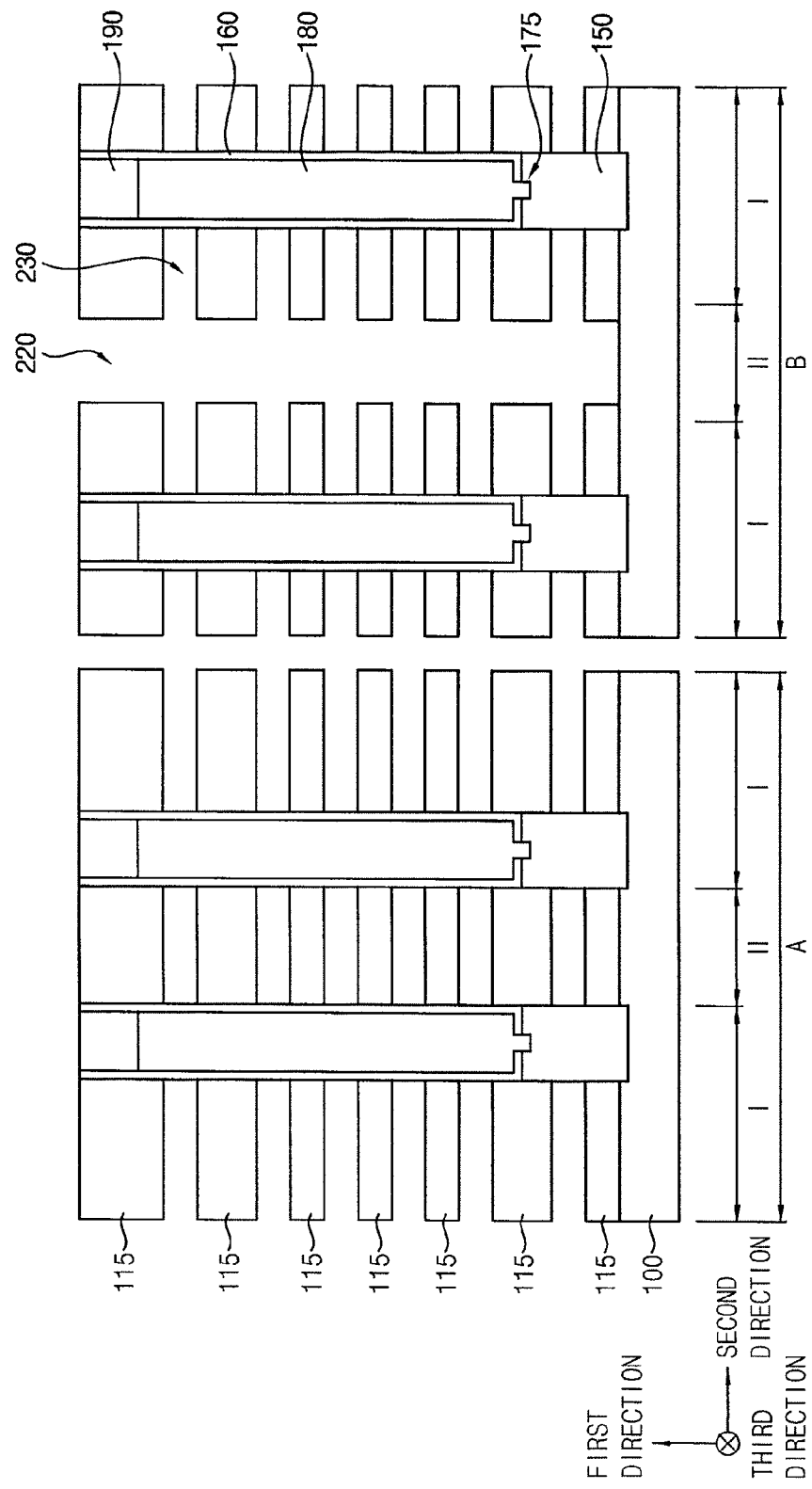

Referring to FIGS. 47 and 48, the first sacrificial layer patterns 125 exposed by the second opening 220 may be removed to form a gap 230 between the first insulation layers 115 in the first direction. Processes for forming the gap 230 may be substantially the same as those described with reference to FIG. 24.

Figure 50:
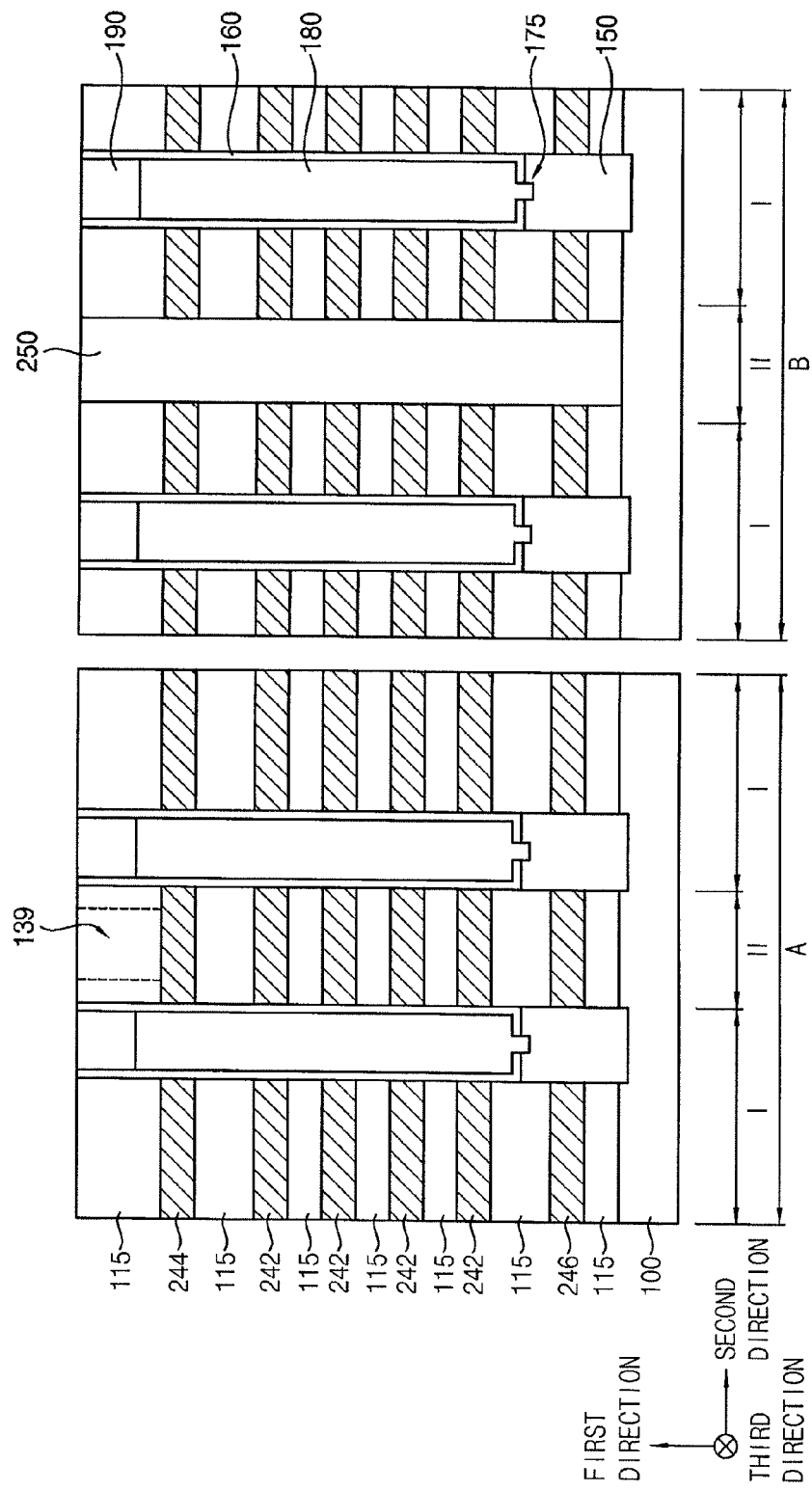

Referring to FIGS. 49 and 50, a gate electrode layer may be formed on an outer sidewall of the charge storage structure 160, an inner wall of the gap 230, a surface of the first insulation layer pattern 115, a top surface of the substrate 100, and a top surface of the pad 190, and then the gate electrode layer may be partially removed to form the second opening 220 again. Further, a first impurity region 105 may be formed at an upper portion of the substrate 100 exposed by the second opening 220, and a fourth insulation layer pattern 250 may be formed to fill the second opening 220. Above Processes may be substantially the same as those described with reference to FIGS. 25 to 28.

Then, processes substantially the same as similar to those described with reference to FIGS. 29 to 31 may be performed to form the vertical memory device. The supporter 139 may prevent the first insulation layer pattern 115 from leaning, and reliability of the vertical memory device may be improved.

By way of summation and review, in a method of manufacturing VNAND (Vertical NAND), an insulation layer ($SiO_2$) and a sacrificial layer ($SiN_x$) may be alternately and repeatedly formed on a substrate. Holes may be formed though the insulation layers and the sacrificial layers. Channels and charge storage structure may be formed to fill the holes. Openings (word line cut) may be formed through the insulation layers and the sacrificial layers. The sacrificial layers exposed by the openings may be removed to form gaps exposing the channels. During an etching process for forming the openings or removing the sacrificial layers, leaning of channels or the insulation layer may occur.

In example embodiments, a supporter may be formed in a region where the openings (word line cut) will be disposed. The supporter may directly contact a sidewall of the insulation layer, and the supporter may prevent the insulation layer and the channel from leaning.

Example embodiments provide a vertical memory device that may have improved reliability, and a method of manufacturing the vertical memory device that may have improved reliability. According to example embodiments, a vertical memory device may include a plurality of supporters that may be disposed in a second region II of a substrate 100, and may be arranged in a third direction. During an etching processes for forming, for example, an insulation layer pattern or gate electrodes, the supporters may prevent other insulation layer patterns and a channel from leaning, misalignment may be prevented, and reliability of the vertical memory device may be improved.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A vertical memory device, comprising:
a substrate including first regions on sides of a second region;
a plurality of channels in the first regions, respectively, the plurality of channels extending in a first direction substantially perpendicular to a top surface of the substrate;
a charge storage structure on a sidewall of each channel in a second direction substantially parallel to the top surface of the substrate;
a plurality of gate electrodes in the first regions, the plurality of gate electrodes arranged on a sidewall of the charge storage structure and spaced apart from each other in the first direction; and
a plurality of supporters in the second region, the plurality of supporters spaced apart from each other in a third direction substantially perpendicular to the first direction and the second direction, the plurality of supporters contacting a sidewall of at least one gate electrode in each of the first regions.

2. The vertical memory device as claimed in claim 1, wherein the first regions and the second region are arranged alternately in the second direction, each of the first regions and the second region extending in the third direction.

3. The vertical memory device as claimed in claim 2, wherein the supporter has a width in the second direction that is substantially identical to a width of the second region, and the supporter has a length in the third direction that is substantially identical to or larger than the width of the second region.

4. A vertical memory device comprising:
a substrate including first regions and a second region;
a plurality of channels in the first regions, the plurality of channels extending in a first direction substantially perpendicular to a top surface of the substrate;
a charge storage structure on a sidewall of each channel in a second direction substantially parallel to the top surface of the substrate;
a plurality of gate electrodes in the first regions, the plurality of gate electrodes arranged on a sidewall of the charge storage structure and spaced apart from each other in the first direction; and
a plurality of supporters in the second region, the plurality of supporters spaced apart from each other in a third direction substantially perpendicular to the first direction and the second direction, the plurality of supporters contacting a sidewall of at least one gate electrode,
wherein:
the gate electrodes include a ground selection line (GSL), a word line and a string selection line (SSL) that are sequentially arranged from the top surface of the substrate,
a bottom surface of the supporter is substantially lower than a bottom surface of the SSL, and
the bottom surface of the supporter is substantially higher than a top surface of the word line.

5. The vertical memory device as claimed in claim 1, wherein:
the gate electrodes include a ground selection line (GSL), a word line and a string selection line (SSL) that are sequentially arranged from the top surface of the substrate, and
a bottom surface of the supporter directly contacts a top surface of the SSL.

6. The vertical memory device as claimed in claim 1, wherein the supporter includes silicon oxide or polysilicon.

7. The vertical memory device as claimed in claim 1, wherein:
the supporter includes a second supporter and a first supporter surrounding a bottom surface and a sidewall of the second supporter,
the first supporter includes silicon oxide, and
the second supporter includes polysilicon.

8. The vertical memory device as claimed in claim 1, further comprising:
insulation layer patterns between the gate electrodes in the first direction,
wherein the supporter directly contacts sidewalls of the insulation layer patterns, and the supporter holds the insulation layer patterns.

9. The vertical memory device as claimed in claim 1, further comprising:
an impurity region at an upper portion of the substrate in the second region, the impurity region extending in the third direction.

10. The vertical memory device as claimed in claim 9, further comprising:
a contact in the second region, the contact extending in the first direction, and directly contacting a top surface of the impurity region.

11. A vertical memory device comprising:
a substrate including first regions and a second region;
a plurality of channels in the first regions, the plurality of channels extending in a first direction substantially perpendicular to a top surface of the substrate;
a charge storage structure on a sidewall of each channel in a second direction substantially parallel to the top surface of the substrate;
a plurality of gate electrodes in the first regions, the plurality of gate electrodes arranged on a sidewall of the charge storage structure and spaced apart from each other in the first direction;
a plurality of supporters in the second region, the plurality of supporters spaced apart from each other in a third direction substantially perpendicular to the first direction and the second direction, the plurality of supporters contacting a sidewall of at least one gate electrode;
an impurity region at an upper portion of the substrate in the second region, the impurity region extending in the third direction; and
a contact in the second region, the contact extending in the first direction, and directly contacting a top surface of the impurity region,
wherein the contact penetrates the supporter.

12. A method of manufacturing a vertical memory device, the method comprising:
forming a plurality of sacrificial layers and a plurality of insulation layers on a substrate alternately and repeatedly, the substrate having first regions on sides of a second region;
forming a supporter in the second region, the supporter penetrating at least one sacrificial layer and at least one insulation layer;
forming holes through the sacrificial layers and the insulation layers to expose a top surface of the substrate in the first regions;
forming a charge storage structure and a channel filling each hole;
partially removing the sacrificial layers and the insulation layers to form an opening, the opening exposing a top surface of the substrate in the second region;
forming a plurality of gaps by removing the sacrificial layers to expose a sidewall of each charge storage structure; and
forming a gate electrode to fill each gap, the supporter contacting a sidewall of the gate electrode in each of the first regions.

13. The method as claimed in claim 12, wherein the supporter prevents the insulation layers from leaning during the steps of forming the opening and forming the gaps.

14. The method as claimed in claim 12, wherein:
forming the gate electrode includes:
forming a preliminary gate electrode layer on an inner wall of the opening, the preliminary gate electrode layer including a metal;
performing a heat treatment process such that the preliminary gate electrode layer and a remaining portion of the sacrificial layers are transformed into a gate electrode layer; and partially removing the gate electrode layer, and forming the plurality of gaps includes partially removing the sacrificial layers, the sacrificial layers including polysilicon.

15. The method as claimed in claim 12, wherein the supporter includes a silicon oxide or polysilicon.

16. A vertical memory device, comprising:
a substrate including first regions situated on each side of a second region;
at least one channel in the first regions, respectively the at least one channel extending in a first direction substantially perpendicular to a top surface of the substrate;
a charge storage structure on a sidewall of each channel in a second direction substantially parallel to the top surface of the substrate;
a plurality of gate electrodes in the first regions, the plurality of gate electrodes arranged on a sidewall of the charge storage structure and spaced apart from each other in the first direction; and
at least one supporter in the second region, the at least one supporter contacting a sidewall of at least one gate electrode in each of the first regions.

17. The vertical memory device as claimed in claim 16, comprising a plurality of channels in the first regions.

18. The vertical memory device as claimed in claim 17, wherein each channel has a pillar shape.

19. The vertical memory device as claimed in claim 17, wherein each channel has a cup shape of which a central bottom is opened.

20. The vertical memory device as claimed in claim 16, wherein the at least one supporter has a square shape or a rectangular shape, when viewed in the first direction.

* * * * *